United States Patent
Ohtsuki et al.

(10) Patent No.: US 6,415,531 B1
(45) Date of Patent: Jul. 9, 2002

(54) PLANE-SHAPED LIGHTING DEVICE AND A DISPLAY USING SUCH A DEVICE

(75) Inventors: Terukazu Ohtsuki, Nara; Masahiko Kimoto, Ikoma; Hiroshi Minematsu, Osaka; Nobuyuki Tominaga, Kawachinagano; Takahiro Funakoshi, Fujiidera; Yasuhiro Wada, Takatsuki; Hitoshi Azuma, Tondabayashi, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/510,195

(22) Filed: Feb. 22, 2000

Related U.S. Application Data

(62) Division of application No. 09/070,729, filed on May 1, 1998, now Pat. No. 6,036,328, which is a division of application No. 08/652,304, filed on May 23, 1996, now Pat. No. 5,986,665.

(30) Foreign Application Priority Data

May 23, 1995 (JP) .............................................. 7-123878

(51) Int. Cl.[7] ............................... F21V 8/00; F21V 7/04
(52) U.S. Cl. ............................ 36/31; 362/26; 362/800; 362/328; 362/330; 362/235
(58) Field of Search ................................ 362/31, 26, 812, 362/249, 252, 235, 330, 339, 800, 327, 328, 329

(56) References Cited

U.S. PATENT DOCUMENTS

| | | | |
|---|---|---|---|
| 3,760,237 A | | 9/1973 | Jaffe |
| 4,473,866 A | | 9/1984 | Davis |
| 4,774,434 A | | 9/1988 | Bennion |
| 4,811,507 A | * | 3/1989 | Blanchet ..................... 362/31 |
| 5,057,974 A | * | 10/1991 | Mizobe ...................... 362/31 |
| 5,077,587 A | | 12/1991 | Albergo |
| 5,093,768 A | | 3/1992 | Ohe |
| 5,101,325 A | * | 3/1992 | Davenport et al. .......... 362/31 |
| 5,136,483 A | | 8/1992 | Schoniger |
| 5,339,179 A | * | 8/1994 | Rudisill et al. .............. 362/31 |
| 5,408,388 A | | 4/1995 | Kobayashi |
| 5,528,709 A | | 6/1996 | Koike |
| 5,641,219 A | | 6/1997 | Mizobe |

FOREIGN PATENT DOCUMENTS

| | | |
|---|---|---|
| JP | 60152185 | 10/1985 |
| JP | 61183802 | 8/1986 |
| JP | 62135183 | 8/1987 |
| JP | 62161203 | 10/1987 |
| JP | 63138377 | 6/1988 |
| JP | 63175830 | 7/1988 |
| JP | 236888 | 3/1990 |
| JP | 3190004 | 8/1991 |
| JP | 3201304 | 9/1991 |
| JP | 3265889 | 11/1991 |

(List continued on next page.)

Primary Examiner—Thomas M. Sember

(57) ABSTRACT

A plane-shaped lighting device has a light-directing plate and a light source that is placed in contact with or in the proximity of the light-incident surface of the light-directing plate, and the light source is constituted of a plurality of LED lamps each of which has an LED chip for emitting light and a semispherical lens for directing the light from the LED chip into the light-directing plate. Here, the distance from the LED chip to the top of the semispherical lens is set to be 1.8 times as long as the radius of curvature of the semispherical lens. This arrangement allows the light emitted from the LED chip to be efficiently incident on the light-incident surface of the light-directing plate, thereby improving the light-incidence efficiency to the light-directing plate. Further, the application of this plane-shaped lighting device to display devices makes it possible to improve the efficiency of light utilization, and consequently to provide thinner display devices with high visibility.

9 Claims, 44 Drawing Sheets

FOREIGN PATENT DOCUMENTS

| | | |
|---|---|---|
| JP | 3280079 | 12/1991 |
| JP | 485588 A | 3/1992 |
| JP | 4191704 | 7/1992 |
| JP | 4328206 | 11/1992 |
| JP | 5142424 | 6/1993 |
| JP | 5173132 | 7/1993 |
| JP | 5203950 | 8/1993 |
| JP | 593318 | 12/1993 |
| JP | 651129 | 2/1994 |
| JP | 621001 | 3/1994 |
| JP | 625802 | 4/1994 |
| JP | 694923 | 4/1994 |
| JP | 636001 | 5/1994 |
| JP | 636002 | 5/1994 |
| JP | 6130381 | 5/1994 |
| JP | 6152867 A | 5/1994 |
| JP | 6281929 | 10/1994 |
| JP | 6289233 | 10/1994 |
| JP | 08315621 | 11/1996 |
| WO | WO9506889 | 3/1995 |

* cited by examiner a = 2.4mm
b = 3.6mm
c = 1.1mm

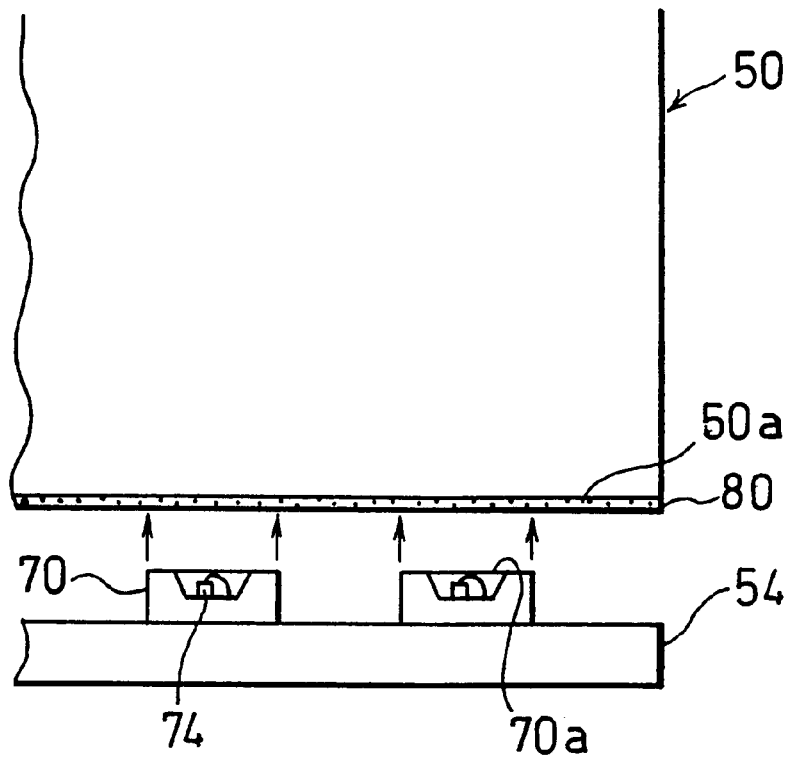
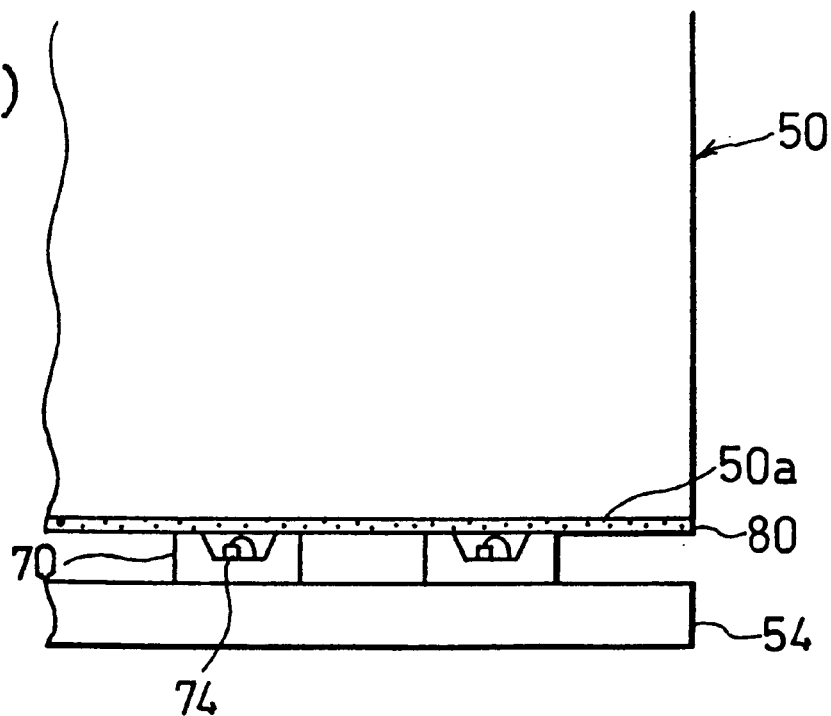

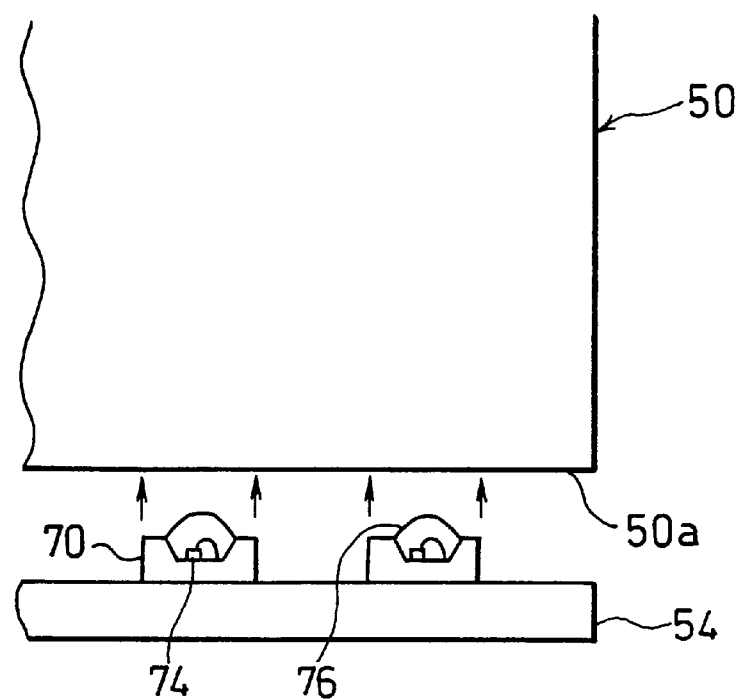
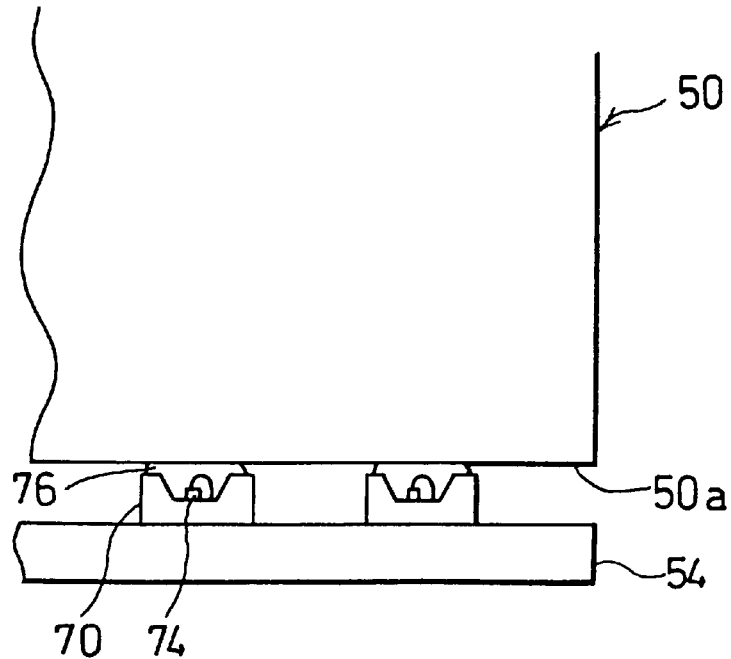

FIG.40(a) FIG.40(b) FIG.40(c)
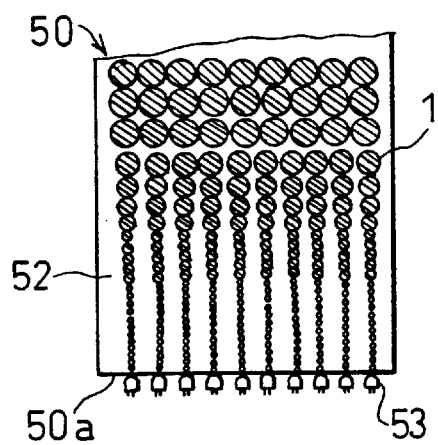
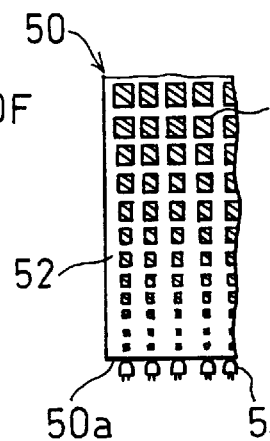
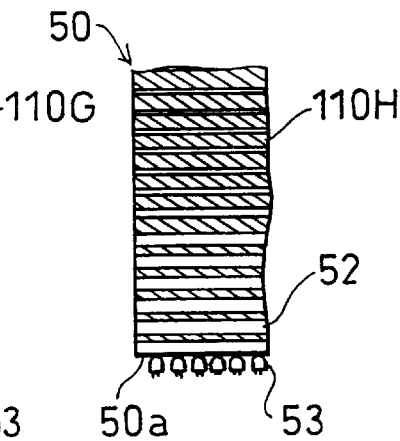
FIG.41
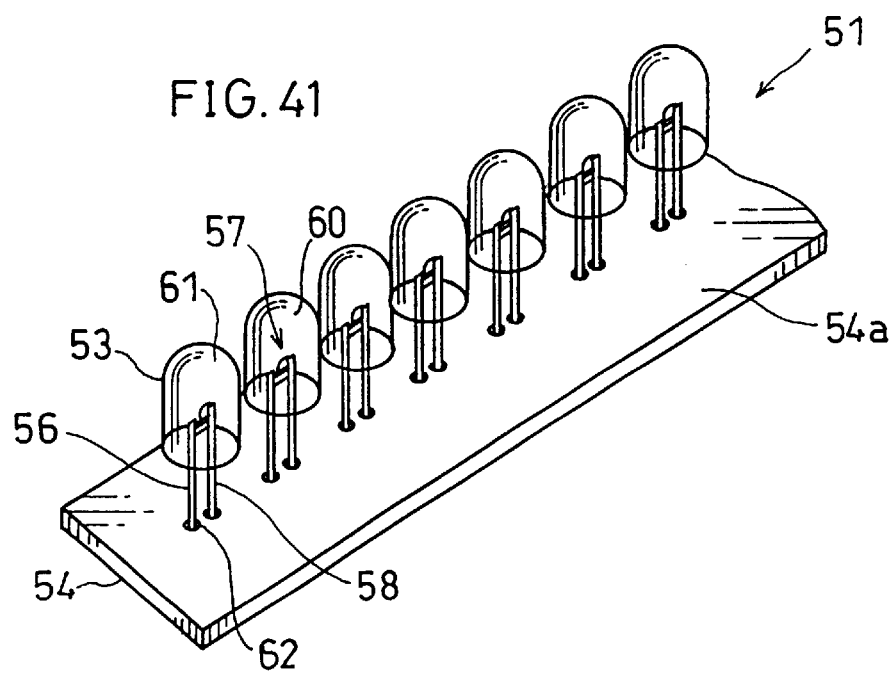

PLANE-SHAPED LIGHTING DEVICE AND A DISPLAY USING SUCH A DEVICE

This application is a divisional of application Ser. No. 09/070,729, filed on May 1, 1998, now U.S. Pat. No. 6,036,328 which is a divisional of application Ser. No. 08/652,304, filed on May 23, 1996 (now U.S. Pat. No. 5,786,665, issued on Jul. 28, 1998), the entire contents of which are hereby incorporated-by reference.

FIELD OF THE INVENTION

The present invention relates to a plane-shaped lighting device of the edge-light system and a display device using such a device. The plane-shaped lighting device is used as a backlight for, for example, liquid crystal displays and other displays, such as advertising boards, guiding boards and traffic signs that are placed inside or outside buildings.

BACKGROUND OF THE INVENTION

Conventionally, displays of the back-lighting type have been widely used as advertising signs and road-traffic signs in order to make them discernible at night or in order to improve visibility of the contents of the displays such as characters and diagrams. In these displays, patterned display boards, having the contents of displays, are made with a light-transmitting or semi-light-transmitting property, and the information of the displays is visually displayed by illuminating the patterned display boards from behind. Plane-shaped lighting devices, which are used as back lights for such displays, are mainly classified into two systems, the edge-light system and the direct underlight system.

For example, as illustrated in FIG. 50, a plane-type lighting device of the edge-light system, which is placed on the back of a patterned display board in parallel therewith, has a light-directing plate 1 made of a plate-shape light-transmitting member and a light source 2 that is placed at a light-incident surface 1a that forms one side end of the light-directing plate 1. Light, released from the light source 2, is made to be incident on the light-incident surface 1a of the light-directing plate 1. Then, the light, which has proceeded inside the light-directing plate 1 after repeating total reflections, is taken out ahead of a plane section 3 by a light-takeoff body 4 that is provided on the rear surface 3b or the front surface 3a of the plane section 3, and made to be incident on the patterned display board. In contrast, in a plane-type lighting device of the direct-under system, a rod-shaped light source such as a fluorescent lamp is placed on the back of a patterned display board so as to directly illuminate the patterned display board. Here, since the direct-under system needs to have more thickness than the edge-light system, the edge-light system has been widely used for plate-shaped lighting devices that require thin structures.

The following description will discuss the plane-shaped lighting device of the edge-light system. The light-directing plate 1 is made of, for example, a light-transmitting material such as acryl, and the light source 2 is constituted of, for example, rod-shaped or array-shaped light sources such as fluorescent lamps or LED lamps. Further, as illustrated in FIGS. 51(a) and 51(b), light-takeoff bodies 4 are formed on the front surface 3a or the rear surface 3b of the plane section 3 of the light-directing plate 1 so as to form, for example, a dot-patterned or circle-patterned scattering surface. The density of the light-takeoff bodies 4 increases as they are located apart from the light source 2. The light-takeoff bodies are provided as scattering print surfaces 4A that have been formed by using white-based ink or other materials by a screen printing method or other methods, as shown in FIG. 51(a), or provided as rough surfaces 4B that have been formed by roughening the surface of the light-directing plate 1 by using the blast treatment or other treatments, as shown in FIG. 51(b). Thus, light that has been made to be incident on these bodies is allowed to scatter in all directions, and is taken out from the light-directing plate 1.

Moreover, a reflection plate 5 is placed on the rear surface 3b of the plane section 3 so as to keep the scattered light from going out in the rear-surface 3b direction. Furthermore, for example, reflection layers, (not shown), made of materials such as reflective tapes and white ink, are disposed on the side faces 1b, 1c and 1d other than the light-incident surface 1a of the light-directing plate 1 so that the light that has proceeded inside the light-directing plate 1 without having been taken out from the plane section 3 of the light-directing plate 1 is again returned into the light-directing plate 1.

FIG. 52 shows another prior art example of a plate-shaped lighting device. The structure of this plate-shaped lighting device, which is similar to that illustrated in FIG. 51, is provided with light-takeoff bodies 4, each of which has either a solid-line shape or a broken-line shape and is formed on the rear surface 3b of the plane section 3 of the light-directing plate 1, as shown in FIG. 53. The light-takeoff bodies 4, which form a plurality of line-shaped grooves 4C parallel to the light-incident surface 1a, have their density increased as they are located apart from the light source 2. The grooves 4C are formed into a V-letter shape by machining the rear surface 3b of the light-directing plate 1 by the use of, for example, a dicing method or an etching method. Here, the light that has been made to be incident on each groove 4C is reflected toward the plane section 3, and taken out from the plane section 3 through a scattering sheet 6.

In the plane-shaped lighting devices of the edge-light system using the light-directing plate 1, LED lamps 7 have been used as the light source particularly in order to provide low power consumption and maintenance-free operation. As illustrated in FIG. 54, a plurality of LED lamps 7, which forms a light source 2, are arranged in an array on a substrate 8 in a manner opposing the light-incident surface 1a of the light-directing plate 1. As illustrated in FIGS. 55(a) and 55(b), in each LED lamp 7, a lead frame 11 with a reflection cup 10 inside of which an LED chip 12 is installed, and the LED chip 12 is molded with a light-transmitting resin 13. Further, a semispherical lens 15 is formed at one portion of a box-like body 14, and the LED lamps are classified into two types, that is, the scattering type and the transparent type, depending on the types of molding resins that constitute the box-like body 14.

In the LED lamp 7 of the scattering type, shown in FIG. 55(a), since it is molded with light-transmitting resin 13 to which filler is added, light emitted from the LED chip 12 is scattered by the filler inside the resin 13, and transmitted in all directions. In contrast, the LED lamp 7 of the transparent type, shown in FIG. 55(b), is formed by using transparent resin as the molding resin 13 and is normally designed as a high-luminance lamp. Further, in order to converge light in the light-axis direction, the distance Z from the LED chip 12 to the top of the semispherical lens 15 is set to be 1.8 to 2.1 times as long as the radius of curvature of the semispherical lens 15.

The use of the plate-shaped lighting devices of the edge-light system has made display devices thinner. In such display devices of the back-lighting type, a patterned display board, which displays information such as diagrams and characters, has a construction wherein its pattern is displayed by changing transmitting colors and transmittances through character portions and their surrounding portions. Further, in some specific cases of such a construction, the transmittance of either the character portions or the surrounding portions is set to zero, and the character portions or their peripheral portions are subjected to a cut-out process so that predetermined light-transmitting color filters can be provided at the portions that transmit light.

Japanese Laid-Open Patent Publication No. 85588/1992 (Tokukaihei 4-85588) has disclosed one of such displays wherein the character portions are subjected to the cut-out process and color filters are provided at the cut-out portions. As illustrated in FIG. 56, LEDs 21, which serve as a light source, are arranged in series with one another on a side-end face 20c of a light-directing plate 20. Further, a reflection plate 22 is placed on the rear surface of the light-directing plate 20; a light-scattering sheet 23 is affixed onto the front surface of the light-directing plate 20; and a patterned display board 24 is further placed in front thereof. The patterned display board 24 has a structure wherein a light-shielding plate 26 having a pattern 26a formed in a cut-out fashion is superimposed on a color filter 25 that transmits the same color as that of the light-emission from the LED 21. In most cases, in the patterned display board 24, those character portions are formed by using methods, such as screen printing, lamination of cut-out patterns made by etching, and spray coating by masking.

In this arrangement, light emitted from the LED 21 is taken out ahead of the light-directing plate 20 through the inside of the light-directing plate 20. The light, which has been released ahead of the light-directing plate 20, illuminates the patterned display board 24 that is placed in front thereof from behind through the light-scattering sheet 23 that is placed in front of the light-directing plate 20 and is projected ahead of the display device through the color filter 25 and the pattern 26a of the light-shielding plate 26.

In the following description, consideration will be given on the incidence of light in the above-mentioned plate-shaped lighting device. When LED lamps 7 of the light-scattering type are used, the rate at which light rays emitted from the LED lamps 7 are directed directly to the light-incident surface 1a of the light-directing plate 1 is extremely low, consequently resulting in a poor incidence efficiency. Further, in the case of LED lamps 7 of the transparent type, light rays emitted from the LED chips 12 have most of the rays released laterally from the side faces of the box-like body 14 without being converged by the semispherical lens 15 when they have angles not less than $\theta=35°$ with respect to the light axis, or released laterally after having been total-reflected by the side faces of the box-like body 14, thereby failing to provide a good incidence efficiency for the light rays that are directed directly to the light-incident surface 1a of the light-directing plate 1. The following methods have been proposed as solutions for improving the incidence efficiency.

① As illustrated in FIG. 57, a housing 30, which covers the periphery of the LED lamp 7, is installed and a reflection layer 31 is formed on the surface thereof. Thus, light rays laterally released from the LED lamp 7 are reflected and directed to the light-directing plate 1. Normally, even those materials such as plastic, which have comparatively high reflectivities, only have approximately 70% reflectivity, and light attenuates to a great degree after merely having been subjected to several reflections. Therefore, this method fails to provide practical effects. Here, the reflectivity of not less than 90% is available by applying a reflection-increasing coat onto the surface of the housing 30. However, since the reflection-increasing coat is formed by the vacuum vapor deposition method, high costs become a problem.

② As illustrated in FIG. 58, a hole 32 or a groove is formed in the light-incident surface 1a of the light-directing plate 1, and the LED lamp 7 is inserted into the hole 32. In this case, light rays laterally released from the side faces of the LED lamp 7 are also allowed to be temporarily incident on the light-directing plate 1. However, since the progressing directions of the light rays have not been changed, the light rays are not transmitted inside the light-directing plate 1 through total reflections; thus, this method also fails to provide an effective solution. Moreover, with respect to large light-directing plates having a width of several tens of centimeters, since it is difficult to provide them through a molding process, they have to be provided by using a cutting work. This makes the processing costs very expensive.

③ As illustrated in FIG. 59, a hole 32 is formed in the light-incident surface 1a of the light-directing plate 1, and after the LED lamp 7 has been inserted into the hole 32, the space between the LED lamp 7 and the light-directing plate 1 is filled with resin 33. In this case, optical interfaces no longer exist between the LED lamp 7 and the light-directing plate 1, and since total reflections inside the LED lamp 7 and refractions between the interfaces are eliminated, light rays released from the LED chip 12 are improved in their effective angle range by about 10° with respect to the light axis. Further, when the light rays pass through the interface, the Fresnel's ref lection is also reduced by several percent. However, this method also makes the costs of processing, assembling and other processes become expensive.

In the following description, consideration will be given on the takeoff process of light in the above-mentioned plate-shaped lighting device. The light, which has been made to be incident on the light-incident surface 1a of the light-directing plate 1, progresses inside the light-directing plate 1 while repeating total reflections on the border faces between the light-directing plate 1 and air. The light thus directed is scattered by the light-takeoff body 4, for example, the scattering print surfaces 4A or the rough surfaces 4B, that is installed on the front surface 3a or the rear surface 3b of the plate section 3 of the light-directing plate 1, or reflected by the V-shaped grooves 4C. Consequently, the directed light is taken out from the plane section 3 of the light-directing plate 1.

However, as shown in FIGS. 51(a) and 51(b), since this arrangement aims to take out the light rays that have impinged onto the scattering print surfaces 4A or the rough surfaces 4B by utilizing the scattering of light, all the light rays are not necessarily taken out from the light-directing plate 1 since the light rays scatter in all directions; one portion of the light rays is again enclosed inside the light-directing plate 1. Although some of the enclosed light rays impinge onto the scattering print surfaces 4A or the rough surfaces 4B and are again taken out from the light-directing plate 1, the rate at which the light rays progress inside the light-directing plate 1 and impinge onto respective side faces 1a, 1b, 1c and 1d of the light-directing plate 1, is increased. Among the light rays that impinge onto the side faces 1a, 1b, 1c and 1d, those light rays that impinge onto the side faces 1b, 1c and 1d having reflection layers are attenuated due to the reflectivity of the reflection layers, and the light ray that impinges onto the light-incident surface 1a opposing the light source 2 passes through the light-incident surface 1a without being taken out from the plane section 3 of the light-directing plate 1. As described above, the problem with the light-directing plate 1 using the scattering print surfaces 4A or the rough surfaces 4B is that the efficiency in the light to be taken out from the plane section 3 of the light-directing plate 1 is deteriorated.

In contrast, in the case of the V-shaped grooves 4C installed on the rear surface 3b of the light-directing plate 1 as shown in FIG. 53, the light rays that impinge onto the V-shaped grooves 4C are taken out from the plane section 3 of the light-directing plate 1 by reflections; therefore, the efficiency in the light to be taken out from the plane section 3 of the light-directing plate 1 is increased, compared with the case where the scattering print surfaces 4A or the rough surfaces 4B are installed. However, since the V-shaped grooves 4C respectively serve as line-shaped mirrors, virtual images 41 of the light source 2 are respectively formed within the virtual-image range 40 of the light source 2, as illustrated in FIG. 60. For this reason, in the case when the LED lamps 7 are used as the light source 2, since the LED lamps 7 serve as a dot-shaped light-emitting source, the respective adjacent virtual images 41, that is, the virtual images 41 of the respective dots of the LEP lamps 7, are aligned in a straight line within the virtual-image range 40. As a whole, the virtual images 41 appear to be a vertically striped pattern, thereby causing bright-and-dark distributions on the plane section 3. This has presented a problem of poor uniformity in luminance. Further, since the virtual images 41 thus formed tilt with respect to the light-directing plate 1, the further the point in question is apart from the light source 2, the further the virtual images 41 are located from the rear surface 3b of the light-directing plate 1. Consequently, when the plane section 3 of the light-directing plate 1 is viewed diagonally with respect to the frontal direction, there appears a portion at a corner section 42 (indicated by a shaded portion in the drawing) apart from the light source 2 of the light-directing plate 1, where the virtual images 41 of the light source 2 become invisible. This has presented a problem of poor uniformity in luminance in the plane section 3 of the light-directing plate 1.

Furthermore, even in the case when the light source 2 is not the dot-shaped light source, but a light source that has no bright-and-dark distributions, such as fluorescent lamps, it becomes possible to eliminate the stripe-shaped bright-and-dark distributions of the virtual images 41 within the virtual-image range 40. However, this arrangement still fails to solve the problem as described earlier, wherein when viewed diagonally, there appears a portion at the corner section 42 apart from the light source 2, where the virtual images 41 of the light-source 2 become invisible. In order to solve the problem of poor uniformity in luminance within the plane section 3, a scattering sheet 6 is provided on the plane section 3. However, the installation of the scattering sheet 6 that scatters the light rays impinging thereon also causes the take-off efficiency of light to become worse.

As described above, in terms of light-incidence efficiency, the problems with the conventional plate-shaped lighting devices are a poor efficiency and high costs required for improving the efficiency. Also in terms of takeoff efficiency of light, the problems are poor efficiency and irregularities in luminance on the light taken out. Therefore, one of the objectives of the present invention is to provide a plate-shaped lighting device which achieves uniform luminance by improving the efficiency of light utilization, that is, by increasing light-incidence efficiency as well as light-takeoff efficiency.

Another problem with display devices using the above-mentioned plate-shape lighting device is that only poor visibility can be achieved due to the inefficiency of light utilization of the plate-shaped lighting device. The other problem is as follows: character portions, provided on a patterned display board, are displayed by light that passes through color filters of absorption type that contain coloring matters, such as pigments, that optically absorb predetermined colors. Upon passing through one of the color filters, the light that has taken out from the light-directing plate merely has a transmittance of approximately 75 to 80% at a thickness of approximately 1 mm particularly when its setting of the color transmission is placed on the wavelength side shorter than green, even if the transmitting wavelength band of the color filter is properly coincident with the wavelength of light emitted from the light source. This reduces the efficiency of light utilization. Moreover, in the case of thick light-directing plates, the light transmittance further decreases, thereby reducing the efficiency of light use. This results in poor contrast between the character portions and the surrounding portions of the character portions.

Furthermore, in the case when a display device is illuminated by natural light during day time or external artificial light (such as light from head lamps of a car or a flash lamp), that is, in the case when the display is viewed through reflections of external light, among the light rays that have reached the color filter of the character portions from outside the display device, those light rays that coincide with the setting of the color transmission of the color filter are allowed to pass with the same transmittance as described above (75 to 80% at a maximum at approximately 1 mm) and reach the light-directing plate on the rear side. The light rays that have reached the light-directing plate pass through the light-directing plate from the surface to the rear surface, or are diffracted or absorbed by the light-takeoff body on the light-directing plate. The light rays that have passed through the light-directing plate are further reflected or scattered by the reflection plate that is placed at the back-surface of the light-directing plate, and again allowed to pass through the light-directing plate from the rear surface to the surface, or diffracted or absorbed by the light-takeoff body on the light-directing plate. Thus, the resulting light rays are externally released with the same transmittance as that obtained upon incidence from outside. Therefore, since the transmittance of the color filter (with a thickness of 1 mm) is 75 to 80%, the light rays that have been made to be incident onto the color filter of the character portions from outside have a transmittance of 56% to 64% after having reciprocally passed through the color filter, which results in a great light loss. This further results in reduced contrast (reduction in the difference between luminances) between the character portions and the surrounding portions of the character portions, thereby causing low visibility.

Furthermore, in the arrangement of conventional display devices, the colors in the character portions are of course determined and fixed by tones (light-transmitting characteristics) of the filters of the patterned display board when viewed under external light, and the tones that are transmitted through the color filters are also fixed when viewed after having turned their light sources on. Therefore, it is not possible to change the tones of the display patterns without conducting a physical change such as replacement of the color filters installed on the light-transmitting portions of the patterned display board to other color filters. In addition, the contents of display on the display device are limited to one kind, and it is not possible to display different contents without conducting a physical change such as replacement to another patterned display board having light-transmitting portions with a different pattern.

Moreover, the manufacturing method of the patterned display boards was complicated as described earlier so that a lot of costs and time were required for producing the patterned display boards. Therefore, it was impossible to easily change the contents of display in response to a change in operational circumstances or an alternation in usage.

Accordingly, the objectives of the present invention are to use a plate-shaped lighting device with high efficiency of light utilization, and also to provide a thin display device that has high visibility by improving the efficiency of light utilization.

SUMMARY OF THE INVENTION

The first objective of the present invention is to provide a plane-shaped lighting device which achieves uniform luminance by improving the efficiency of light utilization, that is, by increasing light-incidence efficiency as well as light-takeoff efficiency. The second objective of the present invention is not only to use a plate-shaped lighting device with high efficiency of light utilization, but also provide a thin display device that has high visibility by further improving the efficiency of light utilization.

In order to achieve the above-mentioned objectives, a plane-shaped lighting device of the present invention is provided with a light-directing plate made of a plate-shaped light-transmitting member and a light source that is placed close to or in contact with one side face of the light-directing plate, and designed so that light, which has been emitted from the light source and made to be incident on a light-incident surface on the one side face of the light-directing plate, is taken out from a plane section of the light-directing plate. The light source has LED lamps each of which has an LED chip for emitting light and a semispherical lens that directs light from each LED chip to the inside of the light-directing plate. The LED lamp is designed so that the distance from the top of the semispherical lens to the LED chip is set to be not longer than 1.8 times the radius of curvature of the semispherical lens.

In the above-mentioned plane-shaped lighting device, when compared with conventional arrangements wherein the distance from the top of the semispherical lens to the LED chip is set to be longer than 1.8 times the radius of curvature of the semispherical lens, light rays emitted from the LED chips with wider angles with respect to the light axis are allowed to impinge on the semispherical lens and subsequently to be incident right ahead of the LED lamps, that is, on the light-incident surface of the light-directing plate. In other words, the light emitted from the LED chips is made to be incident on the light-incident surface of the light-directing plate more efficiently, and consequently it becomes possible to improve the incidence efficiency of light onto the light-directing plate. As described above, since the incidence efficiency of light is improved without the necessity of any particular processing, etc., it is possible to reduce running costs by minimizing the power consumption of light source, and also to provide thin plane-shaped lighting devices at low costs.

For example, supposing that the light-directing plate has a thickness of 8 mm with the radius of curvature of the semispherical lens of 2.4 mm, the incidence efficiency of light of the LED lamps onto the light-directing plate is improved to 72 to 79% in the plane-shaped lighting device of the embodiment of the present invention, while it was only 64% in the conventional arrangements. In particular, when the distance from the top of the semispherical lens to the LED chip is set to one time the radius of curvature of the semispherical lens, the highest incidence efficiency of light is achieved.

Here, the lower limit of the distance from the top of the semispherical lens to the LED chip is preferably set so that the incidence efficiency of light is located within a range exceeding the incidence efficiency of light that is obtained when the distance from the top of the semispherical lens to the LED chip is set at 1.8 times as long as the radius of curvature of the semispherical lens.

Further, the width of the light-incident surface of the light-directing plate is preferably set to become larger than the outer diameter of each LED lamp, and the LED lamps are preferably arranged in the vicinity of the center of the width of the light-incident surface of the light-directing plate. With this arrangement, light emitted from the LED chips is made to be incident on the light-incident surface of the light-directing plate more efficiently; thus, it becomes possible to further improve the incidence efficiency of light onto the light-directing plate.

Moreover, in order to achieve the above-mentioned objectives, another plane-shaped lighting device of the present invention is provided with a light-directing plate made of a plate-shaped light-transmitting member and a light source that is placed close to or in contact with one side face of the light-directing plate, and designed so that light, which has been emitted from the light source and made to be incident on a light-incident surface on the one side face of the light-directing plate, is taken out from a plane section of the light-directing plate. Here, the light source has LED lamps, each of which has a reflection wall that directs the light emitted from the LED chips inside the light-directing plate, and a flat light-releasing surface.

In this plane-shaped lighting device, light emitted from the LED chips is released from the light-releasing surface efficiently by the reflection wall. Further, since the light-releasing surface is flat, each LED lamp is arranged with the entire surface located close to or in contact with the light-incident surface of the light-directing plate. In other words, all the light emitted from the LED lamps is allowed to be incident on the light-incident surface of the light-directing plate, and loss of light on the interface can be reduced; therefore, the incidence efficiency of light onto the light-directing plate can be improved. For example, in the case of the thickness of the light-directing plate of 8 mm, the plane-shaped lighting device of the present invention has achieved an incidence efficiency of 76%.

Thus, since the incidence efficiency of light is improved without the necessity of any particular processing, etc., it becomes possible to provide plane-shaped lighting devices with reduced power consumption of light source at low costs. In addition, since the above-mentioned arrangement makes the LED lamps more compact, it is possible to make the light-directing plate thinner, and thereby to provide much thinner plane-shaped lighting devices.

It is preferable to provide a transparent flexible layer between the light-releasing surface of the LED lamp and the light-incident surface of the light-directing plate. This arrangement makes smaller the difference of refractive indexes between the light-incident surface of the light-directing plate and the light-releasing surface of the LED lamp, thereby reducing the Fresnel's reflection. In other words, since no air layer exists between the light-releasing surface and the light-incident surface, the Fresnel's reflection on the interface can be reduced and loss of light can be eliminated so that high incidence efficiency of light is obtained. For example, the plane-shaped lighting device of the embodiment of the present invention can improve the efficiency of light so that the light rays are made to be incident inside the light-directing plate by approximately 8%.

Moreover, an anti-reflection film is preferably provided on at least either of the light-releasing surface of the LED lamp and the light-incident surface of the light-directing plate. This arrangement makes it possible to reduce the Fresnel's reflection on the interface between the light-releasing surface and the light-incident surface so that the transmittance of the interface is improved by approximately 3% to 4% per one surface. Thus, the incidence efficiency of light onto the light-directing plate can be further improved.

Furthermore, a reflection section is preferably installed on the light-incident surface of the light-directing plate so as to make return light from the light-directing plate reflected into the light-directing plate. This arrangement makes it possible to eliminate the return light that would otherwise be released from the light-incident surface, and consequently to further increase the efficiency of light utilization by eliminating loss of light even in the light-directing plate.

Moreover, in order to achieve the above-mentioned objectives, another plane-shaped lighting device of the present invention is provided with a light-directing plate made of a plate-shaped light-transmitting member and a light source that is placed close to or in contact with one side face of the light-directing plate, and designed so that light, which has been emitted from the light source and made to be incident on a light-incident surface on the one side face of the light-directing plate, is taken out from a plane section of the light-directing plate. Here, a plurality of light-takeoff bodies are provided on the plane section of the light-directing plate in a direction paralled to the one side face and in at least two directions that intersect said direction, and each light-takeoff body has a recessed shape or a protruding shape. The light-takeoff bodies are arranged so that their density increases as the distance from the light source increases, and each light-takeoff body has a smooth surface.

In the above-mentioned plane-shaped lighting device, light rays, which have been directed through the light-incident surface of the light-directing plate, are transmitted through the light-directing plate, and allowed to impinge on the light-takeoff bodies each of which has a smooth surface, thereby being deflected so as to be externally released from the plane section of the light-directing plate after having been reflected, refracted or transmitted. Therefore, compared with cases wherein light rays are taken out by using scattering, it is possible to reduce the quantity of stray light, and consequently to improve the light-takeoff efficiency.

When each light-takeoff body has a line shape, a virtual image of the light source is projected by each light-takeoff body. However, since the light-takeoff bodies are not aligned in one direction, virtual images derived from the respective light-takeoff bodies are mixed with one another so that the virtual images are projected in a net form. Therefore, the difference between bright and dark on the plane section is made indiscernible, the virtual images are viewed in the same manner irrespective of viewing angles, and thus it becomes possible to provide better uniformity in luminance.

Moreover, since the light-takeoff bodies are arranged so that their density increases as the distance from the light source increases, the virtual images from the light source are projected more closely as the distance from the light source increases. This enables luminance adjustments between positions closer to the light source and those farther from the light source, thereby providing a uniform distribution in luminance within the plane section.

As described above, since better luminance uniformity is achieved by installing the light-takeoff bodies each of which has a recessed shape or a protruding shape with a smooth surface in multi-directions, it is not necessary to provide a scattering sheet for scattering light in order to maintain the uniformity in luminance. Consequently, it becomes possible to reduce costs by reducing the number of parts, and also to provide brighter illumination. Therefore, it is possible to obtain high luminance by improving the efficiency of light utilization, and also to provide inexpensive plane-shaped lighting devices which have no change in luminance distribution even when viewed from different angles.

Here, each light-takeoff body is preferably designed to have either of the following shapes: a continuous-line shape, a discontinuous-line shape, and a shape made by combining these line shapes.

Moreover, the light-takeoff bodies are preferably designed so that each consists of short lines that intersect one another at one point.

Alternatively, instead of the arrangement of the above-mentioned light-takeoff bodies, a plurality of light-takeoff bodies, each of which has a recessed shape or a protruding shape with a smooth surface, may be provided on the plane section of the light-directing plate in a direction parallel to the one side face and the light-takeoff bodies, each of which is designed to have a curved line shape, are arranged so that their density increases as the distance from the light source increases. Moreover, a plurality of light-takeoff bodies, each of which has a recessed shape or a protruding shape with a smooth surface, may alternatively be provided on the plane section of the light-directing plate, and the light-takeoff bodies, each of which is designed to have a spherical shape, are arranged so that their density increases as the distance from the light source increases.

With these arrangements wherein the light-takeoff bodies are provided as the curved line shape or the spherical shape, virtual images of the light source, projected by the light-takeoff bodies, continuously expand in a delta shape to be mixed with one another. Therefore, the difference between bright and dark on the plane section is made indiscernible, the virtual images are viewed in the same manner irrespective of viewing angles, and thus it becomes possible to provide better uniformity in luminance.

Moreover, in order to achieve the above-mentioned objectives, a display device of the present invention is provided with: a plane-shaped lighting device having a light source and a light-directing plate that has light-takeoff bodies installed on its plane section, a patterned display board that is placed on one side of the plane section of the plane-shaped lighting device, and a reflection plate that is placed on the other side of the plane section. Here, the patterned display board has light-transmitting sections for allowing light to pass therethrough and light-shielding sections for preventing light from passing therethrough, and the light-transmitting sections are provided as transparent portions or through holes. In each of the light-shielding sections, the side face opposing the light-directing plate forms a reflective surface and the side face on the opposite side forms a scattering surface with a low reflectivity with respect to visible light rays.

In the above-mentioned display device, since light rays from the plane-shaped lighting device are efficiently utilized, bright displays are produced. In the case of light rays from the light source, among light rays released from the light-directing plate of the plane-shaped lighting device, those light rays that have been released from the plane section and have impinged on the reflection plate or the light-shielding sections of the patterned display board are reflected toward the light-directing plate so as to be directed into the light-directing plate, and again taken out toward the patterned display board from the plane section of the light-directing plate by the light-takeoff bodies. Here, those light rays that impinge on the light-transmitting sections of the patterned display board from the plane section are allowed to pass therethrough without being attenuated greatly.

In contrast, among light rays that are externally applied onto the patterned display board, those light rays that have impinged on the light-transmitting sections of the patterned display board are allowed to pass through the patterned display board, and externally released from the light-transmitting sections without being attenuated greatly in the same manner as the light rays from the light source. Those light rays that have impinged on the light-shielding sections of the patterned display board are irregularity reflected at a low reflectivity. Thus, the difference in luminance between the light-transmitting sections and the light-shielding sections is made greater, the contrast becomes clearer, and thus it is possible to achieve high visibility.

As described above, when an light-emitting display is produced by turning the light source on or when a display is confirmed under external light, it becomes possible to maintain better visibility with high contrast.

Moreover, the application of the plane-shaped lighting device of the present invention makes it possible to increase the light-incidence efficiency to the light-directing plate and the light-takeoff efficiency from the light-directing plate. Furthermore, since the light-directing plate of the plane-shaped lighting device is made thinner, it is possible to improve the efficiency of light utilization by reducing loss of light in the light-directing plate, to reduce the power consumption of the light source and consequently to reduce the running costs. In other words, thinner display devices which has high efficiency of light utilization and better visibility at low power consumption can be achieved.

The surface of the reflection plate is preferably made white or the same color as the color of light emission of the light source. In the case when the surface of the reflection plate is made the same color as the color of light emission of the light source, upon application of external light, only the same color component as the color of light emission of the light source is reflected from the reflection plate, and externally released. With this arrangement, in both of the cases when a light-emitting display is produced by turning the light source on and when a display is confirmed under external light, the pattern is displayed with the same color tone. Moreover, when the surface of the reflection plate is made white, the same reflectivity is provided to any light ray having a specific color. Therefore, even if the color tone of external light changes, it is possible to always obtain high reflectivity in a stable manner, and consequently to maintain high visibility. In other words, the device can be used under any kind of external light.

More preferably, the light source may be designed to emit light rays with a plurality of colors, and the reflection plate is made white. This arrangement makes it possible to easily change the color tone of displayed pattern when the light source is turned on. Further, it becomes possible to provide full-color displaying operation by increasing the number of colors of light emission. Here, since better color-mixture properties are obtained, it is possible to provide displays with less color irregularity irrespective of the size of the light-directing plate.

Moreover, in order to achieve the above-mentioned objectives, another display device of the present invention is provided with: a plane-shaped lighting device having a light source capable of emitting light rays having respective colors, a light-directing plate that has light-takeoff bodies installed on its plane section, a patterned display board that is placed on one side of the plane section of the plane-shaped lighting device, and a reflection plate that is placed on the other side of the plane section. Here, the patterned display board has light-transmitting sections for allowing light to pass therethrough and light-shielding sections for preventing light from passing therethrough, and the light-transmitting sections are provided as transparent portions or through holes. Each light-transmitting section is provided with a color filter which selectively transmits light rays based upon the colors of light emission from the light source. In each of the light-shielding sections, the side face opposing the light-directing plate forms a reflective surface and the side face on the opposite side forms a scattering surface with a low reflectivity with respect to visible light rays.

In the above-mentioned display device, light rays, emitted from the light source, are selected by the color filters, and only specific colors are allowed to pass therethrough. In other words, in accordance with the colors of light emission from the light source, the color tones of the displayed pattern can be changed and the contents of the display can be switched. Therefore, a plurality of patterns can be displayed in accordance with the colors of light emission from the light source, and the contents of displays can be changed without making any change in construction.

The light source is preferably designed to have a plurality of LED lamps. The light-emission wavelength band of LED lamps is single and narrower than that of the light source using fluorescent lamps or incandescent lamps in combination with color filters so as to provide a specific color of light emission; therefore, it is possible to simplify the characteristics of color filters that is to be installed in the patterned display board, and also to reduce costs of color filters. Further, it is possible to improve color-separation performances in displays, such as contrast between displays during display time and non-display time.

Moreover, since a plurality of LED lamps are used as the light source, it is possible to make the plane-shaped lighting device compacter and thinner, and also to make the service life of the light source longer as well as to reduce the running costs. Furthermore, by replacing the LED lamps with those having different colors of light emission, the color tone of displays can be changed, and it becomes possible to provide displays with a variety of expressions.

Preferably, an anti-reflection film may be placed on the surface of each light-transmitting section of the patterned display board. This arrangement makes it possible to reduce the Fresnel's reflection on the surface, to improve the efficiency of light utilization, and to improve contrast between the light-transmitting sections and the light-shielding sections. Therefore, better visibility is obtained, the power consumption is further reduced, and the running costs are also lowered.

More preferably, the patterned display board may be designed by combining a transparent plate and a light-shielding film, and the light-shielding film is placed on the light-shielding sections. Here, the light-shielding film, which is made of a light-shielding sheet to which a cut-out process is applicable, is bonded to the transparent plate. In this arrangement, when a patterned display board is designed, the light-shielding sheet is cut out so as to fit the display pattern, and bonded to the transparent plate; thus, the patterned display board is complete. Since a desired patterned display board is easily designed in this manner, it is possible for the user to create his or her own pattern with ease. Further, the contents of displays can be readily changed at low costs by merely replacing the patterned display boards.

As described above, it is possible to provide thinner display devices which have high efficiency of light utilization and better visibility at low power consumption and which also enable changes in display patterns and color tones with ease.

For a fuller understanding of the nature and advantages of the invention, reference should be made to the ensuing detailed description taken in conjunction with the accompanying drawings.

BRIEF DESCRIPTION OF THE DRAWINGS

Each of FIGS. 2(a) and 2(b) shows a plane-shaped lighting device having the lens-type LED lamps.

FIGS. 9(a) and 9(b) show a plane-shaped lighting device having chip-type LED lamps which has a light-directing plate whose light-incident surface has a flexible layer: FIG. 9(a) shows a pre-contact state of the LED lamps, and FIG. 9(b) shows a post-contact state of the LED lamps.

FIG. 10(a) shows a pre-contact state of the LED lamps, and FIG. 10(b) shows a post-contact state of the LED lamps.

FIGS. 11(a) and 11(b) show a plane-shaped lighting device having chip-type LED lamps each of which has a flexible layer made of a transparent resin for sealing purposes: FIG. 11(a) shows a pre-contact state of the LED lamps, and FIG. 11(b) shows a post-contact state of the LED lamps.

FIG. 12(a) is a front view and FIG. 12(b) is a perspective view.

FIG. 20(a) shows a case wherein the flexible layer is formed on the light-incident surface of the light-directing plate, FIG. 20(b) shows a case wherein the flexible layer is formed on the upper surface of each LED lamp, and FIG. 20(c) shows a case wherein the flexible layer is formed by a transparent resin for sealing purposes.

FIG. 21(a) is a front view and FIG. 21(b) is a perspective view.

FIG. 22(a) shows a case wherein the anti-reflection layer is formed on the light-incident surface of the light-directing plate and FIG. 22(b) shows a case wherein the anti-reflection layer is formed on the highly-reflective layer.

FIG. 23(a) shows a case wherein the flexible layer is formed on the highly-reflective layer, FIG. 23(b) shows a case wherein the flexible layer is formed on each LED lamp, and FIG. 23(c) shows a case wherein the flexible layer is made by a transparent resin for sealing purposes.

FIGS. 40(a), 40(b) and 40(c) are drawings that show the layouts of the light-takeoff bodies of other embodiments.

FIG. 41 is a perspective view of a light source wherein lens-type LED lamps are used.

FIG. 51(a) shows a cross-sectional view of a light-directing plate that has a scattering print surface and FIG. 51(b) shows a cross-sectional view of a light-directing plate that has a rough surface.

FIG. 54(a) is a front view and FIG. 54(b) is a side view.

DESCRIPTION OF THE EMBODIMENTS

[First Embodiment]

First, the following description will discuss one embodiment of a plane-shaped lighting device of the present invention which concerns incidence of light.

Figure 1:
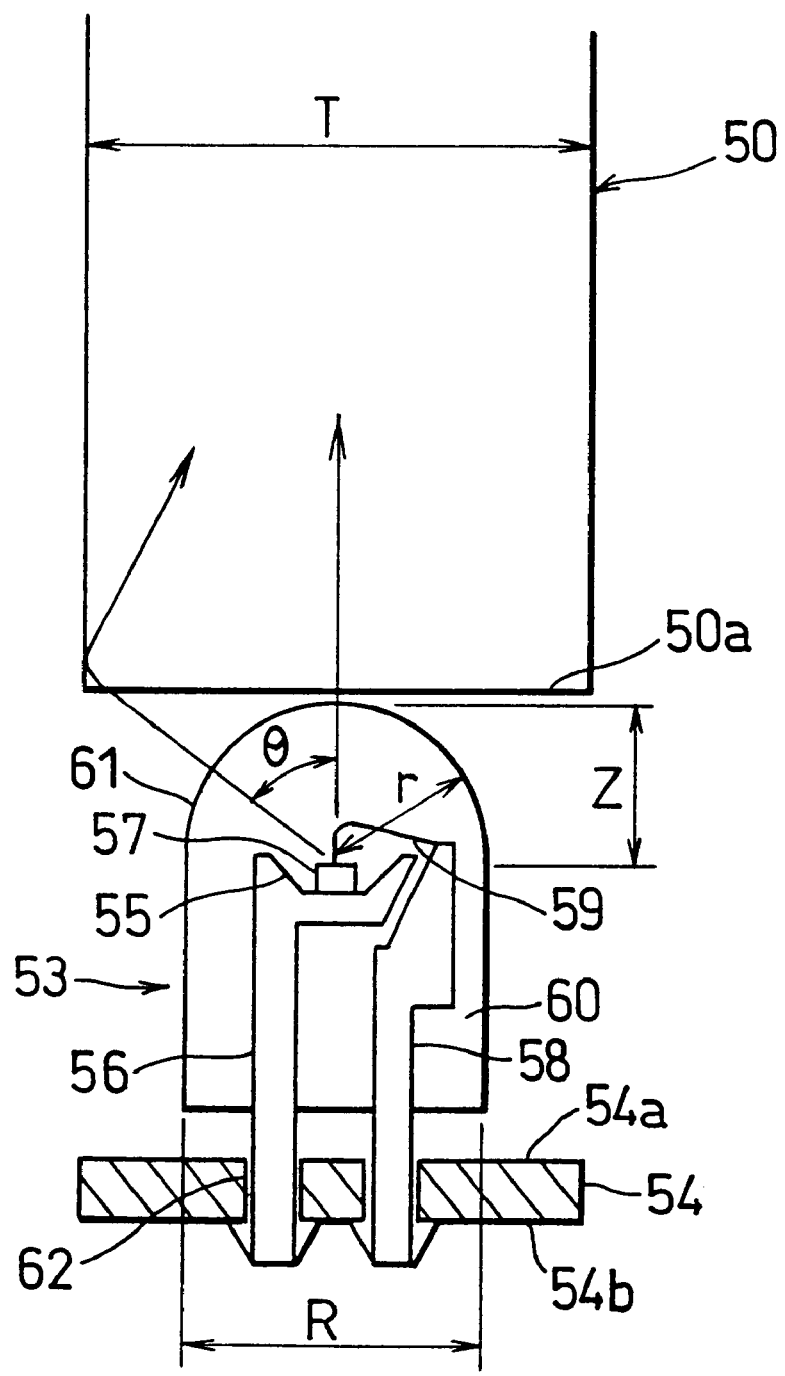
FIG. 1 is a cross-sectional view showing a lens-type LED lamp of a plane-shaped lighting device of one embodiment of the present invention.
Figure 2A:
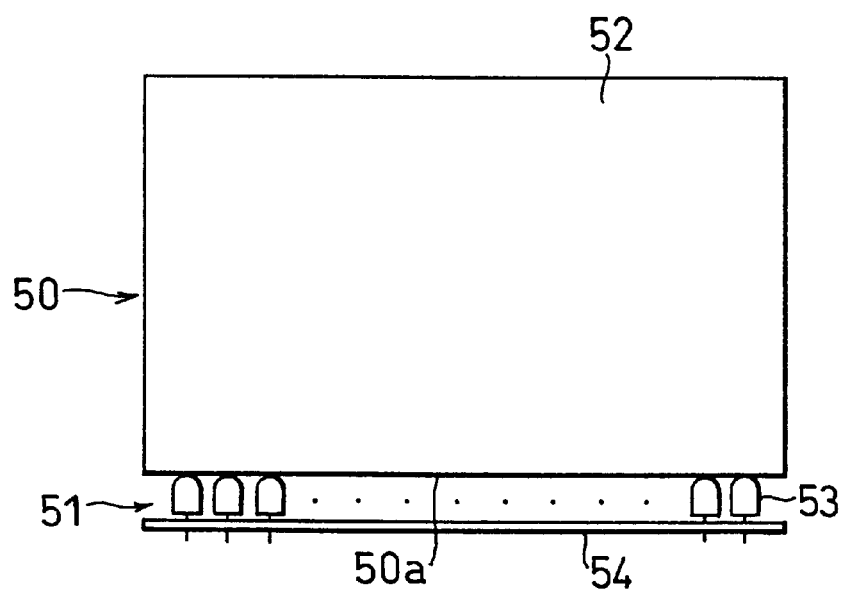
FIG. 2(a) is a front view and FIG. 2(b) is a side view.
Figure 2B:
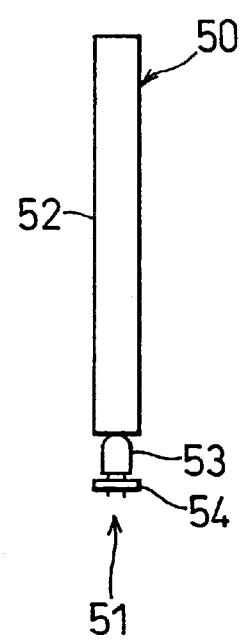

As illustrated in FIGS. 1 and 2, a plane-shaped lighting device of the present embodiment is provided with a plate-shaped light-directing plate 50 made of a light-transmitting material such as acryl and a light source 51 that is placed along one end of a light-incident surface 50a on the lower side of the light-directing plate 50. Thus, light from the light source 51, which has been made to be incident on the light-incident surface 50a of the light-directing plate 50, is taken out from the surface side of a plane section 52 of the light-directing plate 50. Here, a reflection plate, not shown, is provided on the rear-surface side of the plane section 52.

The light source 51 is constituted of a plurality of LED lamps 53 that are arranged into an array with a constant pitch on a printed wiring substrate 54 made of glass epoxy. Each of the LED lamps 53 has a structure wherein an LED chip 57 is installed inside a reflection cup 55 that is provided in a lead frame 56 and the LED chip 57 is connected to another lead frame 58 through a bonding wire 59. Here, the structure is molded with a transparent resin 60 such as an epoxy resin or a silicone resin having a refractive index of 1.5. Further, during the molding process, a semispherical lens 61 is simultaneously formed above the LED chip 57. Both of the lead frames 56 and 58 of the LED lamp 53, which penetrate through holes 62 of the substrate 54, are soldered onto the rear-surface 54b of the substrate 54. Here, the surface 54a of the substrate 54 has a white color so as to have a high reflectivity and a chip-type load-resistance element is packaged on the rear surface 54b.

Further, the substrate 54 is positioned with respect to the light-directing plate 50 so that the lens-type LED lamp 53 has its outer diameter R set to be smaller than the thickness of the light-directing plate 50, that is, to be smaller than the width T of the light-incident surface 50a, and so that the top of the semispherical lens 61 of the LED lamp 53 is located virtually in the proximity of the center of the light-incident surface 50a of the light-directing plate 50 in the thickness direction. Here, the thickness of the light-directing plate 50 is set at 3 mm to 9 mm: If it is thicker than 9 mm, the transmittance of light becomes worse, and if it is thinner than 3 mm, it becomes difficult to allow light to be incident from the LED lamp 53.

Moreover, in the LED lamp 53, the distance Z from the top of the semispherical lens 61 to the LED chip 57 is set within a range from not less than 0.4 times to not more than 1.8 times the radius of curvature r of the Hemispherical lens 61, and more preferably is set within a range from not less than 0.5 times to not more than 1.7 times. With this arrangement, light rays emitted from the LED chip 57 are allowed to impinge on the semispherical lens 61 with wider angles with respect to the light axis, and subsequently to be incident right ahead of the LED lamp 53. For example, in an LED lamp 53 having the radius of curvature r=2.4 with respect to a light-directing plate 50 with a thickness of 8 mm, light rays emitted from the LED chip 57 become effective up to a range of θ=59° with respect to the light axis. Thus, compared with conventional high-luminance LED lamps (whose distance from the top of the semispherical lens to the LED chip is set from 1.8 times to 2.1 times the radius of curvature), it becomes possible to effectively allow light rays to be incident on the light-incident surface 50a of the light-directing plate 50 with wider angles with respect to the axis of light. Furthermore, since the thickness T of the light-directing plate 50 is set to become thicker than the outer diameter R of the LED lamp 53, light rays, which has been released by the semispherical lens 61 of the LED lamp 53, effectively impinge onto the light-incident surface 50a of the light-directing plate 50 and allowed to be directed into the light-directing plate 50. When the light-directing plate 50 has a refractive index of approximately 1.5, the light rays, which have been directed through the light-incident surface 50a of the light-directing plate 50, satisfy the required angle conditions for total reflection with respect to the plane section 52 that is perpendicular to the light-incident surface 50a, and therefore are transmitted through the light-directing plate 50 and allowed to efficiently progress while repeating total reflections.

Figure 3:
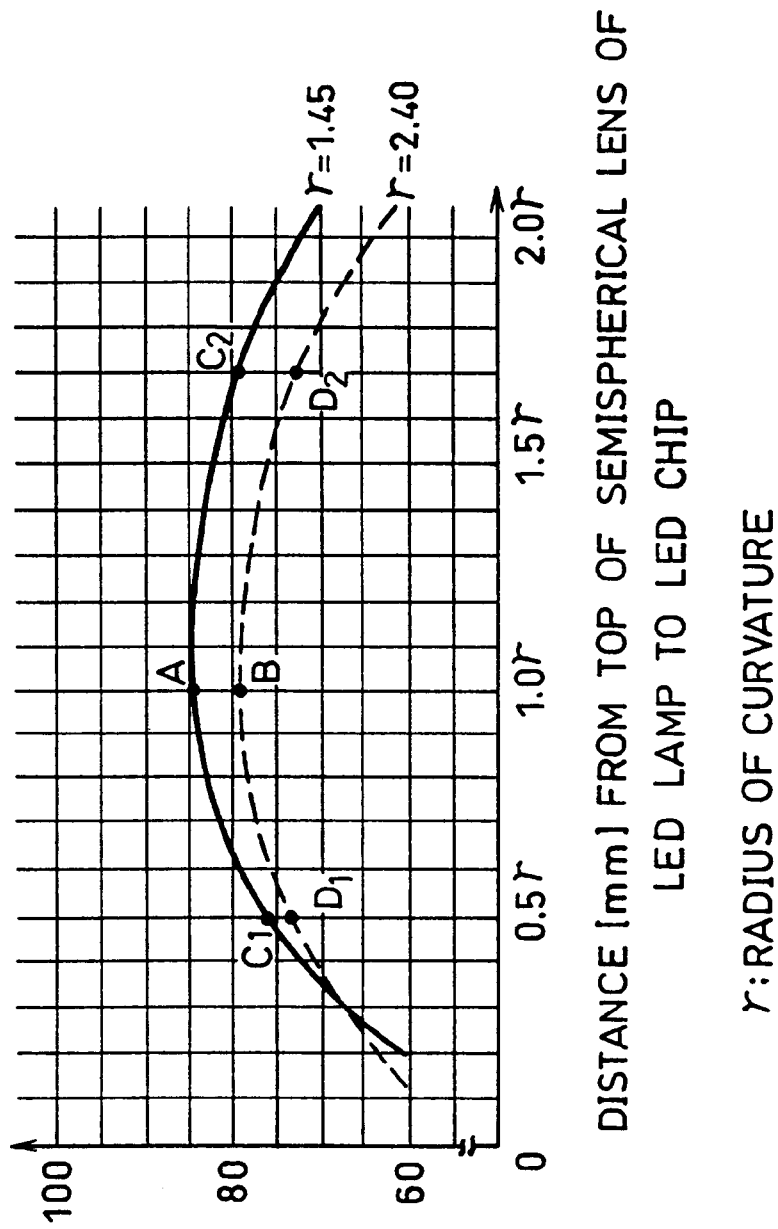
FIG. 3 is a graph that shows the relationship between positions of an LED chip and the light-incidence effciency to a light-directing plate.

FIG. 3 shows measurements of the light-incidence efficiency onto the light-directing plate 50 when the thickness of the light-directing plate 50 is 8 mm and the position of the LED chip 57 is set as a parameter. As indicated by point A and point B in the drawing, when the position of the LED chip 57 is placed so that the distance Z from the top of the semispherical lens 61 is equal to the radius of curvature r, that is, when it is placed at the center of curvature, an optimum position is provided and the highest incidence efficiency is obtained: an incidence efficiency of 84% at r=1.45, and an incidence efficiency of 79% at r=2.40. Incidence efficiencies of not less than 70% are obtained when the distance from the top is set within a range from 0.4 times to 1.8 times the radius curvature r and incidence efficiencies of not less than 72% are obtained when the distance from the top is set within a range from 0.5 times to 1.7 times (C1 to C2 and D1 to D2 in the drawing), while the attenuation of incidence efficiency is kept within 10% of the incidence efficiency obtained in the case of the placement at the center of curvature. Here, since the incidence efficiency onto the light-directing plate is 64% in conventional high-luminance LED lamps, higher incidence efficiencies are obtained in both of the cases, compared with the conventional arrangements.

As the position of the LED chip 57 comes closer to the top of the semispherical lens 61, incidence angles to the semispherical lens 61 become greater, and light rays that have too great refractive angles are released laterally so that light rays that are not directed to the light-incident surface 50a of the light-directing plate 50 become greater and therefore reduce the incidence efficiency. Therefore, the lower limit of the distance Z from the top of the semispherical lens 61 to the LED chip 57 is set to be within a range exceeding the incidence efficiency (74% at r=1.45 or 70% at r=2.40) of the LED lamp 53 obtained when the LED chip 57 is placed at a position corresponding to 1.8 times the radius of curvature r of the semispherical lens 61. Moreover, as the position of the LED chip 57 goes apart from the top of the semispherical lens 61, some of light rays that are released laterally increase, thereby reducing the incidence efficiency as in the cases of the conventional arrangements.

Figure 4:
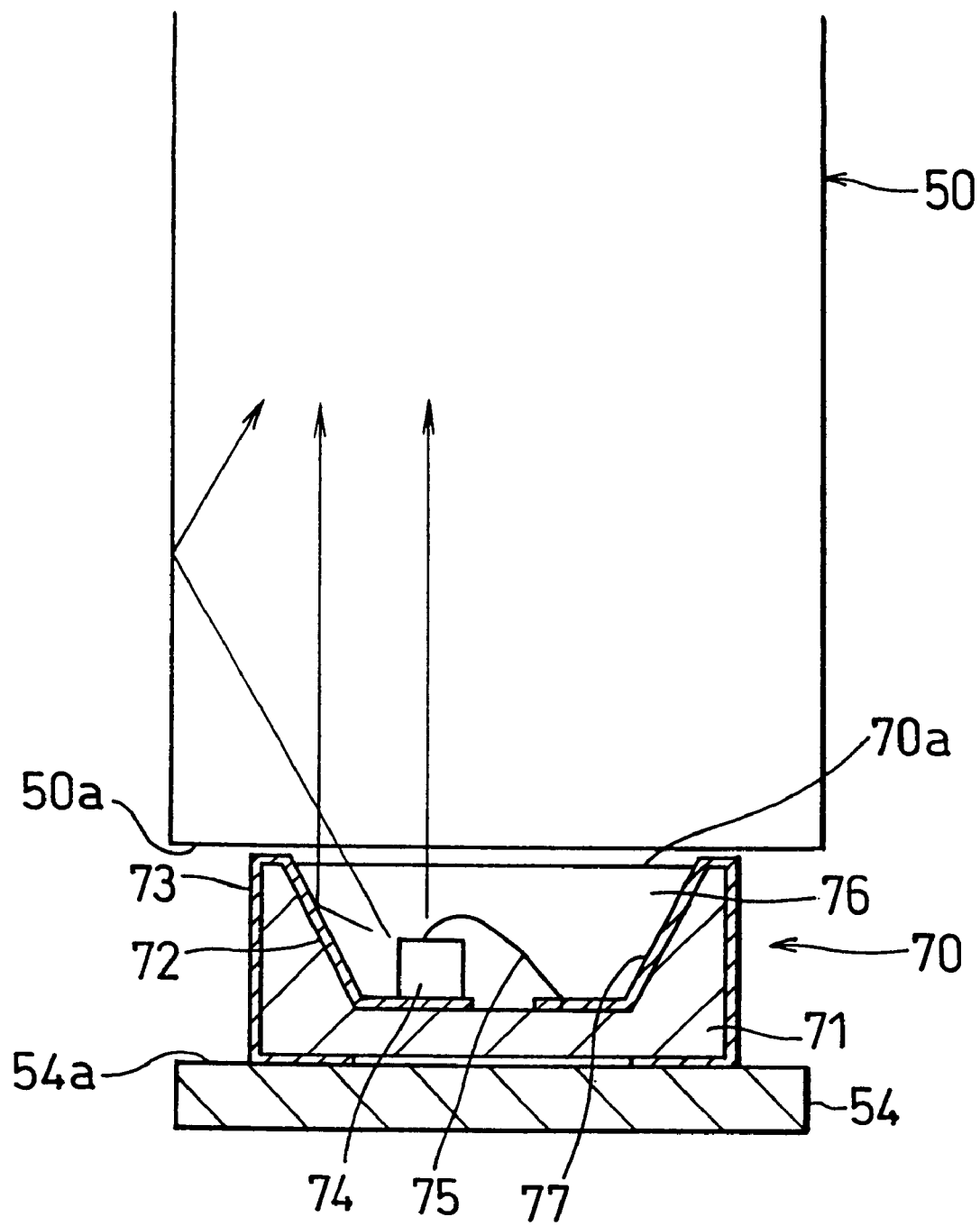
FIG. 4 is a cross-sectional view of an LED lamp of a chip type.
Figure 5:
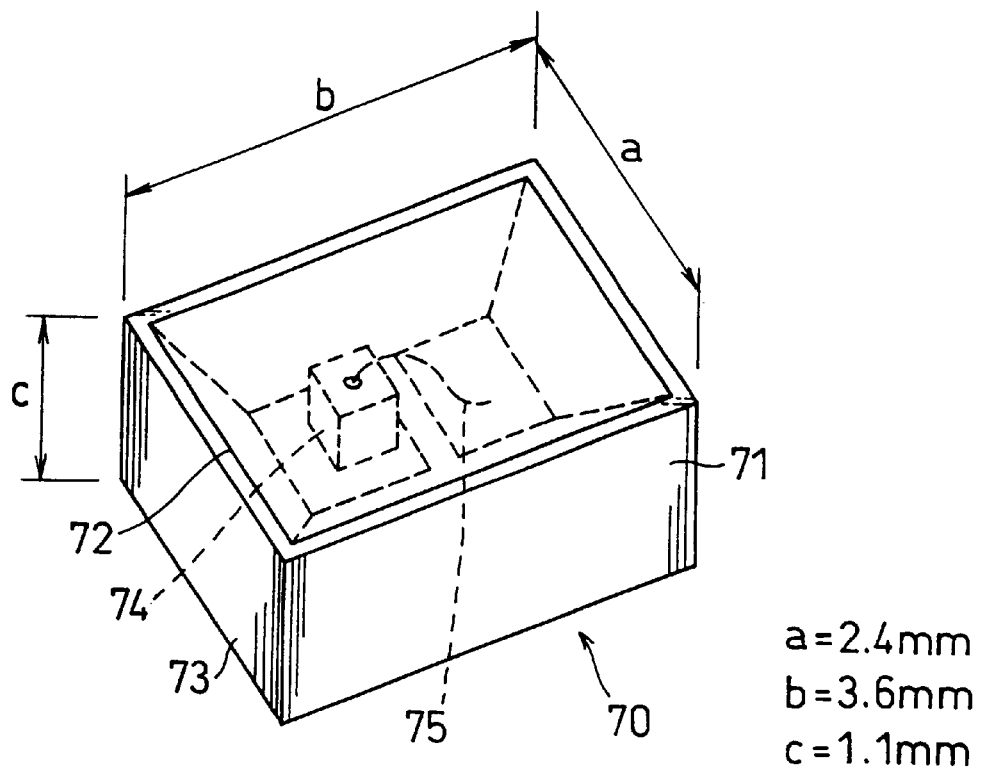
FIG. 5 is a perspective view of the LED lamp of the chip type.

Here, in the above-mentioned lens-type LED lamp 53, it is essential to properly position the LED lamp 53 with respect to the light-incident surface 50a of the light-directing plate 50 in order to increase the incidence efficiency; therefore, it can not be said that the above-mentioned arrangement can completely utilize light rays from the LED lamp 53. For this reason, it is proposed that a chip-type LED lamp 70 be adopted as the light source as shown in FIGS. 4 and 5. In the chip-type LED lamp 70, a recessed portion 72 is provided in a package 71 made of a light-shielding resin that is formed by mixing powdered material such as carbon into liquid crystal polymer. On both sides of the LED lamp 70, metal films, such as Cu, Ni and Au, which serve as metal wiring 73, are formed by a plating or vapor deposition method on the bottom and side surfaces of the recessed portion 72, and from the upper surface of the package 71 to the lower surface through the side faces. An LED chip 74 is installed on one piece of the metal wiring 73, and the LED chip 74 is connected to the other piece of the metal wiring 73 by a bonding wire 75, and the recessed portion 72 is sealed by a transparent resin 76 having a refractive index of 1.5 that is made of epoxy resin, silicone resin or other materials. The upper surface of the package 71 is flat and serves as a light-releasing surface 70a, and the metal wiring 73 on the side face portions inside the recessed portion 72 serves as reflective walls 77 that direct light rays that have been released from the LED chip 74 laterally in the forward direction. Here, the size of the package 71 is indicated by a=2.4 mm, b=3.6 mm and c=1.1 mm, and the width of the light-incident surface 50a of the light-directing plate 50 is set to be greater than the light-releasing surface 70a of the LED lamp 70.

Figure 6:
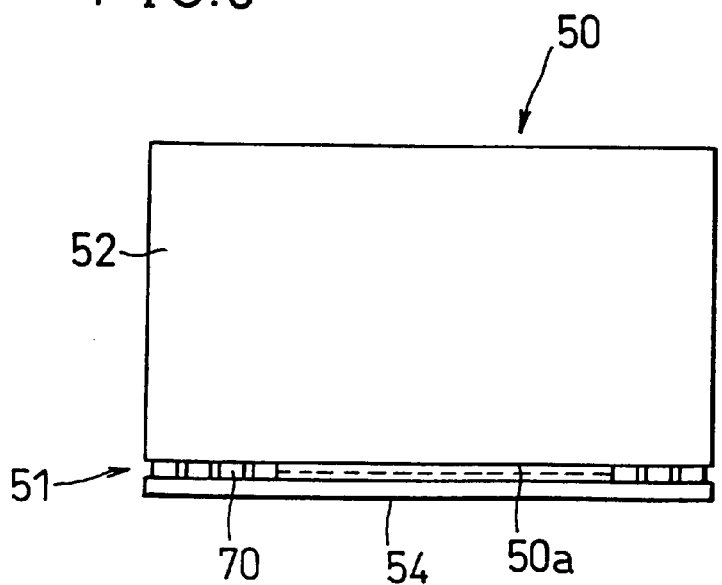
FIG. 6 is a front view that shows a plane-shaped lighting device having the LED lamps of the chip type.
Figure 7:
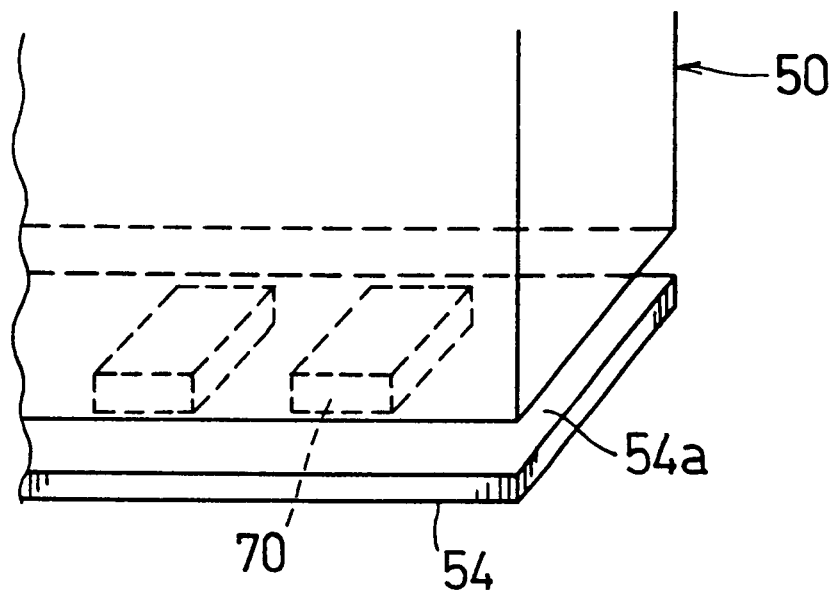
FIG. 7 is a perspective view that shows the plane-shaped lighting device having the LED lamps of the chip type.

Further, as illustrated in FIGS. 6 and 7, the LED lamp 70 is assembled on the surface 54a of the substrate 54 by placing the package 71 on the substrate 54 and soldering the metal wiring 73 onto the substrate 54. Thus, a plurality of the LED lamps 70 are aligned in one line with constant intervals in the width direction of the light-directing plate 50. The LED lamp 70 is positioned so that its light-releasing surface 70a is placed in contact with or in the proximity of the light-incident surface 50a of the light-directing plate 50, without sticking out from the light-incident surface 50a. In this case, the LED lamps 70 are not necessarily aligned in one line as long as they do not stick out from the light-incident surface 50a. For example, they may be aligned in a zigzag line.

This arrangement of the light source 51 allows the LED chip 74 to be placed closer to the light-incident surface 50a of the light-directing plate 50, thereby providing a wider light-releasing angle. Consequently, all the light emitted from the LED lamp 70 is allowed to impinge onto the light-incident surface 50a of the light-directing plate 50 and to be directed inside the light-directing plate 50 and transmitted by repeating total reflections. With this arrangement, since the light from the LED lamp 70 is transmitted from a resin to another resin, loss of light is reduced on the interface and a high incidence efficiency is obtained with respect to the light-directing plate 50. Here, it is possible to achieve an incidence efficiency of 76%, which is 19% greater than the incidence efficiency (64%) of conventional LED lamps. Moreover, since the thickness of the light-directing plate 50 can be decreased as small as the size of the LED lamp 70, it becomes possible to make the light-directing plate 50 thinner.

Figure 8:
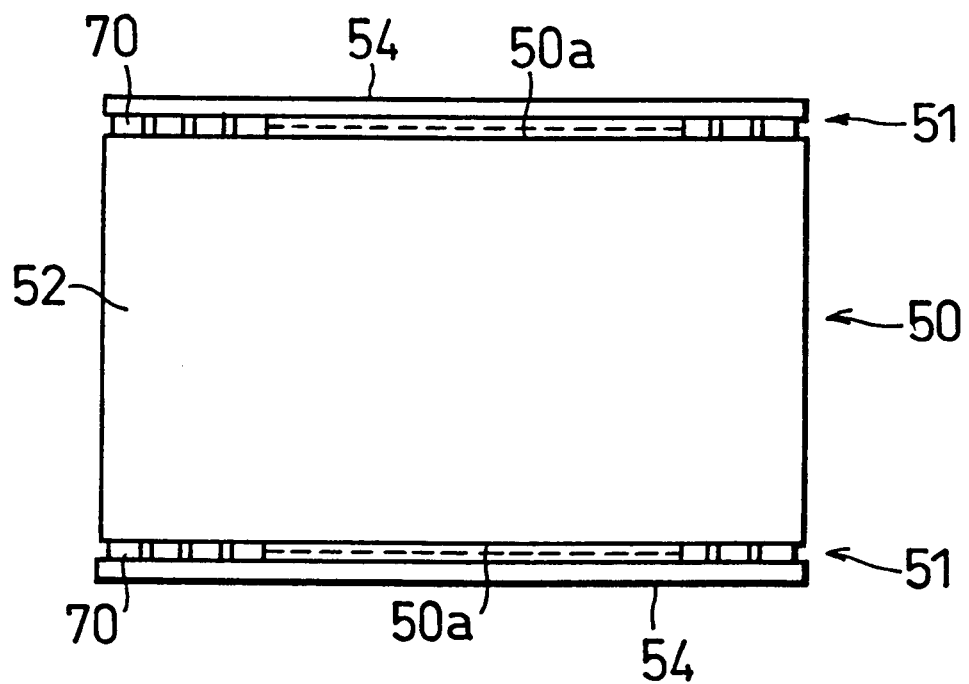
FIG. 8 is a front view of a plane-shaped lighting device wherein the LED lamps of the chip type are placed on both sides of the light-directing plate.

Additionally, in this embodiment, the light-source 51 is placed on one side-face end of the light-directing plate 50; however, when a greater mount of light is required, the light source 51 may be placed similarly on the opposing side-face end of the light-directing plate 50 as shown in FIG. 8.

Figure 10A:
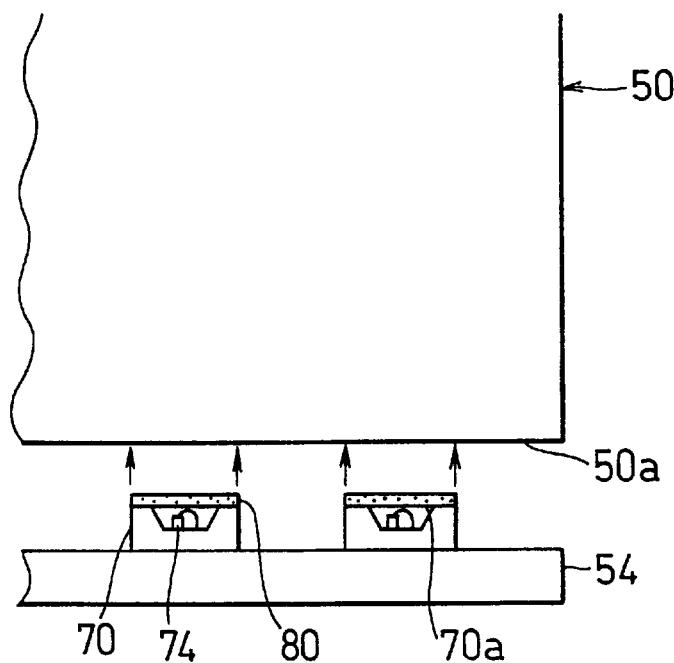
FIGS. 10(a) and 10(b) show a plane-shaped lighting device having chip-type LED lamps each of which has a flexible layer on its upper surface.
Figure 10B:
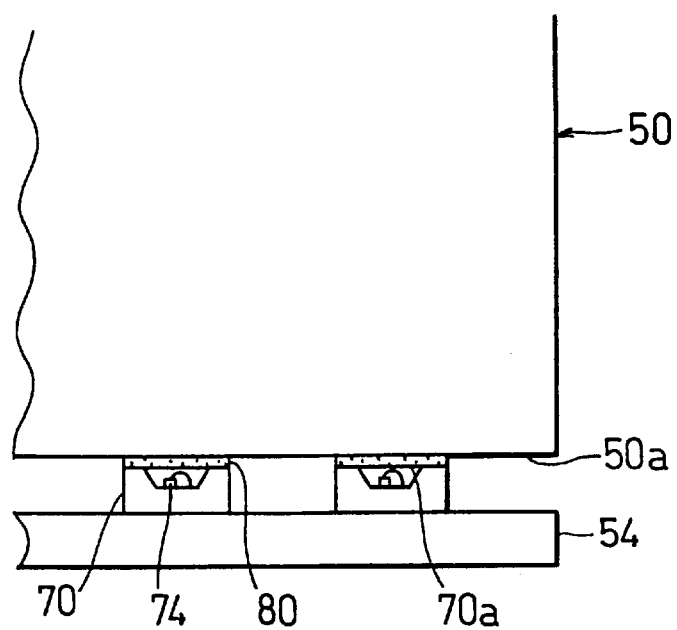

In some cases, the LED lamp 70 does not adhere to the light-directing plate 50, even if it is brought into contact with the light-directing plate 50, and there is sometimes a slight gap which forms an air layer. This causes a high reflectivity on the interface, and results in loss of light. As illustrated in FIGS. 9(a) and 9(b), in order to eliminate this problem, a silicone resin or other material is applied onto the entire light-incident surface 50a of the light-directing plate 50 so as to form a transparent gel layer or a flexible layer 80. Then, the LED lamp 70 is pressed thereon and adhered thereto so as to eliminate the air layer. Moreover, in another example as illustrated in FIGS. 10(a) and 10(b), a silicone resin or other material is applied onto the upper surface of the package 71 of the LED lamp 70 so as to form a transparent gel layer or a flexible layer 80, and this layer is pressed onto the light-incident surface 50a of the light-directing plate 50 and joined thereto. In the other example as shown in FIGS. 11(a) and 11(b), a silicone resin 76 or other material, which is put on the LED chip 74 so as to seal it, is mounded to a level higher than the upper surface of the package 71, and the LED lamp 70 is pressed onto the light-incident surface 50a of the light-directing plate 50 so that the LED lamp 70 and the light-directing plate 50 are kept closely in contact with each other, with a transparent gel layer or a flexible layer formed between them.

Such a gel layer or a flexible layer makes it possible to eliminate the air layer between the LED lamp 70 and the light-directing plate 50, thereby virtually eliminating the refractive-index difference between the light-incident surface 50a of the light-directing plate 50 and the light-releasing surface 70a of the LED lamp 70. Thus, the Fresnel's reflection is reduced on the interface, loss of light on the interface is eliminated, and a high incidence efficiency on the light-directing plate 50 is obtained since a wider critical angle is provided with respect to total reflection. Here, a incidence efficiency of 83% is obtained when the interface is eliminated: the percentage is improved by 9% compared with the arrangement having the interface.

Figure 12A:
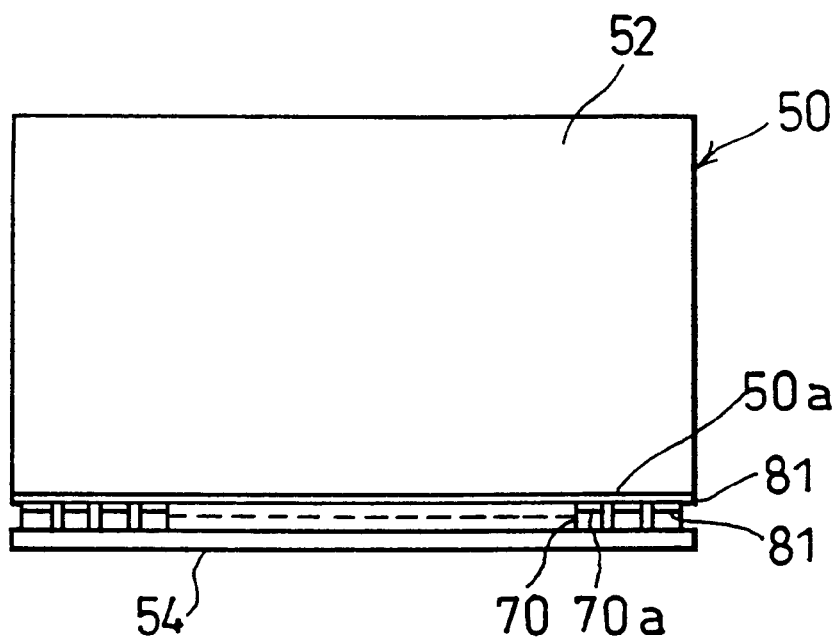
FIGS. 12(a) and 12(b) show a plane-shaped lighting device having chip-type LED lamps each of which has an anti-reflection film.
Figure 12B:
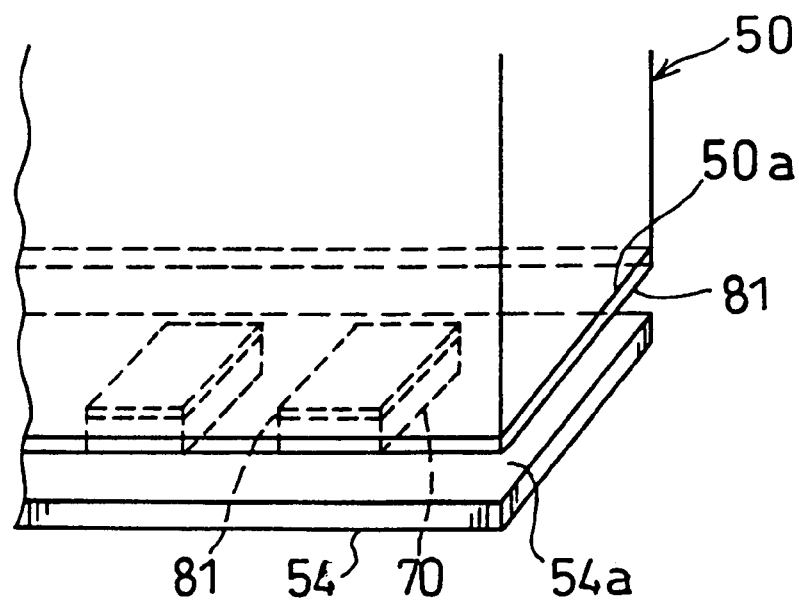

In the case when the LED lamp 70 is not brought in contact with the light-directing plate 50, anti-reflection films 81 are respectively formed on the light-releasing surface 70a of the LED lamp 70 and the light-incident surface 50a of the light-directing plate 50, as shown in FIGS. 12(a) and 12(b). The anti-reflection films 81 are formed on the upper surface of each package 71 and the entire light-incident surface 50a of the light-directing plate 50 with a film thickness of λ/4 (λ is a light-emitting wavelength of the LED) by vapor-depositing on them a material such as $MgF_2$ having a refractive index of 1.2 to 1.4 by using an EB (Electron Beam) evaporation device.

Figure 13:
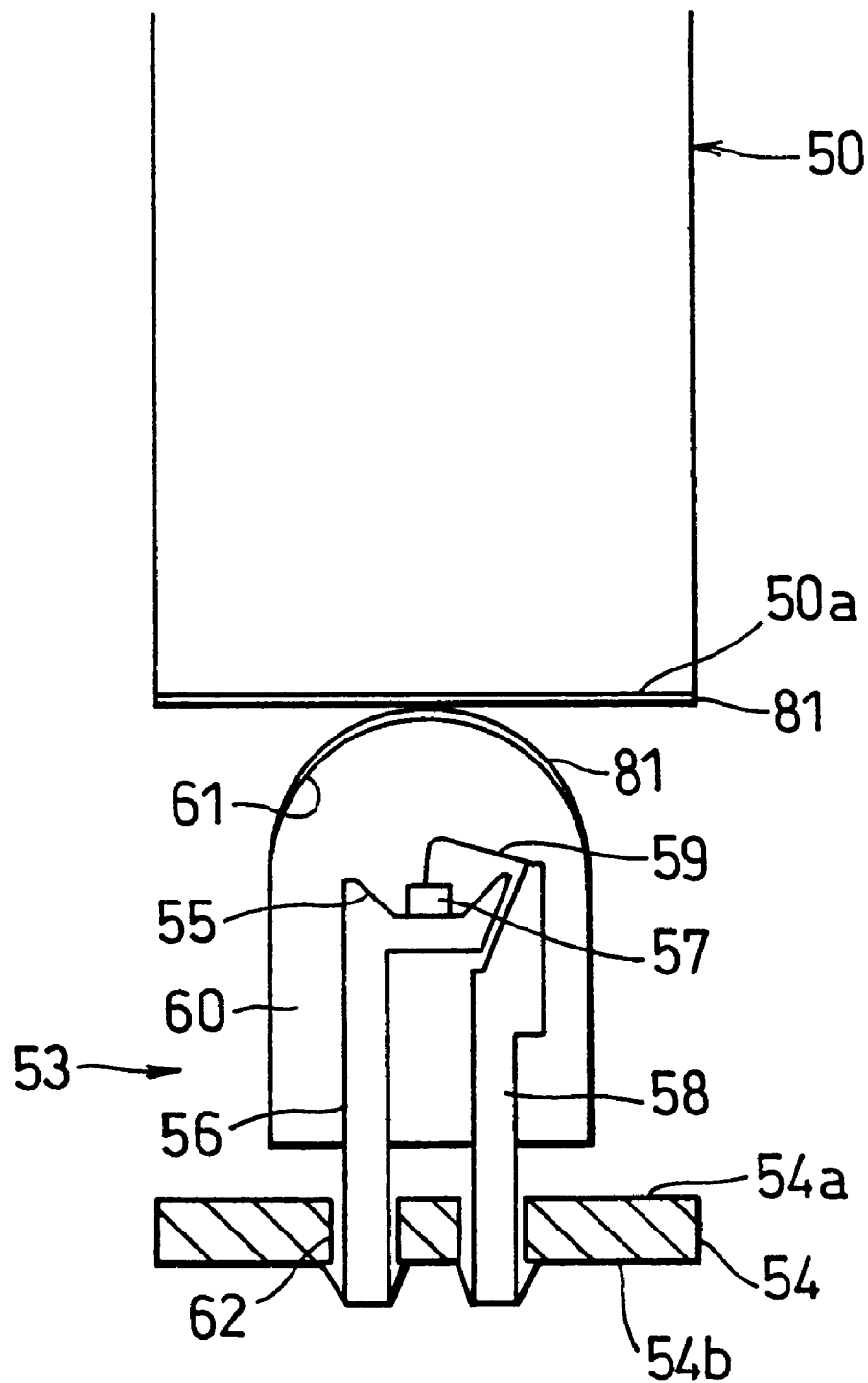
FIG. 13 is a front view of a plane-shaped lighting device having lens-type LED lamps each of which has an anti-reflection film.

Similarly, as illustrated in FIG. 13, in the case of the lens-type LED lamp 53, the anti-reflection films 81 are formed on the entire surface of the semispherical lens 61 that forms the light-releasing surface of the LED lamp 53 and the entire light-incident surface 50a of the light-directing plate 50. Additionally, the anti-reflection film 81 may be formed either on the LED lamp 53, 70 or on the light-directing plate 50.

As described above, the use of the anti-reflection film 81 that is formed at least either on the light-releasing surface of the LED lamp 53, 70 or on the light-incident surface 50a of the light-directing plate 50 makes it possible to reduce the Fresnel's reflection from approximately 4% to not more than 1%. The Fresnel's reflection of approximately 4% occurs on the interface between the LED lamp 53, 70 or the light-directing plate 50 molded with the resin that has a refractive index of approximately 1.5 and the air having a refractive index of 1. Thus, it becomes possible to improve the transmittance of the interface by approximately 3% to 4% per one surface, and consequently to obtain a high incidence efficiency with respect to the light-directing plate 50.

[Second Embodiment]

Figure 14:
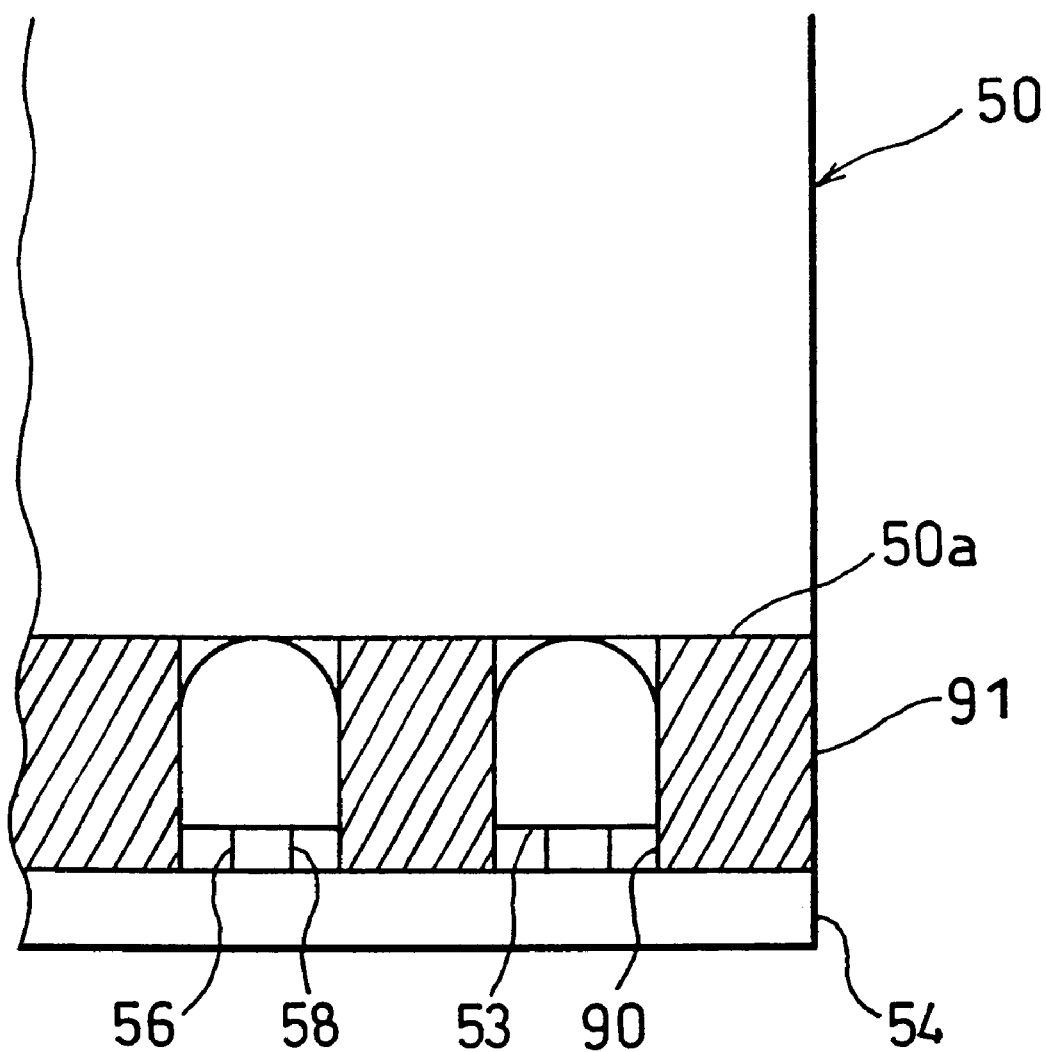
FIG. 14 is a front view of a plane-shaped lighting device having lens-type LED lamps, wherein block-shaped members are installed.
Figure 15:
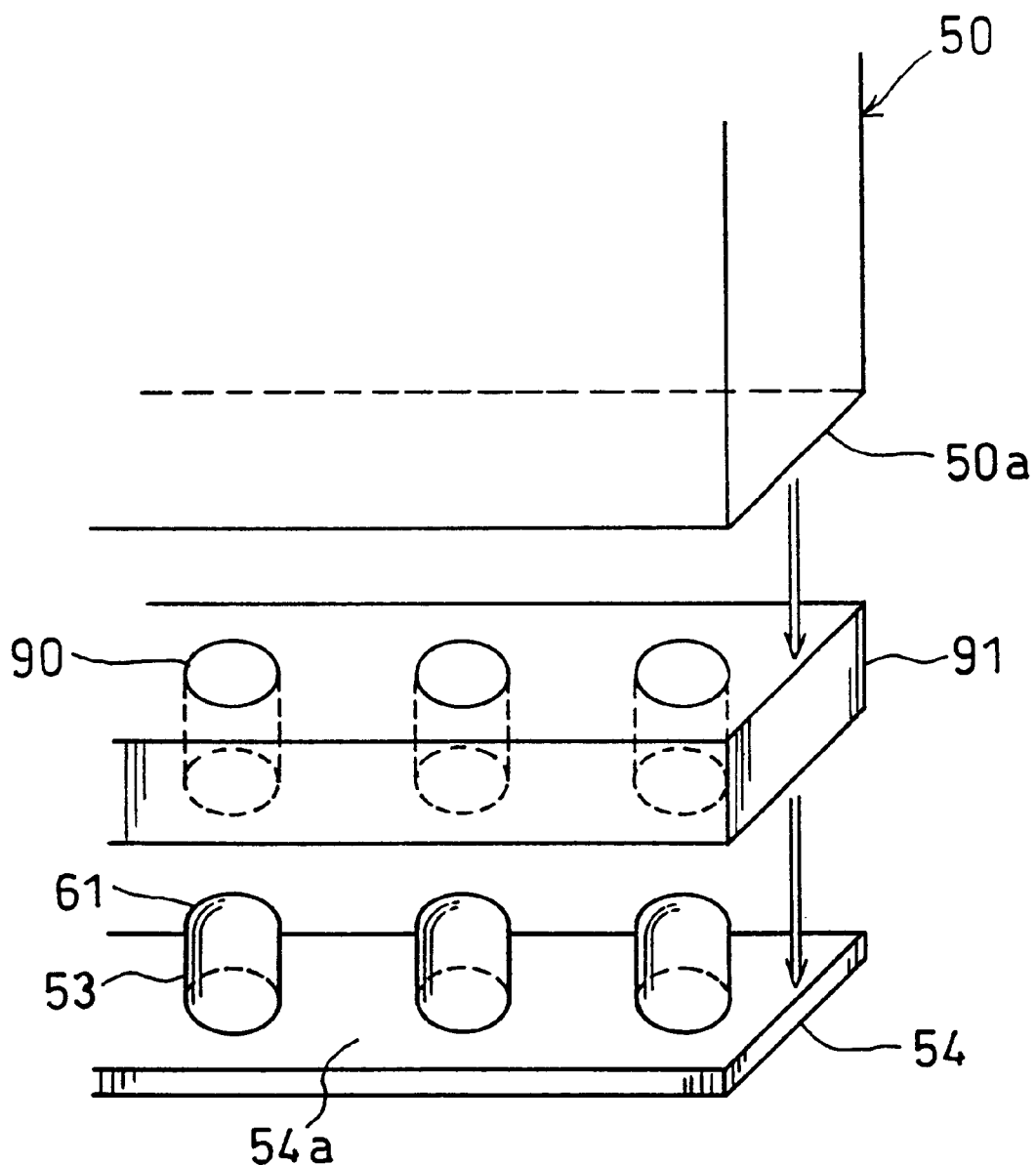
FIG. 15 is an exploded perspective view of a plane-shaped lighting device having lens-type LED lamps, wherein block-shaped members are installed.

In the above-mentioned embodiment, the incidence efficiency, that is, the efficiency of light utilization, is increased by reducing loss of light that occurs while light, emitted from the LED lamp, reaches the light-incident surface of the light-directing plate. In this embodiment, the efficiency of light utilization is increased by reducing loss of light that has been directed into the light-directing plate. In other words, light rays that have been made to be incident on the light-directing plate repeat reflections and diffusions inside the light-directing plate, and some light rays return to the light-incident surface. Here, a reflection section is provided so as to reflect the return light rays again into the light-directing plate. For example, as illustrated in FIGS. 14 and 15, with respect to the lens-type LED lamp 53, a block-shaped member 91, which has holes 90 through which LED lamps 53 are inserted, is interpolated between the light-directing plate 50 and the substrate 54 on which the LED lamps 53 are installed. The block-shaped member 91, which serves as the reflection section, is placed on the substrate 54, and its upper surface has a height that is determined according to the height of the LED lamps 53 so that it contacts the light-incident surface 50a of the light-directing plate 50. Further, in order to allow the return light rays to be reflected by the upper surface opposing the light-directing plate 50, the block-shaped member 91 is molded by a resin having a high-reflection efficiency, or a white highly reflective material is applied to, or put as a film on the surface of the block-shaped member 91. Thus, at least the surface opposing the light-incident surface 50a of the light-directing plate 50 has a high reflectivity.

Figure 16:
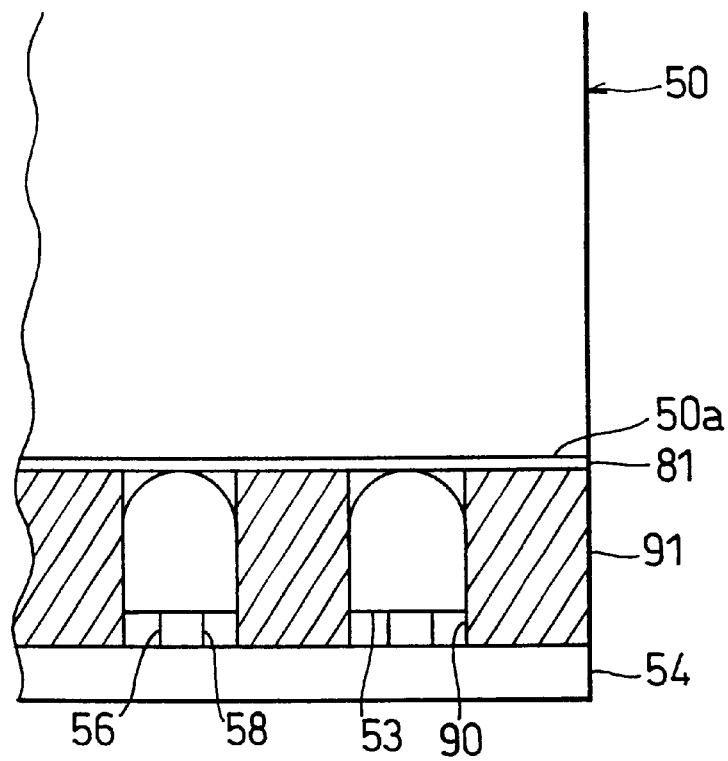
FIG. 16 is a front view of a plane-shaped lighting device having lens-type LED lamps, wherein block-shaped members and an anti-reflection layer are installed.

In this case also, the block-shaped member 91 does not completely adhere to the light-incident surface 50a of the light-directing plate 50 even if it is brought into contact with the light-incident surface 50a; therefore, the Fresnel's reflection occurs on the interface. For this reason, as illustrated in FIG. 16, the anti-reflection film 81 is formed on the light-incident surface 50a of the light-directing plate 50 with a film thickness of λ/4 by vapor-depositing on it a material such as $MgF_2$ having a refractive index of 1.2 to 1.4 by using an EB (Electron Beam) evaporation device. This arrangement makes it possible to reduce the Fresnel's reflection on the interface, to increase the reflectivity of the return light rays, and consequently to improve the efficiency of light utilization. Additionally, the anti-reflection film 81 may be formed only on the semispherical lens 61 of the LED lamp 53, or may be formed on both the LED lamp 53 and the light-directing plate 50.

Figure 17:
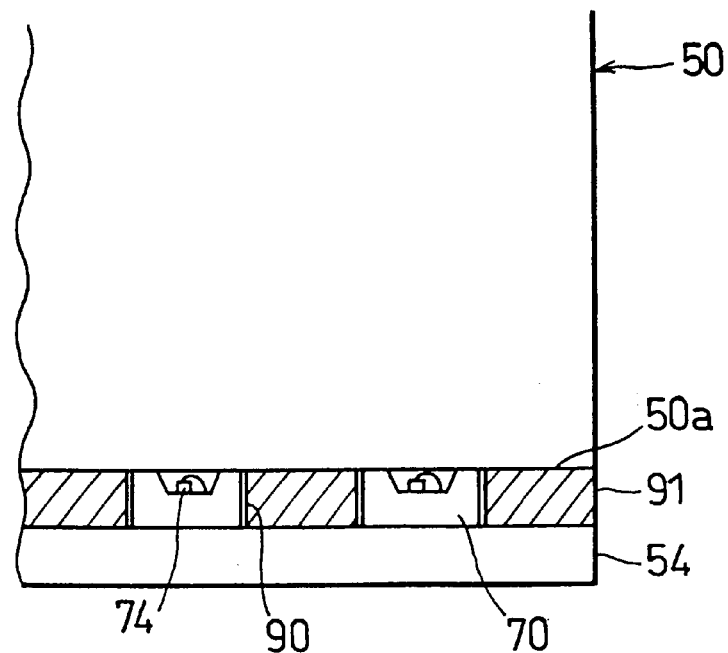
FIG. 17 is a front view of a plane-shaped lighting device having chip-type LED lamps, wherein block-shaped members are installed.
Figure 18:
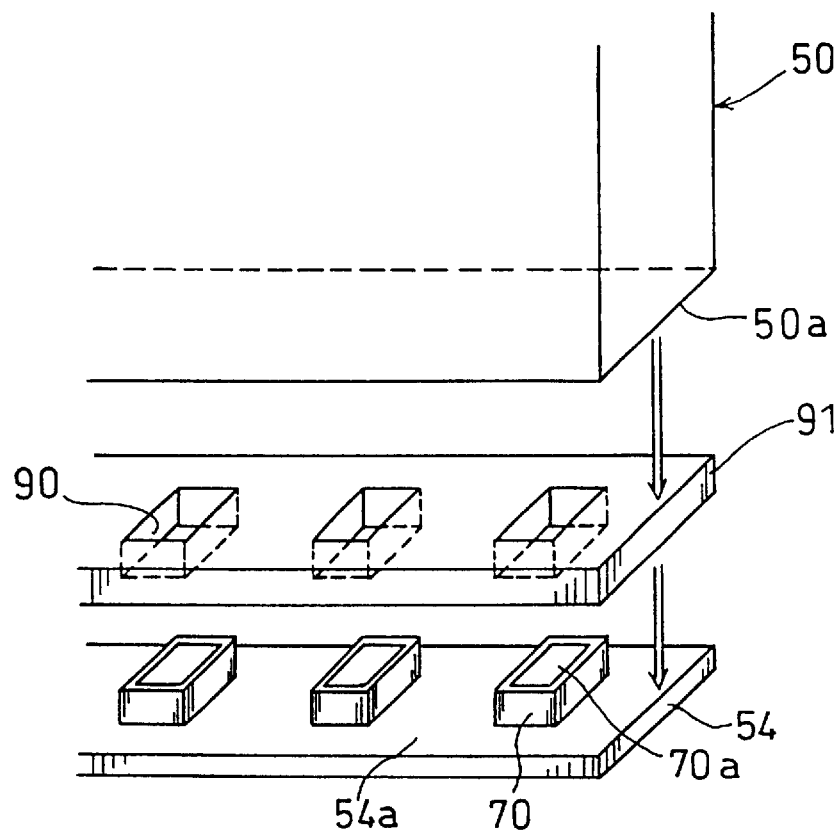
FIG. 18 is an exploded perspective view of a plane-shaped lighting device having chip-type LED lamps, wherein block-shaped members are installed.
Figure 19:
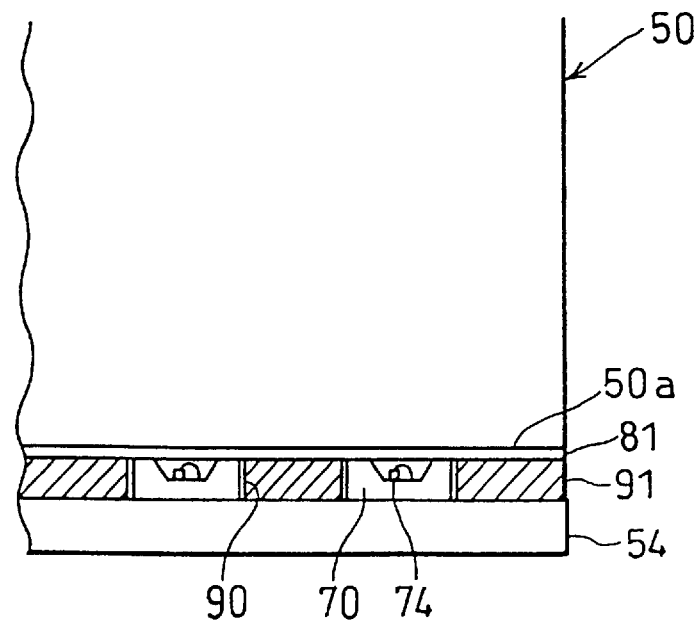
FIG. 19 is a front view of a plane-shaped lighting device having chip-type LED lamps, wherein block-shaped members and an anti-reflection layer are installed.

Moreover, in the case of the chip-type LED lamp 70, the block-shaped member 91 is preferably provided in the same manner as described above, as shown in FIGS. 17 and 18. Furthermore, as illustrated in FIG. 19, the anti-reflection film 81 is preferably formed on the light-incident surface 50a of the light-directing plate 50; this arrangement further improves the effects.

Thus, the return light rays from the light-directing plate 50 are reflected by the block-shaped member 91, again directed into the light-directing plate 50, and deflected toward the plane section 52 of the light-directing plate 50. Therefore, the return light rays, which are supposed to be released out of the light-incident surface 50*a* as loss of light, are again utilized, and the efficiency of light utilization is thus improved by eliminating the loss of the return light rays.

Figure 20A:
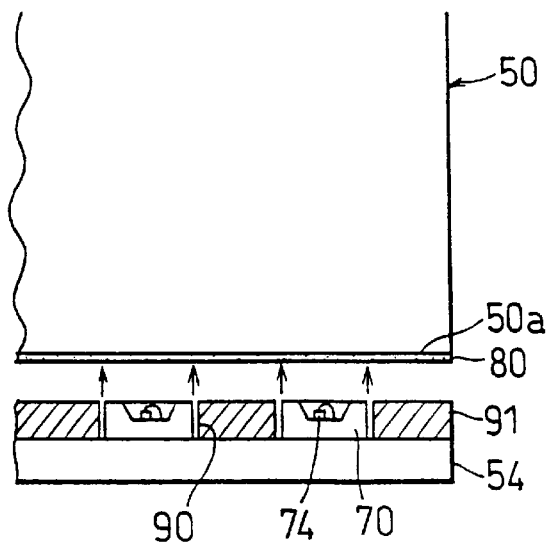
FIGS. 20(a), 20(b) and 20(c) respectively show plane-shaped lighting devices having chip-type LED lamps in their pre-contact states, wherein block-shaped members and flexible layers are installed.
Figure 20B:
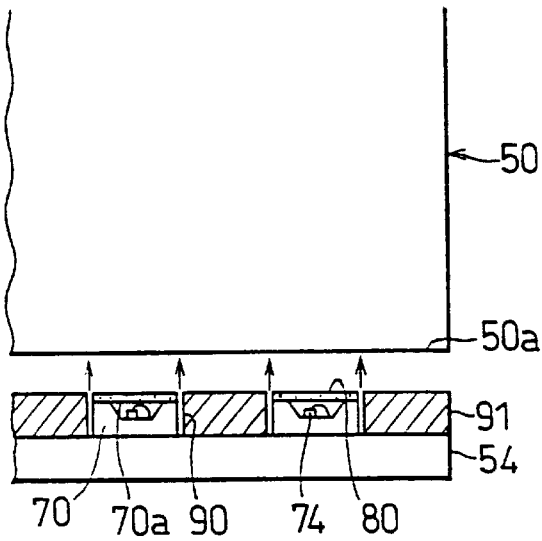
Figure 20C:
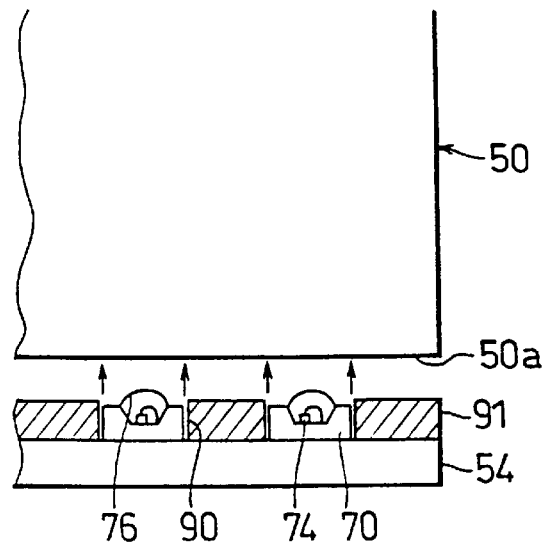

Further, as illustrated in FIG. 20(*a*), a transparent gel layer or flexible layer 80, made of a silicone resin or other material, is formed on the light-incident surface 50*a* of the light-directing plate 50, and the LED lamps 70 and the block-shaped member 91 are pressed on it so as to be held closely in contact therewith. This arrangement eliminates an air layer between the light-directing plate 50 and the LED lamps 70 as well as the block-shaped member 91, and also eliminates loss of light on the interface, thereby improving the incidence efficiency as well as the reflection efficiency in the return light rays. Moreover, as illustrated in FIG. 20(*b*), the transparent gel layer or flexible layer 80, made of a silicone resin or other material, is formed on the upper surface of each LED lamp 70, and the block-shaped member 91 and the LED lamps 70 are pressed onto the light-directing plate 50 so as to be held closely in contact therewith. Furthermore, as illustrated in FIG. 20(*c*), a silicone resin 76 or other material, which is put on the LED chip 74 so as to seal it, is mounded to a level higher than the upper surface of the package 71, and the LED lamp 70 is pressed onto the light-incident surface 50*a* of the light-directing plate 50 so that the LED lamp 70 and the light-directing plate 50 are held closely in contact with each other, with a transparent gel layer or flexible layer formed between them. At this time, since a gap corresponding to the thickness of the flexible layer is formed between the block-shaped member 91 and the light-directing plate 50, it is preferable to preliminarily make the height of the block-shaped member 91 greater than the height of the LED lamp 70 by a length corresponding to the thickness of the flexible layer.

Figure 21:
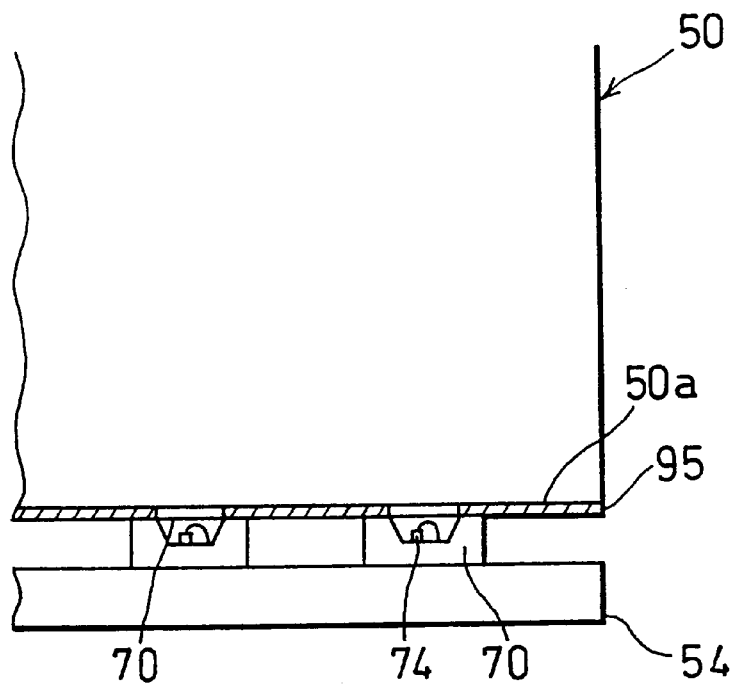
FIGS. 21(a) and 21(b) show a plane-shaped lighting device having chip-type LED lamps, wherein a highly-reflective layer is formed.
Figure 21:
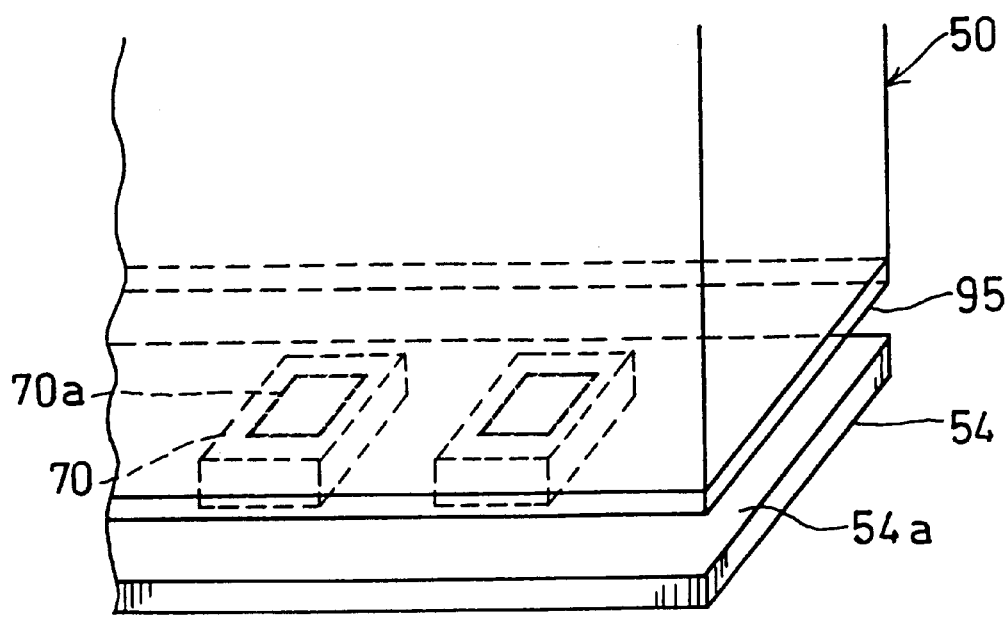

As illustrated in FIGS. 21(*a*) and 21(*b*), another example of the reflection section shows that, in the light-incident surface 50*a* of the light-directing plate 50, a high-reflection layer 95 is formed on areas except for the areas facing the light-releasing surface 70*a* of the LED lamp 70. Further, each area having no high-reflection layer 95 is set to be as wide as the light-releasing surface 70*a* of the LED lamp 70, or is set to be wider than the light-releasing surface 70*a*. The high-reflection layer 95 is formed by affixing a highly-reflective tape such as Al vapor deposition tape thereon, or by applying white or silver colored highly reflective ink thereon. Then, the LED lamps 70 are closely held in contact with the light-directing plate 50 whereon the high-reflection layer 95 has been formed.

With this arrangement, light is allowed to be incident on the light-incident surface 50*a* of the light-directing plate 50 through the areas that have no high-reflection layer 95 and that face the light-releasing surface 70*a* of the LED lamp 70. Then, the return light rays inside the light-directing plate 50 are reflected by the high-reflection layer 95, and deflected toward the plane section 52 of the light-directing plate 50. Therefore, it is possible to eliminate loss of return light, and consequently to improve the efficiency of light utilization. Moreover, since each area without high-reflection layer 95 on the light-incident surface 50*a* of the light-directing plate 50 is set to be as wide as the light-releasing surface 70*a* of the LED lamp 70, or is set to be wider than the light-releasing surface 70*a*, light rays released from the LED lamp 70 are directed to the light-directing plate 50 without being interfered with the high-reflection layer 95. Furthermore, since each of the areas is set to be wider by a degree of the installation tolerance of the LED lamp 50, it is possible to prevent the high-reflection area 95 from shielding one portion of the light-releasing surface 70*a* even in the event of dislocation of the LED lamp 70. Thus, all the light emitted from the LED lamp 70 is directed to the light-directing plate 50, and it becomes possible to obtain a high incidence efficiency without being influenced by dispersions in manufacturing processes.

Figure 22A:
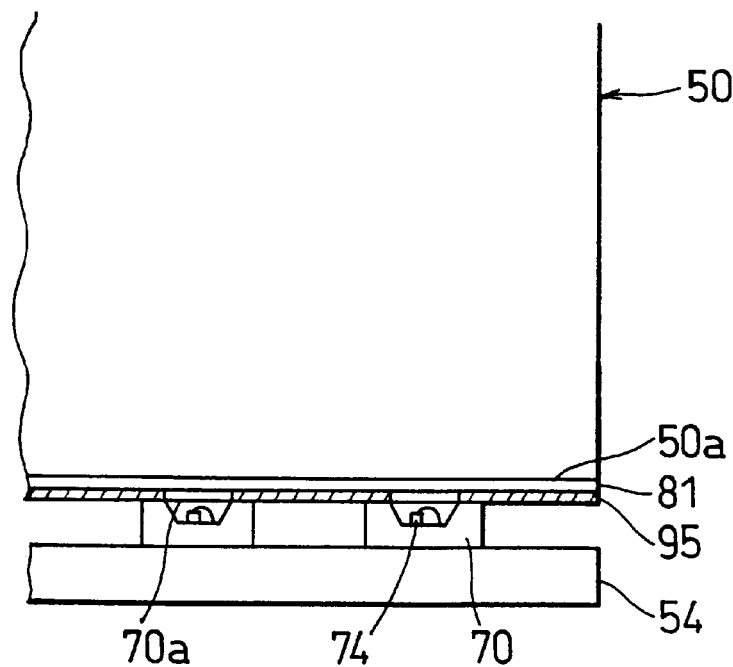
FIGS. 22(a) and 22(b) show plane-shaped lighting devices having chip-type LED lamps, wherein a highly-reflective layer and an anti-reflection layer are formed.
Figure 22B:
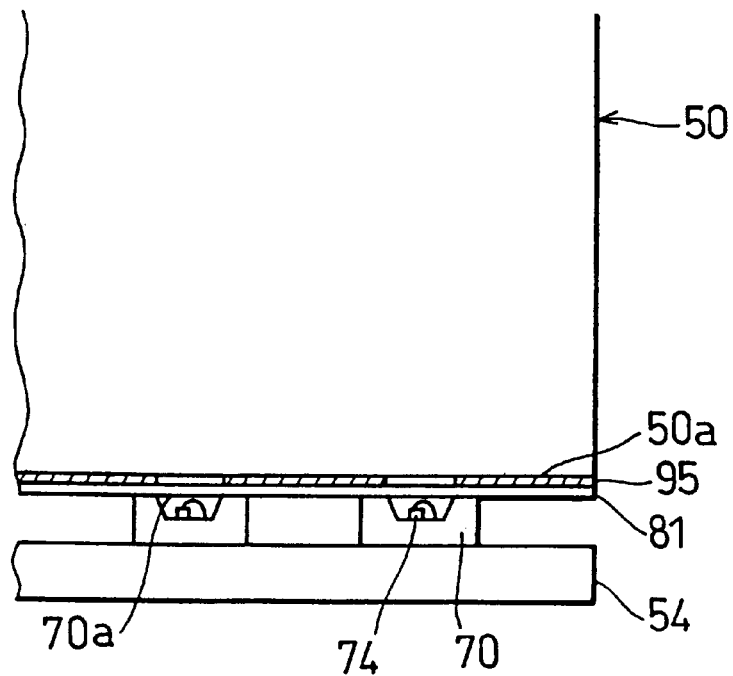
Figure 23:
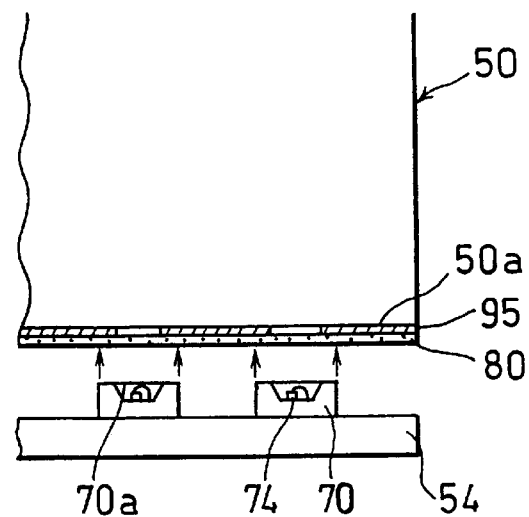
FIGS. 23(a), 23(b) and 23(c) show plane-shaped lighting devices having chip-type LED lamps, wherein a highly-reflective layer and a flexible layer are formed.
Figure 23:
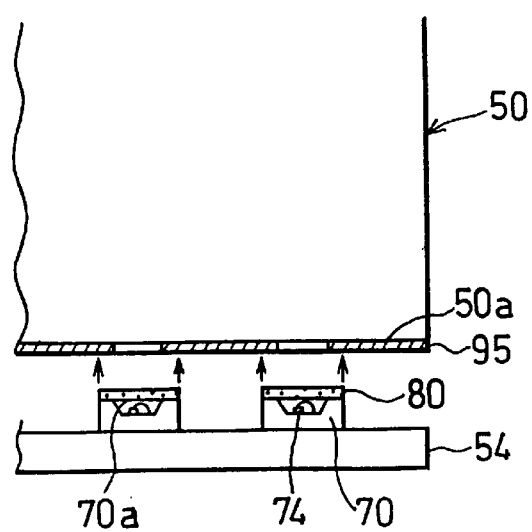
Figure 23:
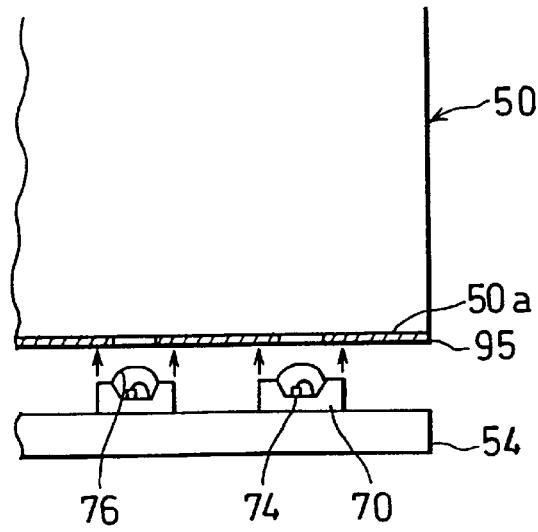

As illustrated in FIG. 22(*a*), in another example using the high-reflection layer 95, the anti-reflection film 81 is preliminarily formed on the light-incident surface 50*a* of the light-directing plate 50 by a vapor deposition using the EB evaporation device, and onto the anti-reflection film 81, the high-reflection layer 95 is superimposed so as to cover areas except for the areas facing the light-releasing surface 70*a* of the LED lamps 70. As illustrated in FIG. 22(*b*), in another example, the high-reflection layer 95 is preliminary formed on the light-incident surface 50*a* of the light-directing plate 50, and the anti-reflection film 81 is superimposed thereon. Further, as illustrated in FIG. 23(*a*), the high-reflection layer 95 is preliminarily formed on the light-incident surface 50*a* of the light-directing plate 50, and the transparent gel layer or flexible layer 80, such as a silicone resin, is superimposed thereon so as to eliminate an air layer. Alternatively, as illustrated in FIG. 23(*b*), the high-reflection layer 95 is preliminarily formed on the light-incident surface 50*a* of the light-directing plate 50, and the transparent gel layer or flexible layer 80, such as a silicone resin, is formed on upper surface of each LED lamp 70. Then, the LED lamps 70 are pressed onto the light-directing plate 50 so as to closely contact with each other without forming an air layer. Furthermore, as illustrated in FIG. 23(*c*), the high-reflection layer 95 is formed on the light-incident surface 50*a* of the light-directing plate 50, and a transparent resin 76, such as a silicone resin, is mounded on the upper surface of the LED lamp 70 so that it becomes higher than the upper surface of the package 71. Then, the LED lamps 70 are pressed onto the light-incident surface 50*a* of the light-directing plate 50 so that the LED lamp 70 and the light-directing plate 50 are held closely in contact with each other with a transparent gel layer or a flexible layer formed between them without an air layer. Therefore, it is possible to eliminate loss of return light, and also to eliminate loss of light on the interface. Thus, the efficiency of light utilization is further improved.

As described above, in the first and second embodiments, light rays, emitted from the LED lamp, are allowed to be incident on the light-incident surface of the light-directing plate without any loss. This makes it possible to improve the light-incidence efficiency and also to eliminate loss of light on the interfaces within the LED lamp and the light-directing plate as well as loss of return light inside the light-directing plate, thereby improving the efficiency of light utilization. Consequently, it becomes possible to reduce power consumption in the light source can be reduced, and also to provide plane-shaped lighting devices with high luminance. Moreover, the light-directing plate can be made as thin as possible, and it is possible to eliminate machining processes for forming on a light-directing plate holes or grooves through which a light source is inserted, which have been required in conventional arrangements. This makes it possible further reduce costs of materials as well as costs of production.

Next, explanations will be given to embodiments that relate to take-out processes of light in the plane-shaped lighting device of the present invention.

[Third Embodiment]

Figure 24:
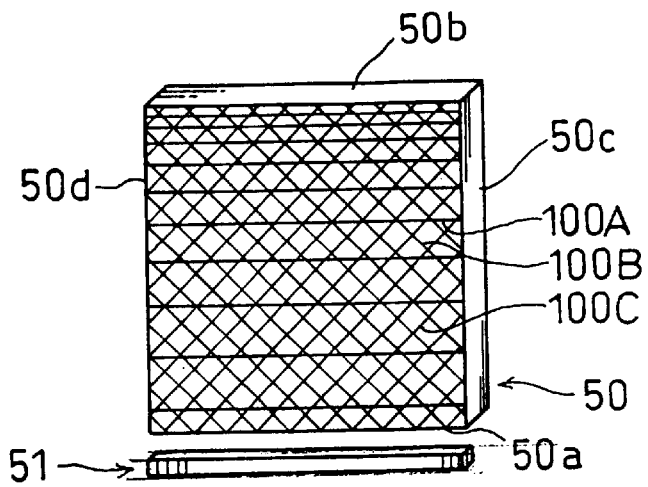
FIG. 24 is a perspective view of a plane-shaped lighting device wherein a line-patterned light-takeoff body is installed.

As illustrated in FIG. 24, a plane-shaped lighting device of the present embodiment is provided with a plate-shaped light-directing plate 50 made of a light-transmitting resin such as acryl and a light source 51 that is placed in the proximity of the end of the light-incident surface 50a on the lower side of the light-directing plate 50. The lens-type LED lamps or the chip-type LED lamps, which has been discussed in the aforementioned embodiments, or a rod-shaped light source such as a fluorescent lamp, are used as the light source 51. A plurality of light-takeoff bodies 100 are provided on the plane section 52 of the light-directing plate 50. The light-takeoff bodies 100 take out light rays, which have proceeded through the light-directing plate 50, from the plane section 52 by reflecting, refracting and diffusing them.

The light-directing plate 50 measures 5 mm in thickness and 500 mm×400 mm in lateral and longitudinal lengths. The surface 52a of the plane section 52 functions as a light-takeoff surface, and a reflection plate 101, made of a material such as Al and white ink by a method such as a vapor deposition method or a coating method, is placed face to face with the back surface 52b. Further, the entire surface of the light-directing plate 50 has been polished to form a smooth plane, and except for the light-incident surface 50a facing the light source 51, reflection layers (not shown) are formed on the other three side faces 50b, 50c and 50d by using, for example, Al vapor deposition tape or white ink, so as to prevent leak light.

Figure 25A:
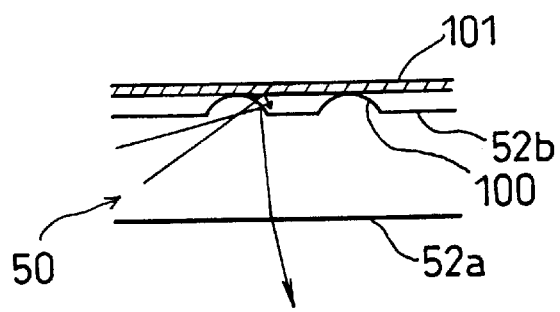
FIG. 25(a) is a cross-sectional view of a light-directing plate wherein the light-takeoff body having a protruding structure is formed and FIG. 25(b) is a cross-sectional view of a light-directing plate wherein the light-takeoff body having a grooved structure is formed.

As illustrated in FIG. 25(a), the light-takeoff bodies 100, which are formed on the back surface 52b of the plane section 52 of the light-directing plate 50, consist of a plurality of straight lines each of which has a cross-sectional shape of a semicircular protrusion, and which are arranged in parallel with each other. Moreover, the light-takeoff bodies 100 of three types are provided: those aligned in a direction parallel to the end of the light-incident surface 50a and those aligned in two directions that intersect said direction, that is, in a direction diagonally up to the right with 45 degrees and in a direction diagonally down to the right with 45 degrees. Here, light-takeoff bodies 100A, which are parallel to the end of the light-incident surface 50a, are arranged so that its density increases as the distance from the light source 51 increases, while light-takeoff bodies 100B and 100C that intersect the light-takeoff bodies 100A are arranged with an equal pitch. Additionally, with respect to the tilted light-takeoff bodies 100B and 100C, their angles may be desirably set, and two or more kinds of them may be provided.

Figure 25B:
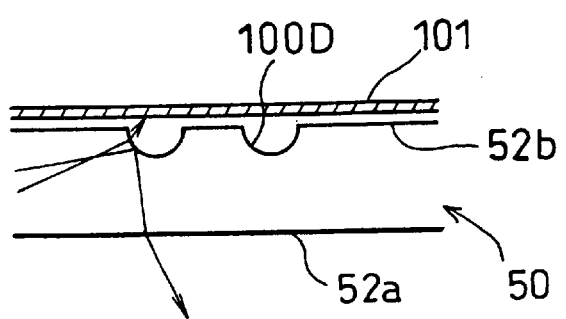

Moreover, as illustrated in FIG. 25(b), in another example, the light-takeoff bodies 100 may be provided as straight-line grooves 100D each of which has a cross-sectional shape of a semicircular recess, or provided as V-shaped grooves. Furthermore, these light-takeoff bodies 100 may be provided on the surface 52a of the plane section 52 of the light-directing plate 50. In either case, the surface of each light-takeoff body 100 is finished to have a smooth mirror surface so as to clearly reflect or transmit a virtual image of the light source 51. Here, the size of each light-takeoff body 100 is approximately 0.4 mm in width and approximately 0.2 mm in height or in depth, and the pitch of the light-takeoff bodies 100A that are arranged in parallel with the end of the light-incident surface 50a is set to become gradually narrower from 10 mm to 0.5 mm as the distance from the light source 51 increases. However, the size and pitch may be preferably set depending on the size of the light-directing plate 50.

The following methods are listed as forming methods of the light-takeoff bodies 100: a method such as a printing method wherein a transparent resin such as acryl and epoxy resin is formed into protruding shapes on the plane section 52 of the light-directing plate 50; a thermal copying-process method wherein a pattern of protrusions and recesses, which has been formed on the surface of a heater block such as stainless steel, is pressed onto the plane section 52 of the light-directing plate 50 after heating the heater block so that the pattern of the protrusions and recesses is copied onto the surface of the light-directing plate 50 by melting the surface by heat; a laser processing method wherein, by using a carbon dioxide laser processing device, a laser beam is projected and focused onto a forming position of the pattern of protrusions and recesses on the surface of the light-directing plate 50 so that the pattern of the protrusions and recesses is formed by melting and removing the surface of the light-directing plate 50; and other methods, such as an etching method and a cutting and polishing method.

With this arrangement, light rays emitted from the light source 51 are directed into the light-incident surface 50a of the light-directing plate 50, and transmitted through the light-directing plate 50 in a direction perpendicular to the light-incident surface 50a while repeating total reflections. Among the light rays that have been transmitted through the light-directing plate 50, those rays that have impinged onto the light-takeoff bodies 100 that are formed on the back surface 52b or the surface 52a of the plane section 52 of the light-directing plate 50 are reflected by them and taken out in a direction toward the surface 52a of the plane section 52 of the light-directing plate 50. Here, the light rays, which impinge onto the light-takeoff bodies 100, are reflected or refracted by the border face between their surface and the air, and taken out from the light-directing plate 50. In the case when the light-takeoff bodies 100 are located on the back surface 52b of the plane section 52, those light rays that have been taken out from the light-directing plate 50 are again returned to the light-directing plate 50 by the reflection plate 101 and directed toward the surface 52a of the plane section 52. Therefore, those light rays that have impinged onto the light-takeoff bodies 100 are taken out only in the direction toward the surface 52a. This reduce the quantity of stray light compared with conventional plane-shaped lighting devices using a scattering printed surface and a rough surface, thereby providing a better light-takeout efficiency. Moreover, since the surface of the light-takeoff body 100 is smooth, it becomes possible to reduce scattering and improve deflection efficiency of light toward the effective directions, thereby further improving the efficiency of utilization of light.

Figure 26:
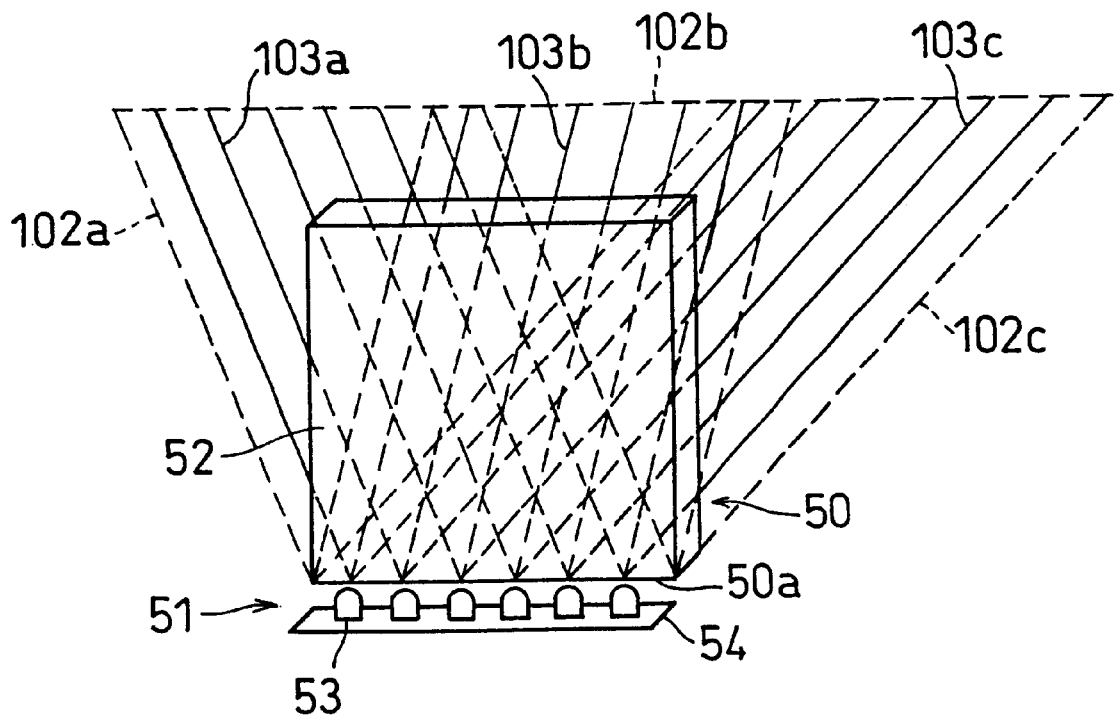
FIG. 26 is a drawing which shows how a virtual image is viewed.

Further, as illustrated in FIG. 26, a virtual image 103a, which is formed in a line-shape within a virtual-image region 102a of the corresponding light source 51 by the light-takeoff bodies 100A that are parallel to the light-incident surface 50a, is mixed with virtual images 103b and 103c that are formed in a line-shape within virtual-image regions 102b and 102c by the light-takeoff bodies of two types 100B and 100C that intersect the light-takeoff bodies 100A that are parallel to the light-incident surface 50a. Thus, since virtual images having a net pattern are formed on the plane section 52 of the light-directing plate 50, bright and dark distributions on the plane section 52 of the light-directing plate 50 become invisible. Further, the virtual image 103a, formed by the light-takeoff bodies 100A that are parallel to the light-incident surface 50a, is viewed in the frontal direction with respect to the plane section 52 of the light-directing plate 50, while the virtual images 103b and 103c, formed by the light-takeoff bodies of two types 100B and 100C that intersect the light-takeoff bodies 100A, are viewed when seen in diagonal directions. Thus, the virtual image is seen in the same fashion at whatever angles the surface is viewed, so that no change occurs in luminance within the plane section 52 of the light-directing plate 50 depending on viewing angles. This provides a better uniformity in luminance.

Although the luminance in the light-directing plate 50 decreases as the distance from the light source 51 increases, the light-takeoff bodies 100A, placed in parallel with the light-incident surface 50a, are arranged so that their density increases as the distance from the light source 51 increases. Therefore, the virtual image 103a derived from the light-takeoff bodies 100A is formed more densely as the distance from the light source 51 increases. This makes it possible to increase the luminance even in areas with low luminance and to properly carry out the luminance adjustment in the plane section 52.

Figure 27:
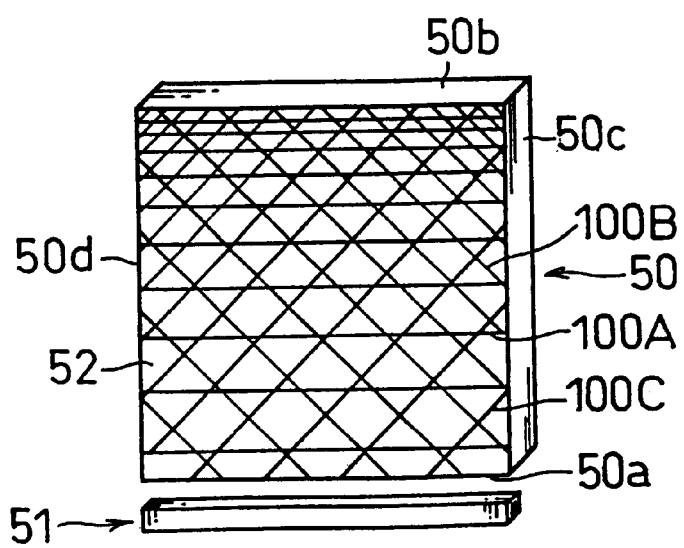
FIG. 27 is a perspective view of a plane-shaped lighting device of another embodiment, wherein a line-patterned light-takeoff body is installed.
Figure 28:
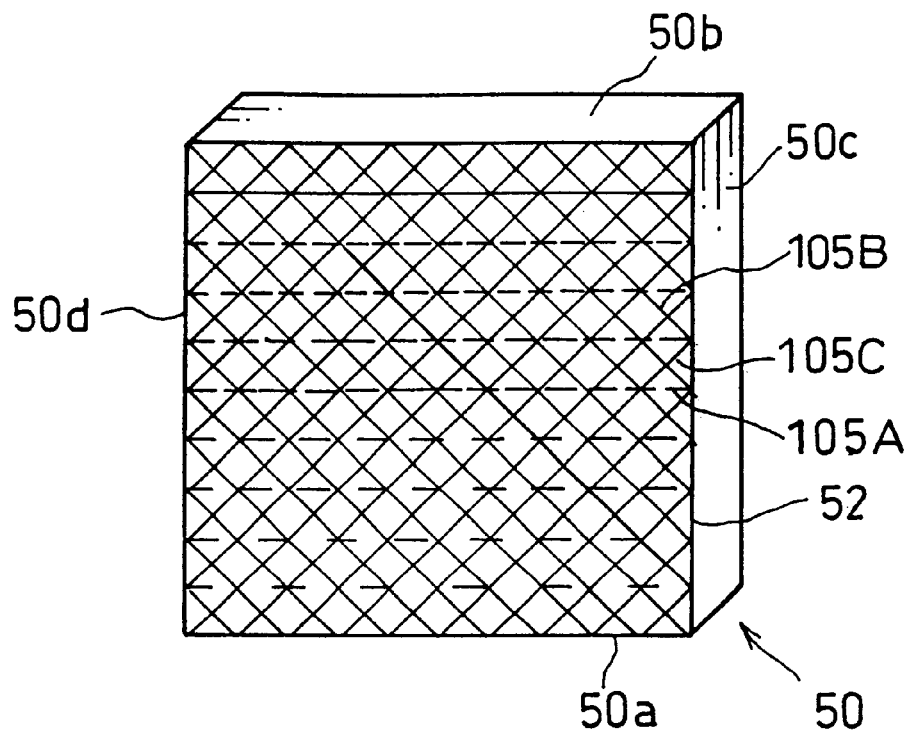
FIGS. 28(a) and 28(b) show perspective views of light-directing plates, each of which has a light-takeoff body whereon straight lines and broken lines are combined.
Figure 28:
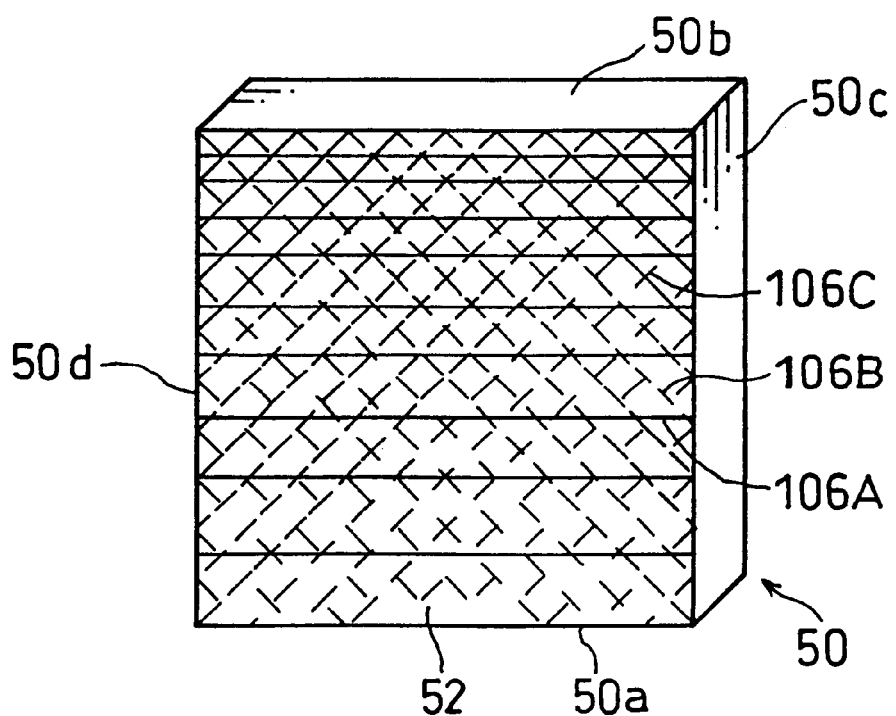

Further, as illustrated in FIG. 27, in another modified example, straight-line-shaped light-takeoff bodies 100A, which are arranged in parallel with the light-incident surface 50a, and straight-line-shaped light-takeoff bodies of two types 100B and 100C, which are arranged in directions intersecting the light-takeoff bodies 105, are provided, and the respective light-takeoff bodies 100A, 100B and 100C are set so that their densities increase as the distances from the light source 51 increase. Moreover, as illustrated in FIG. 28(a), dashed-line-shaped light-takeoff bodies 105A, which are arranged in parallel with the light-incident surface 50a, and straight-line-shaped light-takeoff bodies of two types 105B and 105C, which are arranged in directions intersecting the light-takeoff bodies 100A, are provided, and the dashed-line-shaped light-takeoff bodies 105A are aligned with equal pitches in the direction perpendicular to the light-incident surface 50a, while in the parallel direction, the interval of the dashed lines is set to become closer as the distance from the light source 51 increases. The straight-line-shaped light-takeoff bodies 105B and 105C are arranged with equal pitches. Furthermore, as illustrated in FIG. 28(b), straight-line-shaped light-takeoff bodies 106A, which are arranged in parallel with the light-incident surface 50a, and light-takeoff bodies of two types 106B and 106C, which are arranged in directions intersecting the light-takeoff bodies 106A, are provided, and the straight-line-shaped light-takeoff bodies 106A are set so that their density increases as the distance from the light source 51 increases, while the light-takeoff bodies 106B and 106C, which are aligned in tilted directions with equal pitches, have a dashed-line-shape with wider intervals of the dashed lines at positions closer to the light source 51 and the intervals of the dashed lines become narrower as the distance from the light source 51 increases, and end up with a straight-line shape.

Figure 29:
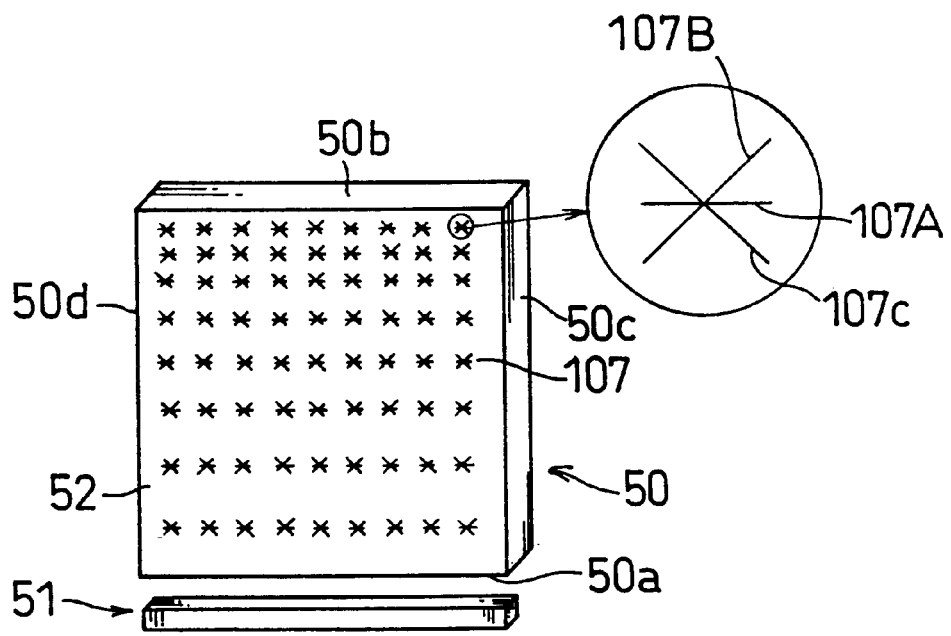
FIG. 29 is a perspective view of a plane-shaped lighting device wherein a light-takeoff body having a short-line pattern is installed.
Figure 30:
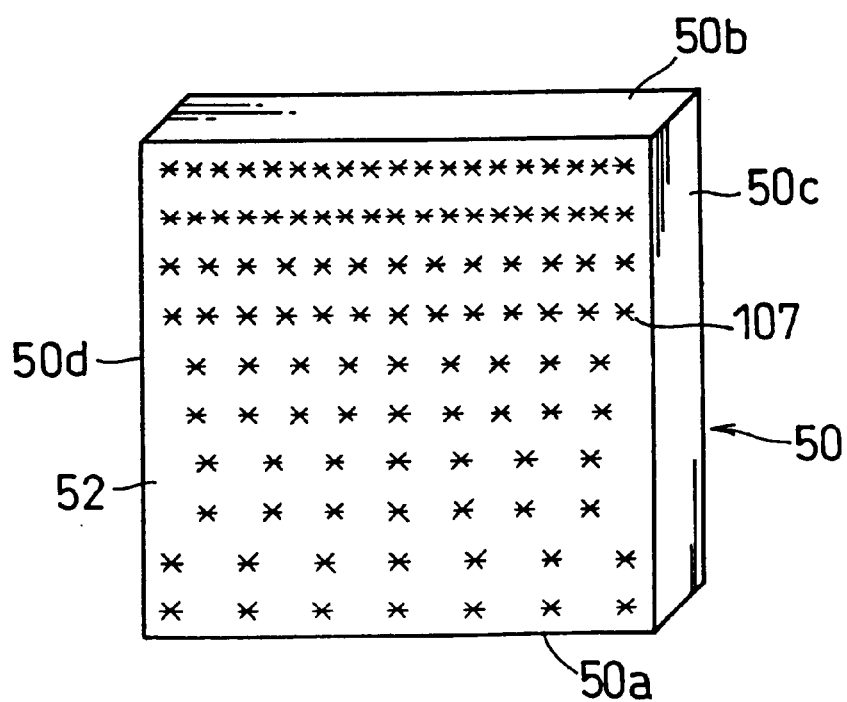
FIG. 30 is a perspective view of a light-directing plate wherein a light-takeoff body having a short-line pattern of another embodiment is installed.

In the above-mentioned examples, the light-takeoff bodies are basically straight-line shaped, with the difference being that the lines are continuous or discontinuous; however, in the following examples, each light-takeoff body 107 has a structure in which three short lines having a recessed shape or a protruding shape are designed to intersect at one point, as shown in FIG. 29. In other words, a short line 107A, which is parallel to the light-incident surface 50a, and two short lines 107B and 107C, which respectively intersect this line with angles of 45 degrees, are combined. These light-takeoff bodies 107 are aligned in a direction parallel to the light-incident surface 50a with equal pitches, while, in a perpendicular direction, they are aligned so as to be closely located as the distance from the light source 51 increases. Here, the cross-sectional shape of the short line is the same as the cross-sectional shape of the aforementioned light-takeoff body, and they are provided either on the surface 52a or on the back surface 52b of the plane section 52. Further, the number of the short lines may be set to two or not less than three. Moreover, as shown in FIG. 30, in another modified example, the light-takeoff bodies 107, each of which is made by combining the three short lines 107A, 107B and 107C, are aligned in a direction perpendicular to the light-incident surface 50a with equal pitches, while, in a parallel direction, they are aligned so as to be closely located as the distance from the light source 51 increases. These arrangements also achieve the same functions and effects as described earlier, and since the individual light-takeoff bodies 107 are arranged in a separate manner, it becomes possible to freely set the pattern layout, and consequently to adjust the luminance in the plane section 52 more precisely.

Figure 31:
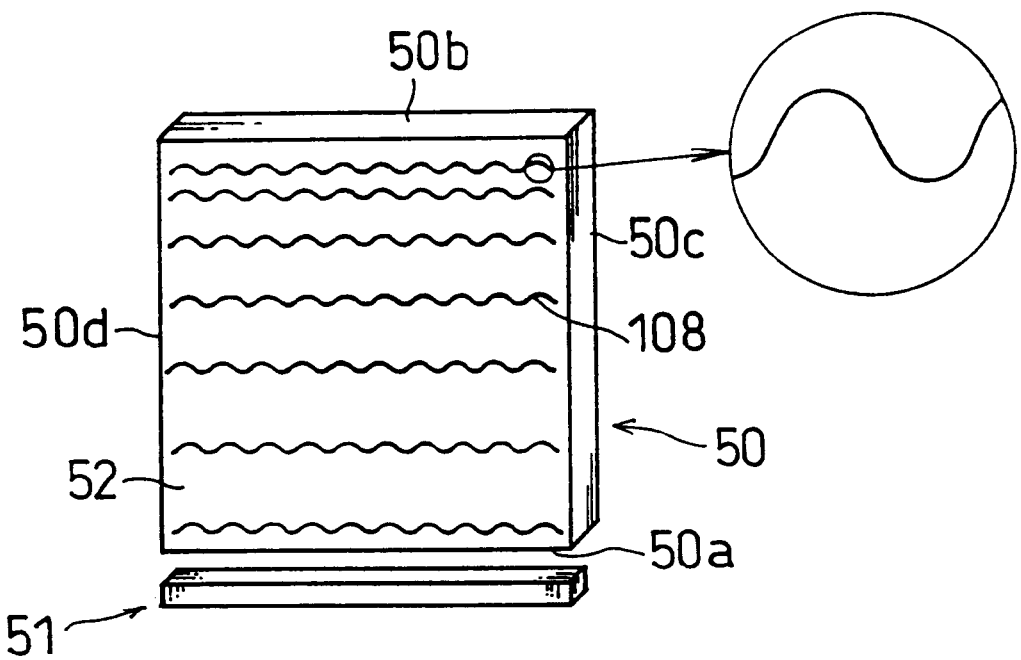
FIG. 31 is a perspective view of a plane-shaped lighting device wherein a light-takeoff body having a corrugated pattern is installed.

As illustrated in FIG. 31, in another modified example of the straight-line-shaped light-takeoff bodies, waveform light-takeoff bodies 108, each of which has a recessed shape or a protruding shape, may be provided. The direction of the waveform line is parallel to the light-incident surface 50a, and the density of the waveforms is set to become higher as the distance from the light source 51 increases. The cross-sectional shape and other factors are the same as the aforementioned light-takeoff bodies. This arrangement allows the virtual-image ranges of the light-takeoff bodies 108 to expand in a delta shape, and also allows the angle of the waveform line to change continuously. Consequently the virtual images have continuous delta shapes with each being mixed with another, thereby eliminating the bright-and-dark distributions on the plane section 52 of the light-directing plate 50 so that no change is caused in the uniformity in luminance due to different viewing angles. Here, in addition to the waveform lines, other curve lines, such as saw-tooth-wave lines and zigzag lines, may be adopted.

Figure 32:
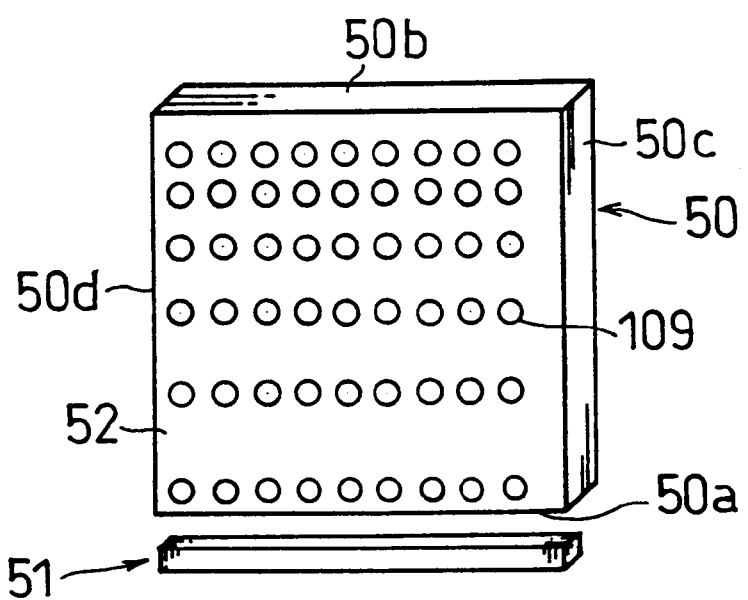
FIG. 32 is a perspective view of a plane-shaped lighting device wherein a light-takeoff body having a spherical surface pattern is installed.
Figure 33:
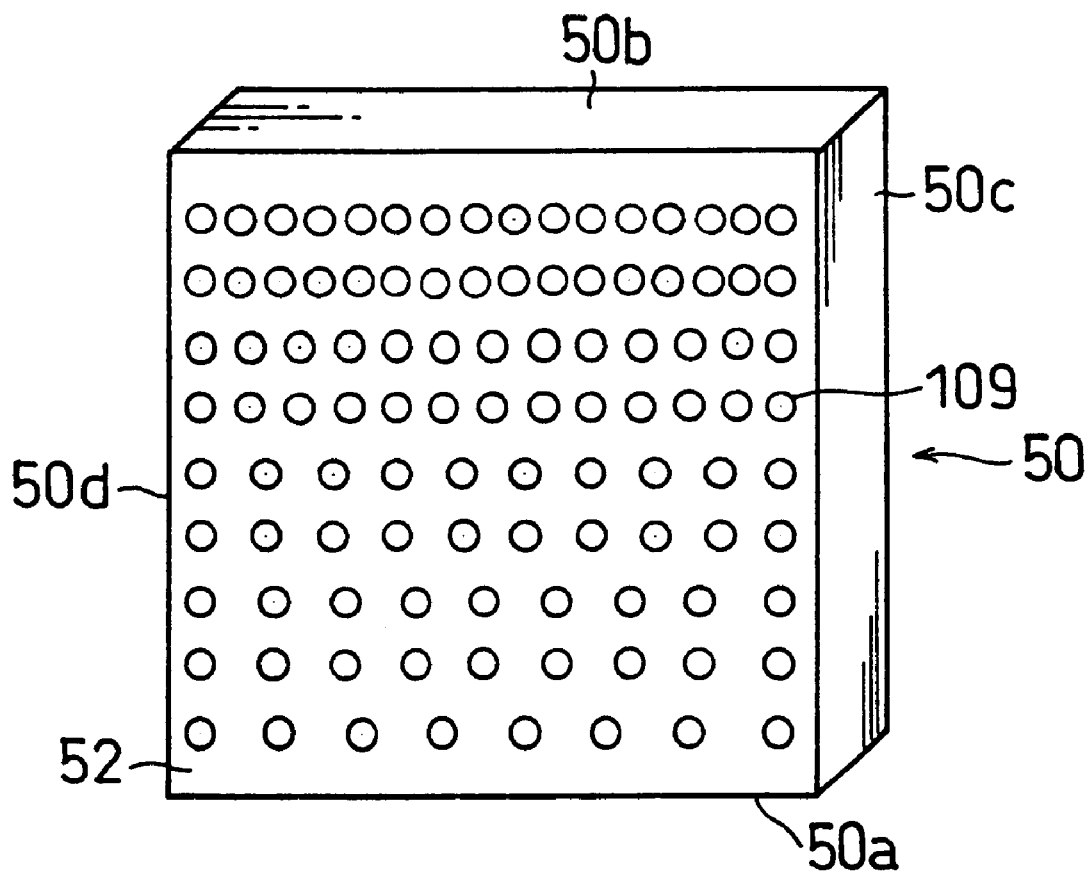
FIG. 33 is a perspective view of a plane-shaped lighting device wherein a light-takeoff body having a spherical surface pattern of another embodiment is installed.
Figure 34A:
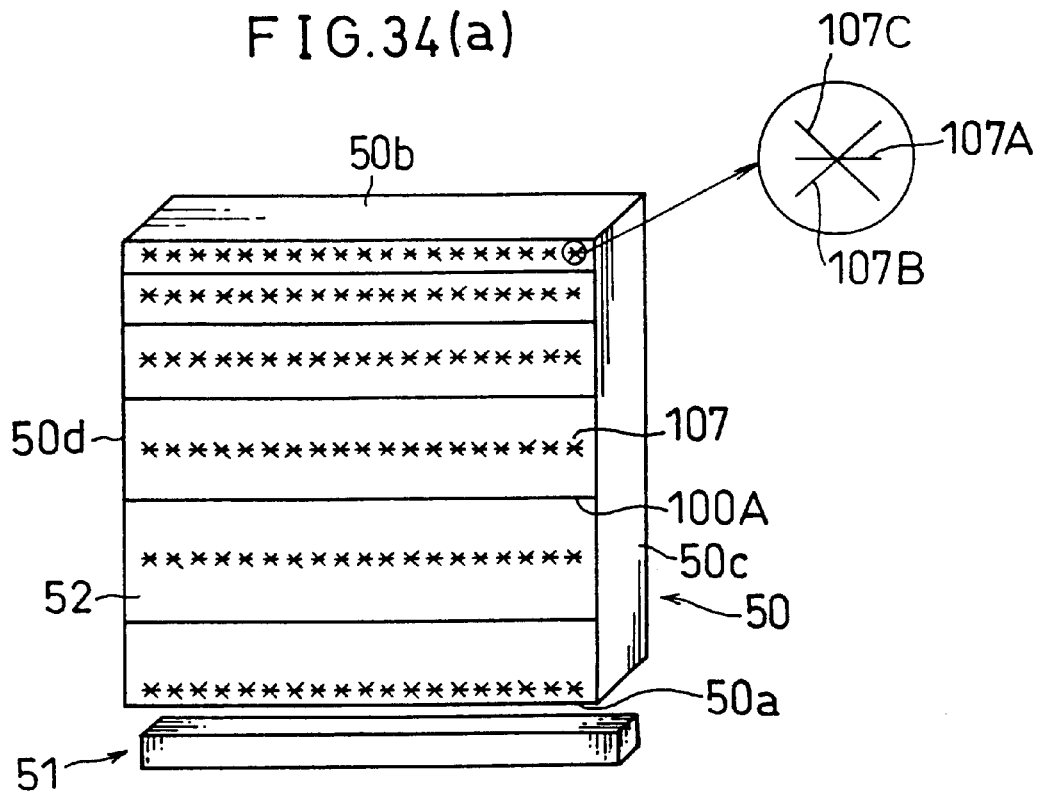
FIG. 34(a) is a perspective view of a plane-shaped lighting device having a light-takeoff body whereon a straight-line pattern and a short-line pattern are combined and FIG. 34(b) is a perspective view of a light-directing plate having a light-takeoff body whereon a straight-line pattern and a spherical surface pattern are combined.
Figure 34B:
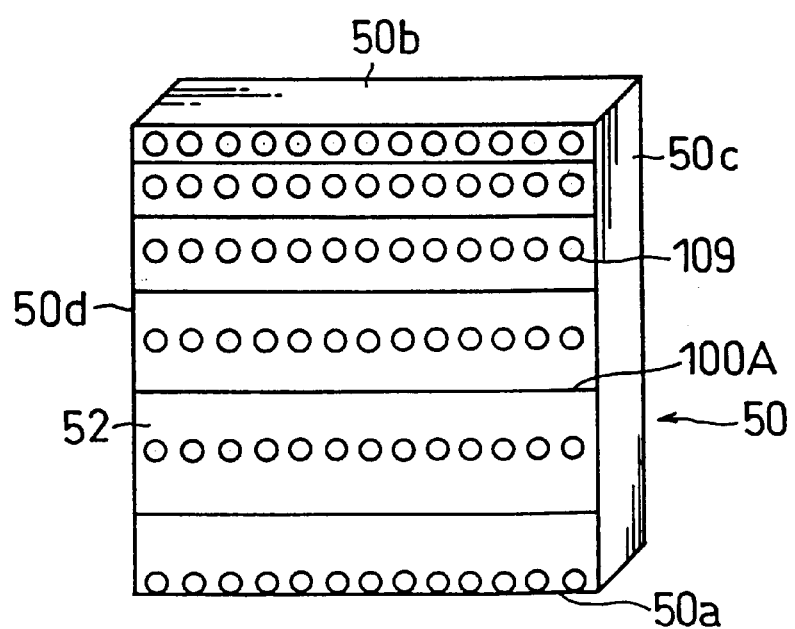

Moreover, as illustrated in FIG. 32, in another example, light-takeoff bodies 109, each of which has a recessed shape or a protruding shape and also is constituted of a part of a spherical surface, are aligned with equal pitches in a direction parallel to the light-incident surface 50a, while, in a perpendicular direction, they are aligned so as to be closely located as the distance from the light source 51 increases. This arrangement also allows the angle of the surface to change continuously in the same manner as the waveform lines so that the virtual images have continuous delta shapes, thereby improving the uniformity in luminance. Furthermore, as illustrated in FIG. 33, they may be aligned with equal pitches in a direction perpendicular to the light-incident surface 50a, while, in a parallel direction, they are aligned so that the adjacent spherical shapes are closely located as the distance from the light source 51 increases. Additionally, those light-takeoff bodies having shapes, such as straight-lines, dashed lines, waveform lines, short lines and spherical surfaces, may be preferably combined with one another. For example, as illustrated in FIG. 34(a), the light-takeoff bodies 107, each of which is constituted of three short lines 107A, 107B, and 107C, and the straight-line-shape light-takeoff bodies 100A are combined together, and one row of the short-line-shaped light-takeoff body 107 and one row of the straight-line-shape light-takeoff body 100A are alternately arranged so that they are located more closely as the distance from the light source 51 increases. Further, as illustrated in FIG. 34(b), the light-takeoff bodies 109, each of which has a part of a spherical surface, and the straight-line-shape light-takeoff bodies 100A are combined together, and one row of the spherical-surface-shaped light-takeoff body 109 and one row of the straight-line-shape light-takeoff body 100A are alternately arranged so that they are located more closely as the distance from the light source 51 increases. As described above, the combinations of the shapes of the light-takeoff bodies may be freely made.

As described above, light rays, which have been transmitted through the light-directing plate while repeating total reflections, are deflected so as to be released outside thereof by utilizing the reflecting effect or refracting effect derived from the smooth-surface light-takeoff bodies, each of which has a recessed shape or protruding shape. This arrangement reduces the quantity of stray light compared with conventional plane-shaped lighting devices which use a scattering printed surface and a rough surface so as to take out light rays by using the scattering effect, and, in contrast, increases the quantity of light rays taken out from the plane section of the light-directing plate, thereby providing a better light-takeout efficiency. Moreover, since the various light-takeoff bodies are provided on the plane section of the light-directing plate as described above, virtual images derived from the light-takeoff bodies are mixed with one another so that the bright-and-dark distributions are made uniform on the plane section. Consequently, it is possible to eliminate differences in virtual images viewed even if they are viewed in different directions with respect to the light-directing plate as well as eliminating changes in luminance due to different viewing angles, and consequently to obtain the uniformity in luminance. Therefore, it becomes possible to provide plane-shaped lighting devices which achieve high luminance by increasing the efficiency of light utilization and which are free from changes in luminance distribution even when viewed at different angles.

[Fourth Embodiment]

Figure 35:
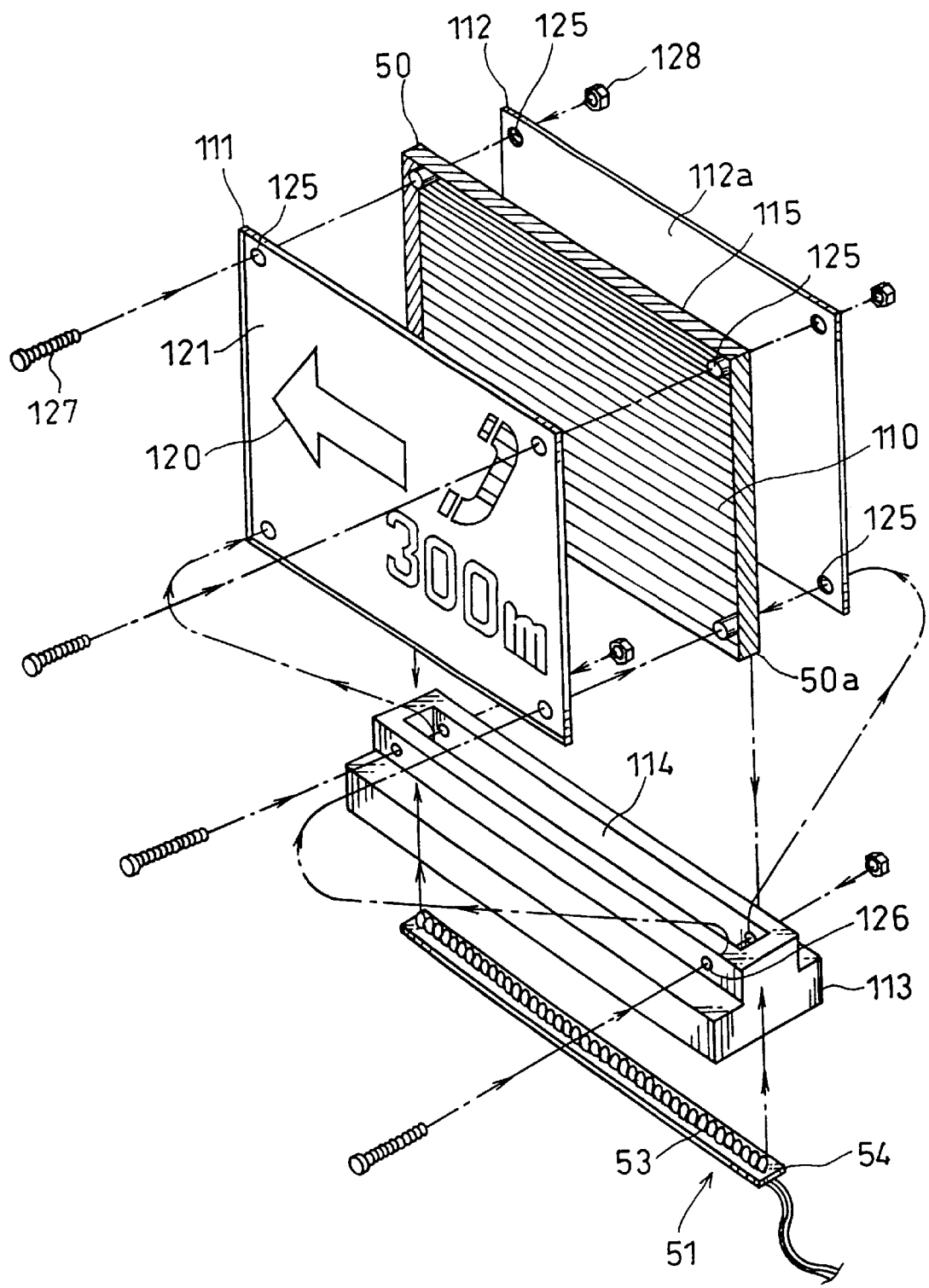
FIG. 35 is an exploded perspective view of a display device of one embodiment of the present invention.
Figure 36:
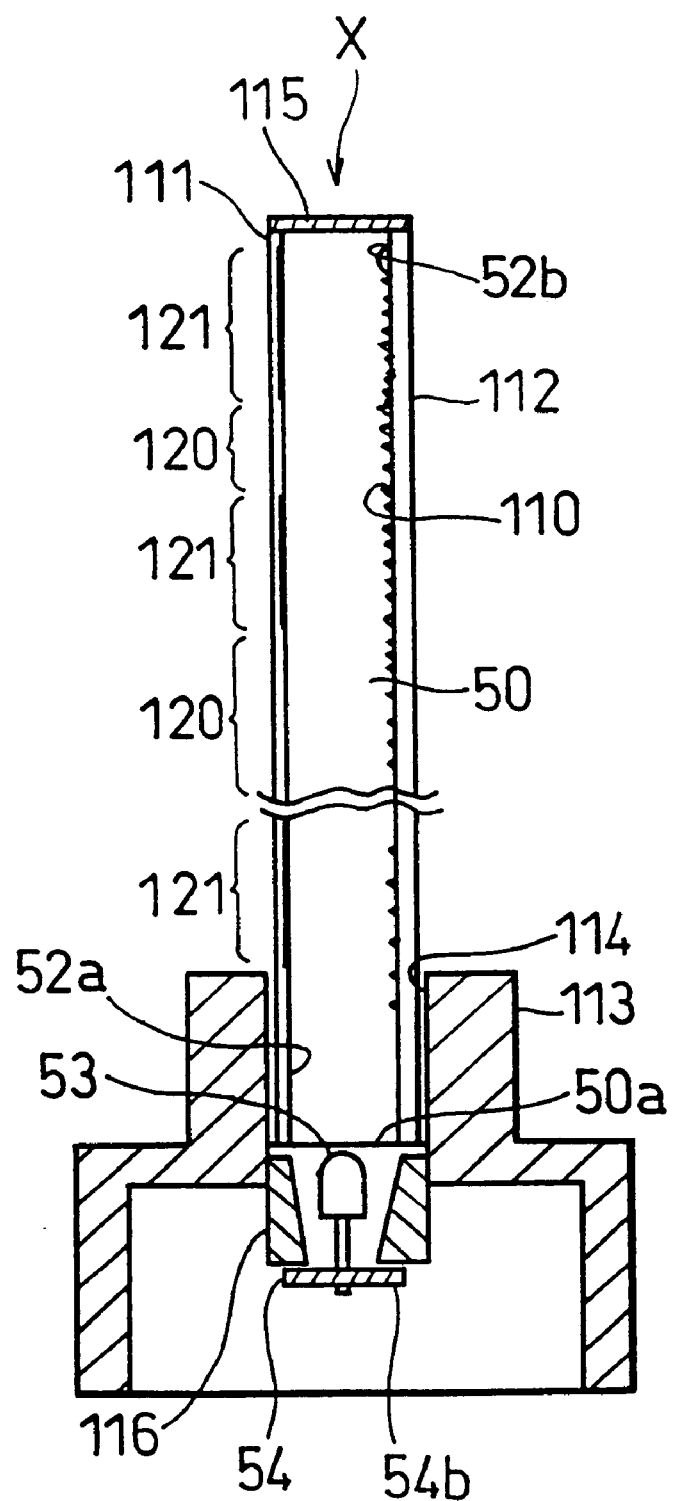
FIG. 36 is a cross-sectional view of the display device.

The following description will discuss a display device wherein the plane-shaped lighting device of the above-mentioned embodiments is used. FIGS. 35 and 36 show one embodiment of the display device, which has a plane-shaped lighting device X that is provided with a light source 51 and a light-directing plate 50 having light-takeoff bodies 110 formed on its plane section 52, a patterned display board 111 that is placed in closely contact with the surface side of the plane section 52 of the light-directing plate 50, and a reflection plate 112 that is placed in closely contact with the rear-surface side of the plane section 52. Further, a holder 113, which holds and supports these components, is provided, and the holder 113 has a long, upside-down-T-shaped structure with a cavity inside thereof and a long groove 114 is formed in the upper portion thereof.

Figure 37:
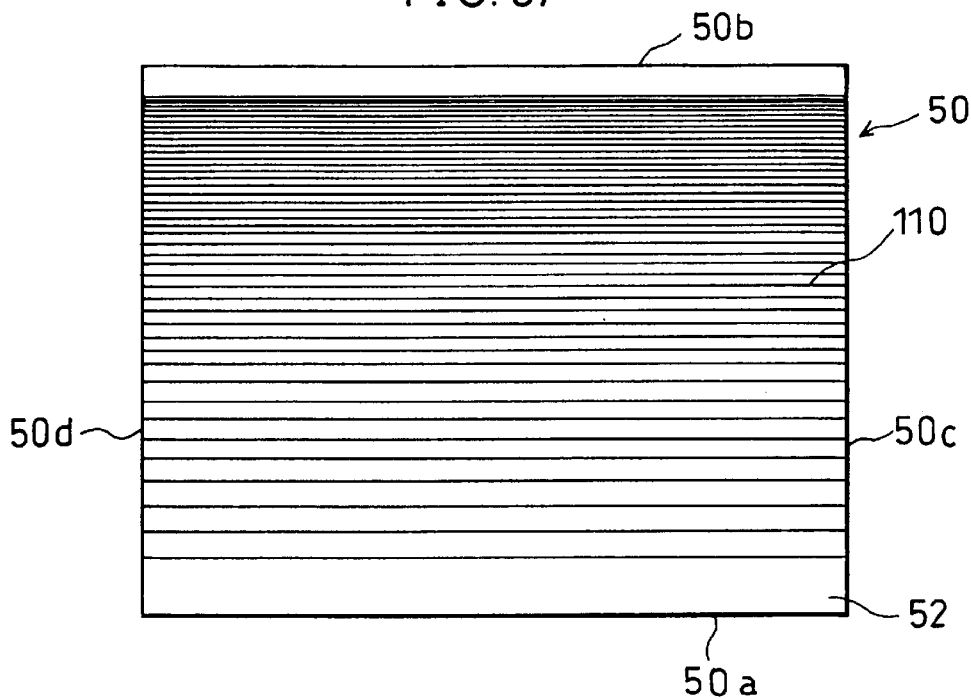
FIG. 37 is a front view of a light-directing plate that is installed in the display device.
Figure 38:
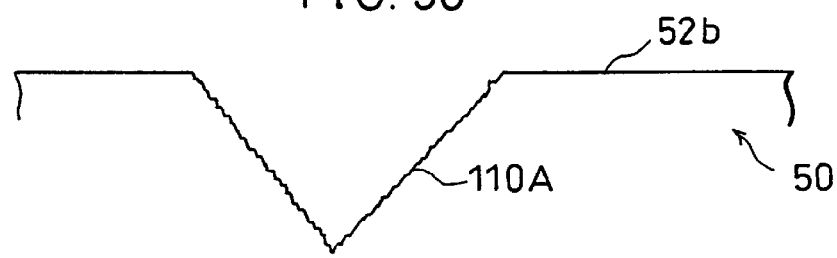
FIG. 38 is a drawing that shows a cross-sectional shape of a light-takeoff body.

In the plane-shaped lighting device X, a light source 51, which has lens-type LED lamps 53 that are arranged in an array, is placed in the proximity of a lower end of the light-directing plate 50 that forms a light-incident surface 50a. The light-directing plate 50, which is made of a colorless, transparent, acryl plate with a thickness of 3 mm to 9 mm, has light-takeoff bodies 110 formed on its back surface 52b. Here, in the present embodiment, the size of the light-directing plate 50 is 5 mm in thickness, and 500 mm×400 mm in lateral and longitudinal lengths. As illustrated in FIGS. 37 and 38, the light-takeoff bodies 110, which have V-shaped grooves 110A aligned in straight lines in a direction parallel to the light-incident surface 50a, are designed so that they are located more closely as the distance from the light source 51 increases. Each groove 110A, which is colorless and transparent with no absorption of light, has a width of approximately 0.4 mm and a depth of approximately 0.2 mm, and its surface is provided as a rough surface that causes scattering of light. Moreover, the surface 52a and the back surface 52b except for the portions having the light-takeoff bodies 110 of the light-directing plate 50 are provided as very smooth surfaces so that light images are clearly transmitted in its thickness direction. Furthermore, the light-incident surface 50a with which the light source 51 is placed face to face is also machined and polished into a very smooth surface so as to transmit light images clearly.

Reflective tapes 115, which have surfaces on which A1 reflective films with high reflectivity (not less than approximately 80% with respect to light rays within a visible range) are vapor-deposited, are affixed to right and left side surfaces 50c and 50d and a top surface 50b, except for the light-incident surface 50a, which are virtually polished into smooth surfaces.

Figure 39A:
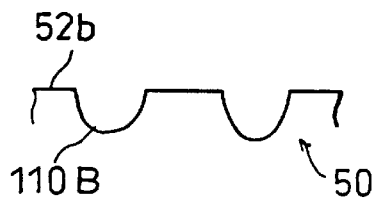
FIGS. 39(a), 39(b), 39(c) and 39(d) are drawings that show cross-sectional shapes of light-takeoff bodies of other embodiments.
Figure 39B:
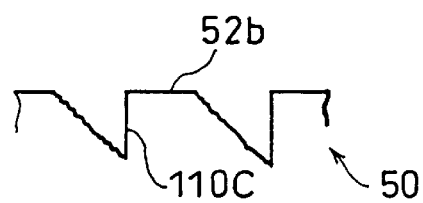
Figure 39C:
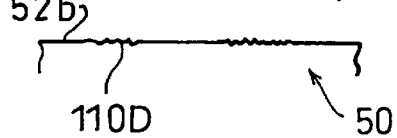
Figure 39D:
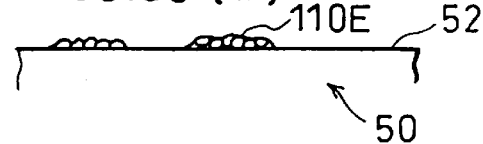

Here, as illustrated in FIGS. 39(a) through 39(d), instead of the V-shaped groove 110A in its cross-section, the light-takeoff body 110 may be formed into other shapes, such as U-shaped grooves 110B (FIG. 39(a)) and saw-tooth-shaped grooves 110C (FIG. 39(b)). Further, as illustrated in FIGS. 39(c) and 39(d), instead of these structures, the light-takeoff body 110 may be provided as other structures, such as a scattering surface 110D (FIG. 39(c)) that is formed by partially roughen the surface of the light-directing plate 50 by a thermal-copying process, a chemical etching method, a blasting method or other methods, and a structure wherein a scattering material 110E, such as microglass beads, is applied to the surface of the light-directing plate 50 with a transparent resin (FIG. 39(d)). Moreover, with respect to means for making uniform the luminance on the light-directing plate 50 when it is displayed with the light source turned on, any structure may be adopted as long as the possibility at which light rays, which have been transmitted through the light-directing plate 50, are scattered increases as the distance from the light source 51 increases. For example, as illustrated in FIGS. 40(a), 40(b) and 40(c), portions having grooves with constant pitches or surface-scattering regions are formed on the surface of the light-directing plate 50 in a dispersed manner with various shapes, such as circles 110F (FIG. 40(a)), rectangles 110G (FIG. 40(b)) and straight lines 110H (FIG. 40(c)), and the size of the scattering regions is increased as the distance from the light source 51 increases.

Here, in the case of the plane-shaped lighting device X used for display devices, the entire surface of the plane section 52 of the light-directing plate 50 is not necessarily exposed with the patterned display board 111 closely in contact with the plane section 52; therefore, even the above-mentioned structures of the light-takeoff body 110 are applicable without any problems, since they can reduce the light absorption to a great degree by deflecting light rays using reflection and refraction of light and thereby provide sufficient uniformity in luminance that is required. However, the structure of the light-takeoff body, such as described in the third embodiment, is also applicable. This arrangement makes the luminance distribution in the light-directing plate 50 more uniform, and provides high luminance and a better light-takeoff efficiency.

Figure 42:
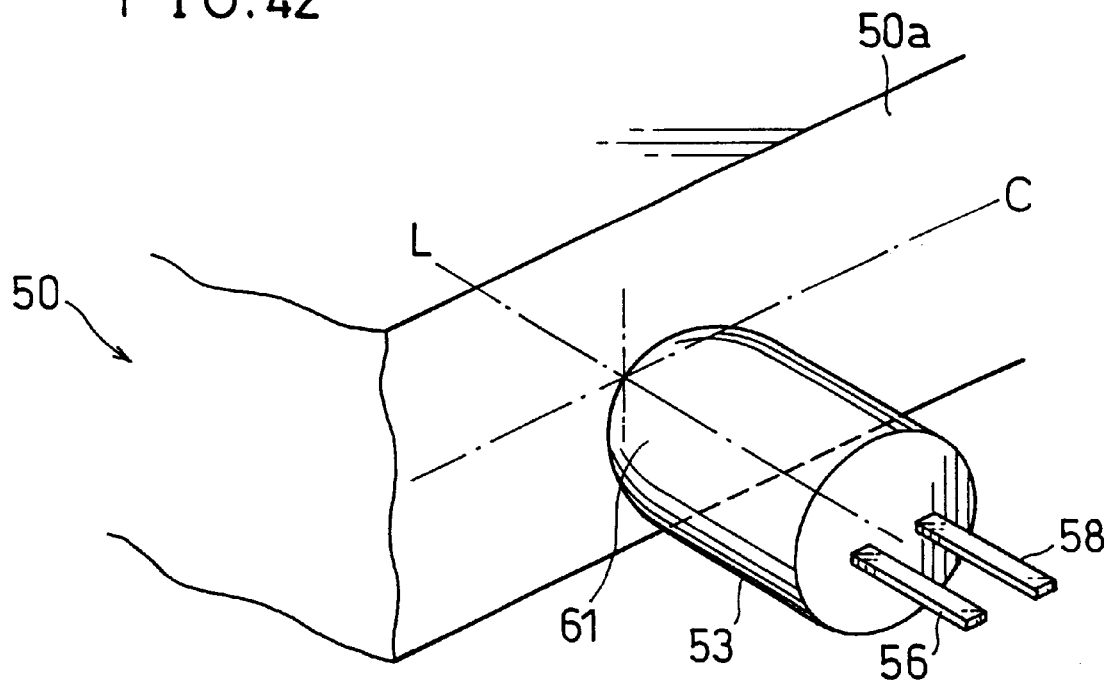
FIG. 42 is a drawing which shows the layout of the lens-type LED lamps.

As illustrated in FIGS. 41 and 42, the lens-type LED lamp 53, which serves as the light source 51, is formed by molding an LED chip 57 with transparent resin 60 while forming a semispherical lens 61 at the same time. The lens-type LED lamp 53 emits yellow-green light (emission wavelength: 565 nm), and its diameter is 3 mm. Here, 128 of these LED lamps 53 are fixed on one sheet of a printed wiring substrate 54 made of glass epoxy, with constant pitches so that the top of each LED lamp 53 is in contact with the center line C in the width direction of the light-incident surface 50a of the light-directing plate 50 and so that the light axis L of the LED lamp 53 is set to be virtually perpendicular to the light-incident surface 50a of the light-directing plate 50. In the substrate 54, a circuit pattern is printed on the back surface 54b thereof, and lead frames 56 and 58 of the LED lamps 53 are inserted through through-holes 62 from the surface 54a on which the LED lamps 53 are to be assembled, and securely soldered. Chip-type load resistance elements are packaged on the circuit pattern of the back surface 54b. Moreover, a white coating, which has a reflectivity of approximately 70% with respect to light rays of all colors within the visible range, is printed onto the surface 54a of the substrate 54.

Further, a pair of light-source reflection plates 116, which have reflective tapes affixed to the surfaces thereof, are placed on both sides of the LED lamps 53 along the direction of the array. The reflective tapes are the same as the reflective tapes 115 that are affixed to the side surfaces of the light-directing plate 50. The reflection surfaces of the light-source reflection plates 116 are arranged to face the LED lamps 53 side, and tilted in a widening manner from the substrate 54 toward the light-directing plate 50 between the light-directing plate 50 and the substrate 54.

In the aforementioned reflection plate 112, its surface facing the light-directing plate 50 is provided as, for example, a white-colored scattering reflective surface 112a that has a high reflectivity of at least not less than 60%, more preferably, approximately 70%, with respect to any wavelength (color) of visible light rays.

Figure 43:
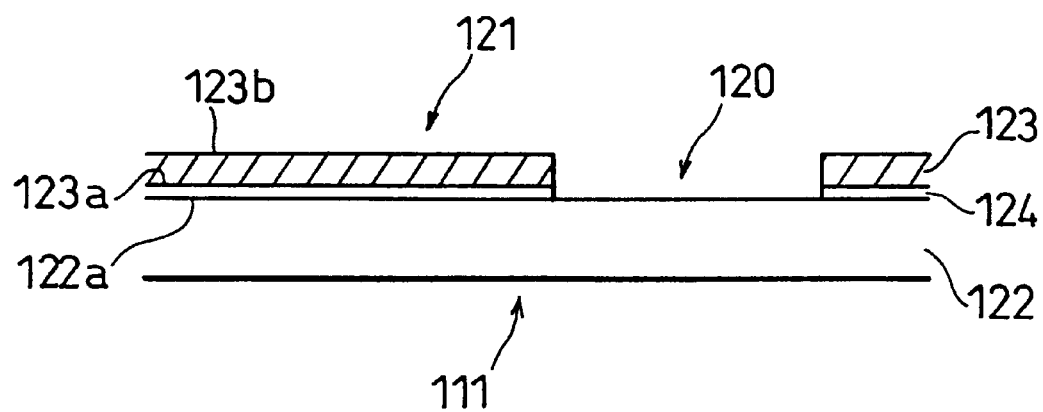
FIG. 43 is a cross-sectional view of a patterned display board.
Figure 44A:
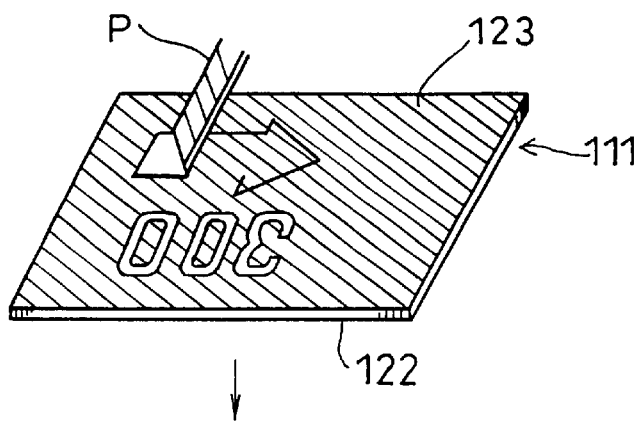
FIGS. 44(a), 44(b), 44(c) and 44(d) are explanatory drawings that show how a pattern is formed on the patterned display board.
Figure 44B:
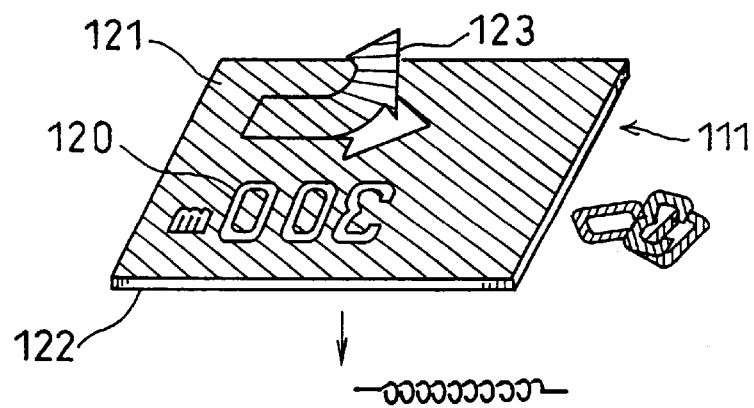
Figure 44C:
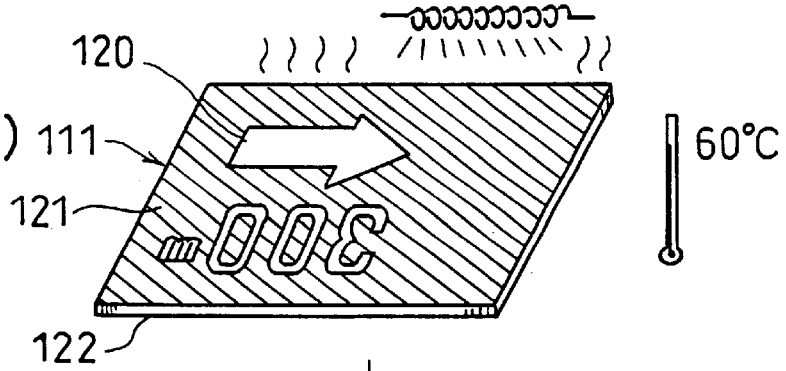
Figure 44D:
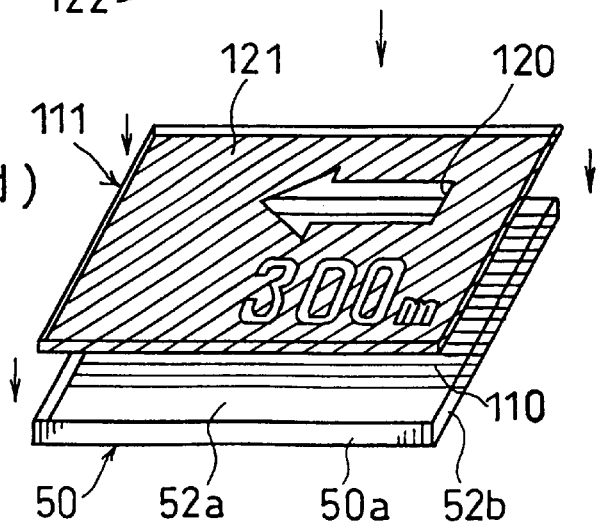

The patterned display board 111, which has light-transmitting sections 120 and light-shielding sections 121, displays characters, graphics, and other information by using the shapes of the light-transmitting sections 120. As illustrated in FIG. 43, the patterned display board 111 is constituted of a transparent plate 122 made of colorless, transparent acryl resin with a thickness of 0.5 mm to 2 mm (1 mm in this embodiment) and a light-shielding sheet 123 that serves as a light-shielding film and that is placed on the transparent plate 122. The light-shielding sheet 123 is affixed to a back surface 122a of the transparent plate 122 that is a surface facing the light-directing plate 50, and its thickness is set to approximately several tenths mm, which is at least thinner than the transparent plate 122. The material of the light-shielding sheet 123 is preferably selected from those materials that have superior water proof and weather resistance and that is readily cut by paper cutters and other tools. Further, in the light-shielding sheet 123, its one surface, which is affixed to the transparent plate 122, is provided as a deep-green scattering surface 123a that has a reflectivity of approximately 10 to 20% and not more than 20% at greatest with respect to wavelengths (colors) having the highest reflectivities. The other surface is provided as a silver scattering reflective surface 123b that has a reflectivity of at least not less than 60%, more preferably, as high as 70%.

Moreover, an adhesive 124, which is used for affixing the light-shielding sheet 123 onto the transparent plate 122, is a colorless, transparent, thermoset resin having virtually the same refractive index as the transparent plate. The characteristics of the adhesive 124 are as follows: prior to heating or irradiation by ultraviolet rays, the adhesive strength is such an extent that the light-shielding sheet 123 is easily separated therefrom by hand, but after having heated for not less than several hours at approximately 60° or after irradiation by ultraviolet rays, the adhesive strength increases to such an extent that it is no longer separated. Thus, it becomes possible to reduce the possibility of the light-shielding sheet 123 coming off due to changes in environments during use or due to contact or other events during attaching and removing processes of the patterned display board 111, thereby improving reliability as well as reducing maintenance costs.

Here, in the light-shielding sheet 123, cut-out regions form the light-transmitting sections 120, and the other regions that are free from cut-out processes form the light-shielding portions 121. Therefore, it is very easy for the user to design display patterns. Referring to FIGS. 44(a) through 44(d), the following description will discuss a sequence of processes for forming a pattern on the patterned display board 111.

First, the patterned display board 111, which is still in a state where the light-shielding sheet 123 is affixed to the entire surface of the transparent plate 122, is given to the designer (the user who uses the display device) of a display pattern. The designer cuts out with a paper cutter P or other tools an outline pattern (along a border line between the light-transmitting portion 120 and the light-shielding portion 121) which is reversed to a display pattern to be formed (FIG. 44(a)). In this pattern-cutting process the following method is preferably used: for example, a pattern is created by using a personal computer, a CAD and other devices, and after having turned the pattern over by a process on software basis, a cutting-out process is carried out by using an XY plotter whose pen point is provided with a cutter, in such a manner as to draw the pattern on the transparent plate 122 having the light-shielding sheet 123 affixed to the entire surface thereof. After completion of the cutting-out process, and after only the light-shielding sheet 123 corresponding to the region of the light-transmitting section 120 has been removed by hand (FIG. 44(b)), the patterned display board 111 is heated for not less than several hours at 60° C. so that the adhesive strength of the remaining light-shielding sheet 123 is increased (FIG. 44(c)). The patterned display board 111, as formed in this manner, is placed so that its surface on the side having the light-shielding sheet 123 is set to face and adhere to the surface 52a of the plane section 52 of the light-directing plate 50 (FIG. 44(d)). Thus, the patterned display board 111 is completed with a desired pattern formed thereon.

Additionally, instead of affixing the light-shielding sheet 123, a light-shielding material having a desired shape may be printed onto the transparent plate 122. Here, the printed region forms the light-shielding section and the non-printed region, which is transparent, forms the light-transmitting region.

Next, an explanation will be given to a sequence of assembling processes of the display device. The patterned display board 111, the light-directing plate 50 and the reflection plate 112, which have the same lateral and longitudinal dimensions, are provided with through-holes 125 that are positioned in the vicinity of four corners of the respective plates. Further, through-holes 126 are provided in the upper portion of the holder 113 so that they are fitted to the lower two through-holes 125 of those through-holes 125. The substrate 54 of the LED lamps 53 and the light-source reflection plate 116 are fixed to predetermined positions inside the holder 113, and the patterned display board 111, the light-directing plate 50 and the reflection plate 112, which are superimposed on one another, are inserted into the long groove 114 of the holder 113. This simple inserting process provides a proper positional relationship so that the light-directing plate 50 is placed in the proximity of or in contact with the LED lamps 53. In this state, the through-holes 125 and 126 are properly positioned, binding bolts 127 are inserted through the through-hole 126 of the holder 113 and through the through-holes 125 of the patterned display board 111, the light-directing plate 50 and the reflection plate 112, and the patterned display board 111, the light-directing plate 50 and the reflection plate 112, which are inserted into the holder 13, are readily secured to a predetermined position by fastening nuts 128.

As described above, since the positioning is made by merely inserting the three components, that is, the patterned display board 111, the light-directing plate 50 and the reflection plate 112, into the holder in a combined manner, it is possible to provide an easy assembly. Thus, the combination of this assembling method and the forming method of the patterned display board 111 allows the user of the display board to manufacture the patterned display board 111 of his or her own, to replace those boards on demand, and also to change the pattern easily in accordance with his or her desired objectives.

Figure 45:
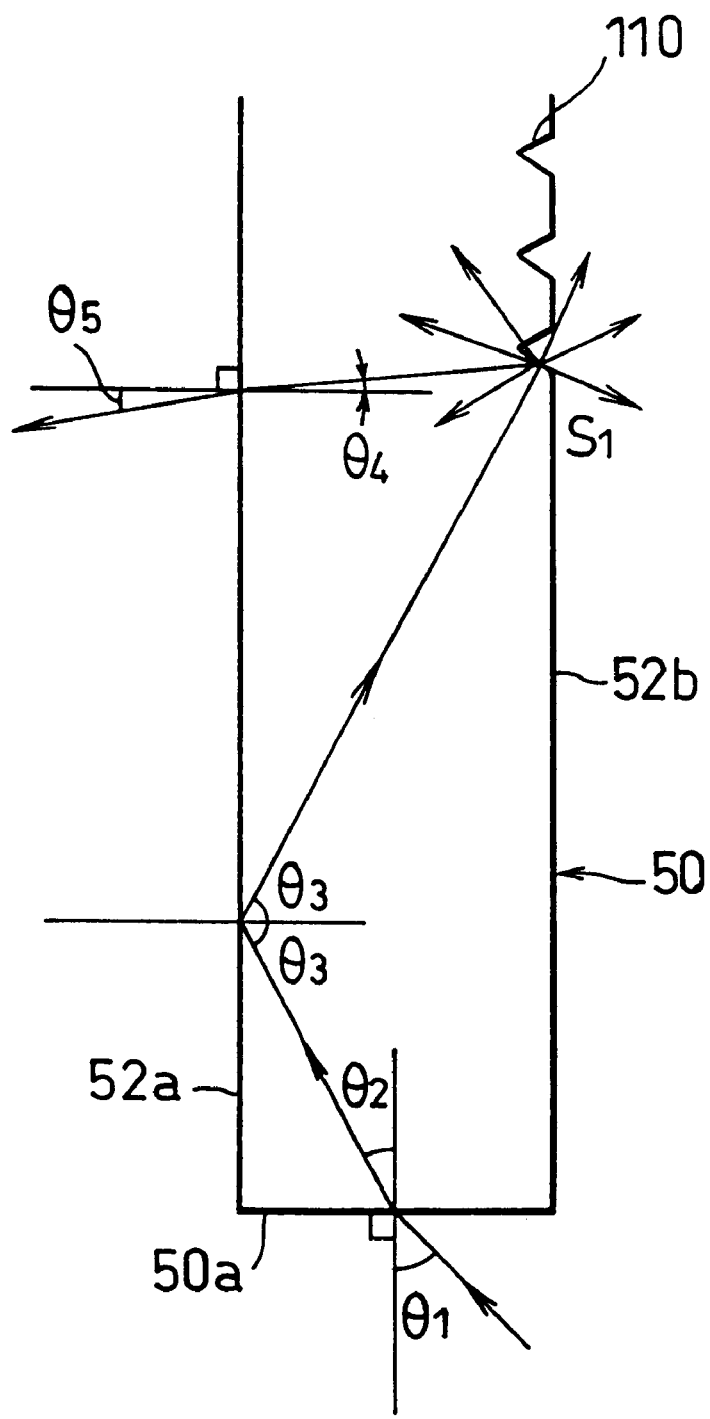
FIG. 45 is a drawing that shows paths of light transmitted through a light-directing plate upon irradiation by LED lamps.
Figure 46:
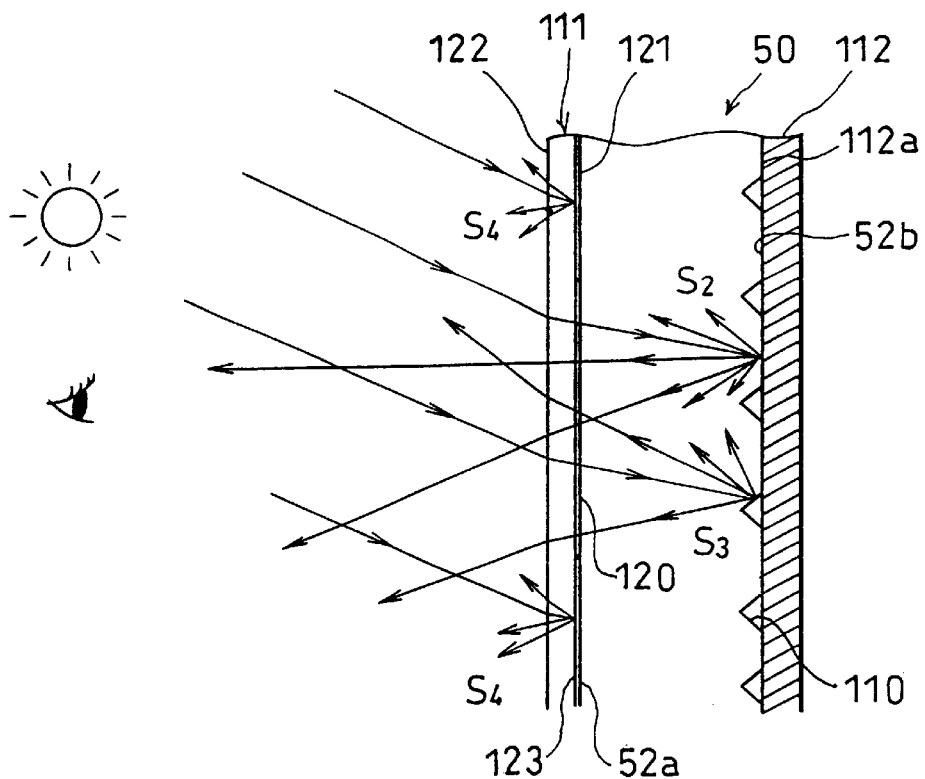
FIG. 46 is a drawing that shows paths of external light rays that are transmitted through the light-directing plate.

Referring to FIGS. 45 and 46, the following description will discuss displaying operations of the present embodiment. First, when a light-emitting display is given by turning on the built-in LED lamps 53 at night or other occasions, all the LED lamps 53 are turned on by electric power externally supplied through the substrate 54. Most of light rays emitted forward from the LED lamps 53 pass through the light-incident surface 50a of the light-directing plate 50 that is placed ahead thereof, and are directed inside the light-directing plate 50. Further, most of light rays emitted in side directions from the LED lamps 53 are reflected by the light-source reflection plates 116 that are placed on the sides toward the light-directing plate 50 in the forward direction, and are directed inside the light-directing plate 50 through the light-incident surface 50a. Since the thickness of the light-directing plate 50 is as thin as 5 mm, most of the light rays that have been directed into the light-directing plate 50 impinge onto the surface 52a or the back surface 52b of the plane section 52. In this case, as shown in FIG. 45, a light ray, which is externally incident on the light-incident surface 50a of the light-directing plate 50 with an incident angle of $\theta_1$, has an incident angle of $\theta_2$ into the light-directing plate 50, which is represented by $\theta_2=\sin^{-1}(\sin\theta_1/n)$ (n: refractive index of light-directing plate) based upon Snell's law. Moreover, the light ray that has been directed inside the light-directing plate 50 with the angle $\theta_2$ is allowed to be incident on the surface 52a or the back surface 52b that are perpendicular to the light-incident surface 50a with an incident angle of $\theta_3=90°-\theta_2$. This relationship shows that as the incident angle $\theta_1$ of a light ray that is made to be incident on the light-incident surface 50a of the light-directing plate 50 increases, the incident angle $\theta_3$ onto the surface 52a or the back surface 52b of the light-directing plate 50 decreases. However, since the refractive index of the light-directing plate 50 is set to n=1.5 in the present embodiment, $\theta_2=41.81°$ and $\theta_3=48.19°$ are obtained even in the maximum incident angle (that is, $\theta_1=90°$) onto the light-incident surface 50a; therefore, the incident angle $\theta_3$ onto the surface 52a or the back surface 52b of the plane section 52 never becomes smaller than this value (48.19°). Here, since the critical angle $\theta r=41.81°$ at which total reflection occurs on the surface 52a or the back surface 52b, all the light rays that impinge on the surface 52a or the back surface 52b from inside are total-reflected. Thus, most of the light rays that have been total-reflected from the surface 52a or the surface 52b with the angle $\theta_3$ are allowed to be incident with the angle $\theta_3$ on the surface 52b or the surface 52a, which are parallel surfaces with a distance of 5 mm, that is, the width of the light-directing plate 50, and again total-reflected therefrom. As described above, light rays, which are directed into the light-directing plate 50 and impinge on the surface 52a or the back surface 52b from inside, are confined inside the light-directing plate 50 by repeating total reflections, and allowed to proceed the inside thereof with high efficiency without reflection loss.

Among the light rays that have been transmitted through the light-directing plate 50, those rays that have impinged on the light-takeoff bodies 110 that are V-shaped grooves 110A provided on the back surface 52b are transmitted therethrough in a scattered manner and irregularly reflected therefrom, without being absorbed by their rough surfaces ($S_1$ in FIG. 45). Most of the light rays that have been irregularly reflected by the back surface 52b reach the surface 52a, and some of the light rays whose incident angle $\theta_4$ onto the surface 52a is not more than the critical angle $\theta r$ are released out of the light-directing plate 50. On the other hand, some of the light rays that have been transmitted through the light-takeoff bodies 110 in a scattered manner and released toward the back side of the light-directing plate 50 are allowed to impinge on the reflective surface 112a of the reflection plate 112 that is adhered to the back surface 52b. The impinged light rays are reflected in a scattered manner with a high reflectivity of approximately 70%, and again directed into the light-directing plate 50 through the back surface 52b. Most of these re-incident light rays reach the surface 52a, and some of the light rays whose incident angle is not less than the critical angle $\theta r$ repeat total reflections as described earlier, and some of them whose incident angle is not more than the critical angle $\theta r$ are released out of the light-directing plate 50 through the surface 52a.

The light rays that have been released toward the outside of the light-directing plate 50 are allowed to impinge on the patterned display board 111 that is adhered to the surface 52a. Some of the light rays that impinge on the light-shielding section 121 having the light-shielding sheet 123 affixed thereto of the patterned display board 111, are irregularly reflected with a high reflectivity of approximately 70%, and again directed into the light-directing plate 50 through the surface 52a of the light-directing plate 50. Most of these re-incident light rays reach the back surface 52b, but some of the light rays which impinge on the light-takeoff bodies 110 and some of them whose incident angle onto the back surface 52b is not less than the critical angle $\theta r$ repeat the above-mentioned behaviors of scattering and total reflections, and some of them whose incident angle is not more than the critical angle $\theta r$ are released out of the light-directing plate 50 through the back surface 52b, and again repeat the above-mentioned behaviors. In contrast, the light rays that have impinged on the light-transmitting section 120 having no light-shielding sheet 123 affixed thereto of the patterned display board 111, are transmitted through the transparent plate 122 (1 mm in thickness) of the patterned display board 111, and externally released. With respect to loss of light upon this transmission, since the transmitting section is colorless and transparent and the thickness is thin (1 mm) in this embodiment, the loss is mainly caused by the Fresnel's reflection (4% on the surface and back surface respectively) on the surface of the transparent plate 122; therefore, a high transmittance of approximately 92% is obtained. Here, when an anti-reflection (AR) coating is provided on the surface of the transparent plate 122 of the patterned display board 111, the Fresnells reflection is suppressed, and a higher transmittance (at a maximum of approximately 99%) is obtained.

As described above, among the light rays that have proceeded inside the light-directing plate 50 while repeating total reflections, some of the rays are released at a constant rate when they impinge on the light-takeoff bodies 110. For this reason, supposing that light rays that have proceeded inside the light-directing plate 50 impinge on the light-takeoff bodies 110 at the same possibility irrespective of the position, the closer the distance from the LED lamps 53, the more quantity of light is released. This causes irregularity in the luminance of the plane section 52 of the light-directing plate 50; however, since the light-takeoff bodies 110 are placed more closely as the distance from the LED lamps 53 increases, the possibility of light impinging thereon increases as the distance from the LED lamps 53 increases, thereby making uniform the luminance on the plane section 52 of the light-directing plate 50.

Moreover, among the light rays that have been directed inside the light-directing plate 50 and have proceeded inside thereof, those rays that have reached the side faces 50b, 50c and 50d other than the light-incident surface 50a, are reflected by the reflective tapes 115 that are affixed to the respective side faces 50b, 50c and 50d. The reflected light rays are returned to the light-directing plate 50, and confined therein. Furthermore, among the light rays that have again reached the light-incident surface 50a after having repeated reflections inside the light-directing plate 50, some of the rays whose incident angle onto the surface 50a is smaller than the critical angle θr are released through the light-incident surface 50a into space at which the LED lamps 53 are placed. Here, since the surface 54a of the substrate 54 whereon the LED lamps 53 are assembled and the light-source reflection plates 116 that are placed on the sides of the LED lamps 53 have high reflectivities (70% and 80% respectively), a large proportion of the released light rays are reflected by the respective faces, and again directed into the light-directing plate 50 through the light-incident surface 50a.

As described above, in the case when a display is produced by using the LED lamps 53 installed in the display device, since the surface 123b on the light-directing plate 50 side of the light-shielding section 121 in the patterned display board 111 and the reflection plate 112 have high reflectivities respectively (approximately 70%), since the reflective tapes 115 having high reflectivity (approximately 80%) are affixed to the side faces 50b, 50c and 50d other than the light-incident surface 50a of the light-directing plate 50, and since the reflective members having high reflectivity (approximately 70% to 80%) are installed around the LED lamps 53, most of light rays among those that have once been externally released from the light-directing plate 50 in unwanted directions are allowed to again return toward the light-directing plate 50. Further, since the-light-transmitting section 120 of the patterned display board 111 is made colorless and transparent, a high transmittance (not less than 92%) is obtained. Thus, it becomes possible to further improve the efficiency of light utilization.

The following description will discuss the case wherein the contents of a display are visually confirmed by using externally applied light during day time or other occasions. As illustrated in FIG. 46, light rays, externally applied onto the surface of the patterned display board 111, are allowed to pass through the transparent plate 122, and impinge on the light-shielding section 121 having the light-shielding sheet 123 affixed thereto as well as on the light-transmitting section 120 having no light-shielding sheet 123 affixed thereto.

With respect to the light rays that have impinged on the light-transmitting section 120, since the section is made colorless and transparent, light rays within the visible range are all transmitted through the patterned display board 111 with high transmittance in the same manner as the light emission from the LED lamps 53, and allowed to be directed into the light-directing plate 50 that is installed on the back side thereof through the surface 52a of the plane section 52. Among the light rays that have been allowed to be incident on the light-directing board 50, those light rays within the visible range all proceed-inside the light-directing plate 50, and reach the back surface 52b of the light-directing plate 50. Among the light rays that have reached the back surface 52b, those light rays that have been transmitted through the surface 52b are irregularly reflected by the reflective surface 112a of the reflection plate 112 that is installed on the further back side thereof ($S_2$ in FIG. 46). Here, the reflection plate 112 has a high reflectivity of approximately 70% with respect to all the colors within the visible range (white color); therefore, irregular reflections occur with high reflectivities regardless of colors of the externally incident light rays, and the reflected light rays are again allowed to be incident on the light-directing plate 50 from the rear surface side. Among the re-incident light rays onto the light-directing plate 50, those light rays, which have been transmitted through the light-directing plate 50 from the rear side to the front side thereof, and allowed to impinge on the light-transmitting section 120 of the pattern display board 111, are externally released from the surface of the patterned display board 111. Moreover, the light rays $S_3$, which have been directed into the light-directing plate 50 and irregularly reflected by the light-takeoff bodies 110, and some of the light rays that have been reflected by the surface 52a and back surface 52b of the light-directing plate 50 other than the light-takeoff bodies 110 are similarly released from the light-transmitting section 120 of the patterned display board 111. In this case, since the thickness of the light-directing plate 50 is as thin as 5 mm, and since the light-takeoff bodies 110 hardly have any light absorption, the transmittance of the light-directing plate 50 is increased. In cooperation with the high transmittance of the light-transmitting section 120 of the patterned display board 111 and the high reflectivity of the reflection plate 112, this effect makes it possible to improve the efficiency of light utilization, and also to take out approximately 50% of light with respect to incident light onto the light-transmitting section 120 of the patterned display board 111 regardless of colors of the incident light, from the surface of the patterned display board 111 as reflected light. Thus, it is possible for the observer to view the light-transmitting section 120 of the patterned display board 111 with high luminance.

Additionally, when an AR coating is applied to the surface of the transparent plate 122 of the patterned display board 111, the efficiency of light utilization is further improved, and approximately 58% of light can be taken out. Thus, the application of the film for preventing reflection to the light-transmitting section 120 of the surface of the patterned display board 111 further improves the light-take-out efficiency when the light source is turned on, thereby reducing the power consumption of the light source 51 to a minimum. Moreover, even when a display is viewed under external light, it is possible to provide better contrast and consequently to improve the visibility.

In contrast, light rays that have been externally incident and have impinged upon the light-shielding section 121 of the patterned display board 111 are irregularly reflected by the scattering surface 123a of the light-shielding sheet 123 ($S_4$ in FIG. 46). However, since the scattering surface 123a has a deep green color that has a reflectivity of not more than 20% even with respect to the wavelength (color) having the highest reflectivity, the luminance of this surface is small when viewed by the observer.

As described above, irrespective of colors of applied light rays such as light from the light source 51 at night or other occasions or external light during day time or other occasions, high contrast is obtained between the light-transmitting section 120 and the light-shielding section 121, better visibility is maintained, and very thin display devices having superior visibility even under conditions of either day time or night time can be provided. Further, it is possible to reduce the power consumption to a minimum when the light source is turned on and consequently reduce the running costs by improving the efficiency of light utilization.

Moreover, the application of the LED lamps 53 as the light source 51 makes service life longer, when compared with fluorescent lamps or incandescent lamps, thereby providing maintenance-free operation, reducing the power consumption and lowering the running costs. In particular, the application of the chip-type LED lamps 70 further improves the light-incidence efficiency compared with the lens-type LED lamps 53 and makes the light-directing plate 50 thinner, thereby remarkably contributing to high luminance and thinness of the display devices.

Furthermore, in the case when the reflective surface 112*a* of the reflection plate 112 is made white, since virtually the same reflectivity is provided to light rays in any color tone within the visible range, it is possible to always obtain stable, high reflectivity even if color tones of externally applied light rays vary, and consequently to maintain high visibility. Therefore, the display devices can be applied under a wider range of conditions of external light and illumination.

The following description will discuss an arrangement wherein the reflection plate 112 is exchanged so that the color of the reflective surface 112*a* of the reflection plate 112 is changed from white to fluorescent yellow-green that is the same as the color of light emission of the LED lamps 53 (when illuminated by white light). In this arrangement, when white light is externally applied, that is, when light such as light from head lamps of a car or a flash lamp is applied during day time or at night, among the light rays that have reached the reflection plate 112 through the light-transmitting section 120 of the patterned display board 111 and the light-directing plate 50, only the light rays having the same color components as the LED lamps 53 are reflected by the reflection plate 112, and again externally released through the light-directing plate 50 and the patterned display board 111. Therefore, in both cases of displays using the built-in LED lamps 53 and using externally applied white light, it is possible to provide the same color tone to the high luminance portion (corresponding to the region of the light-transmitting section 120 of the patterned display board 111) of the display device, and consequently to allow the displayed pattern to be viewed in the same color tone. Thus, the display device with this arrangement can be applied to those display devices that contain information in their own display colors, such as used for traffic signs.

Additionally, in the above-mentioned embodiment, the LED lamps 53 may be exchanged to those emitting another color (such as red, orange color, blue or colors emitted in combination with these colors) so as to provide another display color upon light emission. In this case, if the reflective surface 112*a* of the reflection plate 112 is made white, the same color as that of light emission of the LED lamps 53 can be externally released. Different from conventional arrangements, this eliminates the necessity of having to carrying out mechanical changes, such as having to exchange color filters of the patterned display board, thereby making it possible to easily change the color of light emission of the display device, and consequently to make a variety of displays, by using a simple method for electrically controlling the LED lamps 53. Moreover, even in the case when a display is produced using a specific color tone, no color filter is required, and no driving circuit is required that would be otherwise required in fluorescent lamps; therefore, it becomes possible to simplify the structure. In this case, if it is desired that color tones of the display device upon application of external light and upon emission of the LED lamps are conformed to each other, the color of the reflective surface 112*a* of the reflection plate 112 may be conformed to the respective colors of light emission.

[Fifth Embodiment]

The following description will discuss another embodiment of a display device wherein two kinds of LED lamps having different colors of light emission are used as the light source and the color of the reflective surface of the reflection plate is made white. The other structures are the same as those described in the fourth embodiment and its modified examples.

Figure 47:
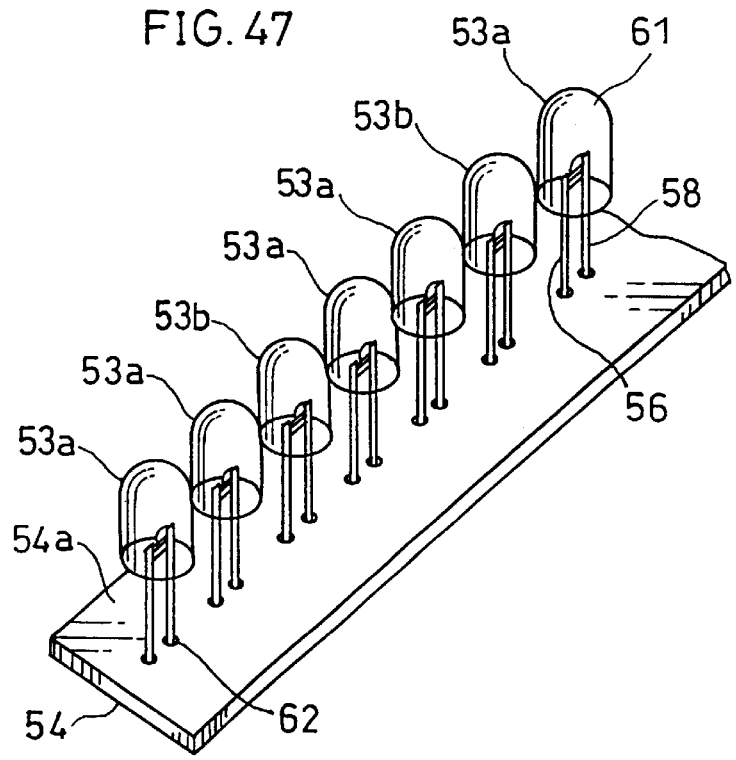
FIG. 47 is a perspective view of a light source wherein lens-type LED lamps having different colors of light emission are used.

As illustrated in FIG. 47, the light source 51 has an arrangement wherein LED lamps are aligned on the substrate 54 in one line, and the LED lamps consist of two kinds, that is, LED lamps 53*a* of yellow-green color (emission wavelength: 565 nm) and LED lamps 53*b* (emission wavelength: 660 nm) of red color. Here, two of the LED lamps 53*a* of yellow-green color are arranged, and then one of the LED lamps 53*b* of red color is arranged, and in this order, the following LED lamps are alternately arranged. Further, these LED lamps 53*a* and 53*b* are wired to circuits of two systems on the substrate 54 in a separated manner for respective colors, and these circuits are connected to a control circuit (not shown) which controls the light-emission output of the respective LED lamps 53*a* and 53*b*, externally installed on the substrate 54, in a separated manner for each group having the same color.

In this arrangement, both of light rays having the colors of two kinds, which have been emitted from the LED lamps 53*a* and 53*b*, are released ahead of the light-transmitting section 120 of the patterned display board 111 through the light-directing plate 50 in the same manner as explained in the fourth embodiment. In this case, the light-directing plate 50 and the light-transmitting section 120 of the patterned display board 111, which form a light-transmitting path, are colorless and transparent, and the reflective surface 112*a* of the reflection plate 112 and surface 54*a* of the substrate 54 whereon the LED lamps 53*a* and 53*b* are installed are made white. Moreover, the surface 123*b* on the light-directing plate side of the light-shielding section 121 of the patterned display board 111, the light-source reflection plate 116, and the reflective tapes 115 of the light-directing-plate side faces 50*b*, 50*c* and 50*d* are all silver colored and have the same reflection characteristics with respect to any color (wavelength). Therefore, the light-intensity ratio of the respective colors emitted from the LED lamps 53*a* and 53*b* has no change even when they are released from the display device. In contrast, since a number of reflections and scatterings occur in the light-transmitting path, light rays emitted from the adjacent LED lamps 53*a* and 53*b* are spatially mixed when they are released from the patterned display board 111. Thus, when the light rays are released from the display device, the color tone thereof is recognized by the observer as one color that is made by mixing the two color components of the LED lamps 53*a* and 53*b*. Therefore, by changing the light-emission intensity of the LED lamps 53*a* and 53*b* using the control circuit in a separate manner for each color group, it becomes possible to change the color tone of the pattern that is electrically displayed, without the necessity of any physical change in construction, such as an exchange of the patterned display board 111.

In another modified example of the above-mentioned embodiment, it is proposed that the colors of the LED lamps are set to primaries of red, green and blue and that a control circuit for changing the light-emission intensity in a separate manner for each color group is installed. Thus, when the intensity ratio of the respective colors is adjusted in a detailed manner, it becomes possible to provide full-color displaying operation. Moreover, LED lamps having different colors of light emission are placed within a constant proximity region in a mixed manner. Compared with cases wherein a plurality of light sources having different colors are placed by using larger light sources such as fluorescent lamps and incandescent lamps, this arrangement makes it possible to simplify the driving circuit and also to provide better color mixture more easily. Furthermore, instead of the above-mentioned arrangement wherein the LED lamps, each having a different mono-color light emission, are installed in a mixed manner, a multi-color-emission type LED lamp, which has a plurality of LED chips having different colors of light emission installed inside thereof, may be provided. This arrangement increases the packaging density of the LED chip per unit length, provides greater emission output by increasing the number of possible packages, and maintains better color-mixture properties when the length of the light-directing plate in the longitudinal direction (in the departing direction from the light source) is short so that the distance of the light path wherein color mixture is carried out is short.

Therefore, compared with those cases wherein fluorescent lamps and incandescent lamps are used as the light source, since the linearity between the light-emission intensity and the electric current is improved with a wider dynamic range, it is possible to easily carry out the intensity adjustment in a detailed manner, and consequently to easily increase the display color tones by adjusting the light-emission intensity of the LED lamps in detail in a separate manner for each color of light emission. Here, LED lamps having different colors of light emission are placed within a constant proximity region in a mixed manner. Compared with cases wherein a plurality of light sources having different colors are placed by using larger light sources such as fluorescent lamps and incandescent lamps, this arrangement makes it possible to easily mix colors without the necessity of complicated controlling operations, and also to save space so as to make the device compact. Further, since better color-mixture properties are obtained, it is possible to provide color expressions with less irregularity irrespective of the size of the display device.

Figure 48:
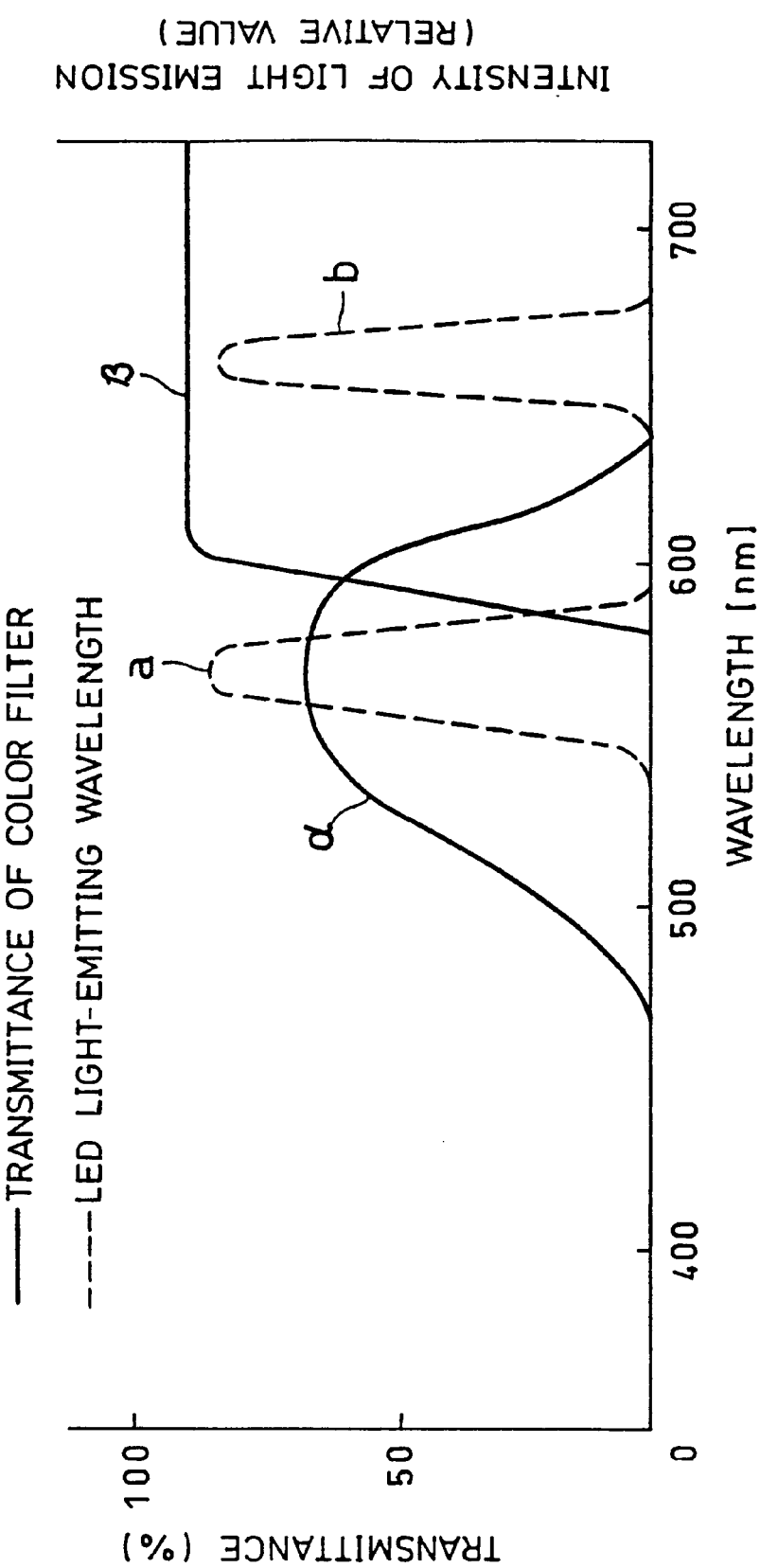
FIG. 48 is a graph which explains characteristics of color filters and LED lamps.
Figure 49:
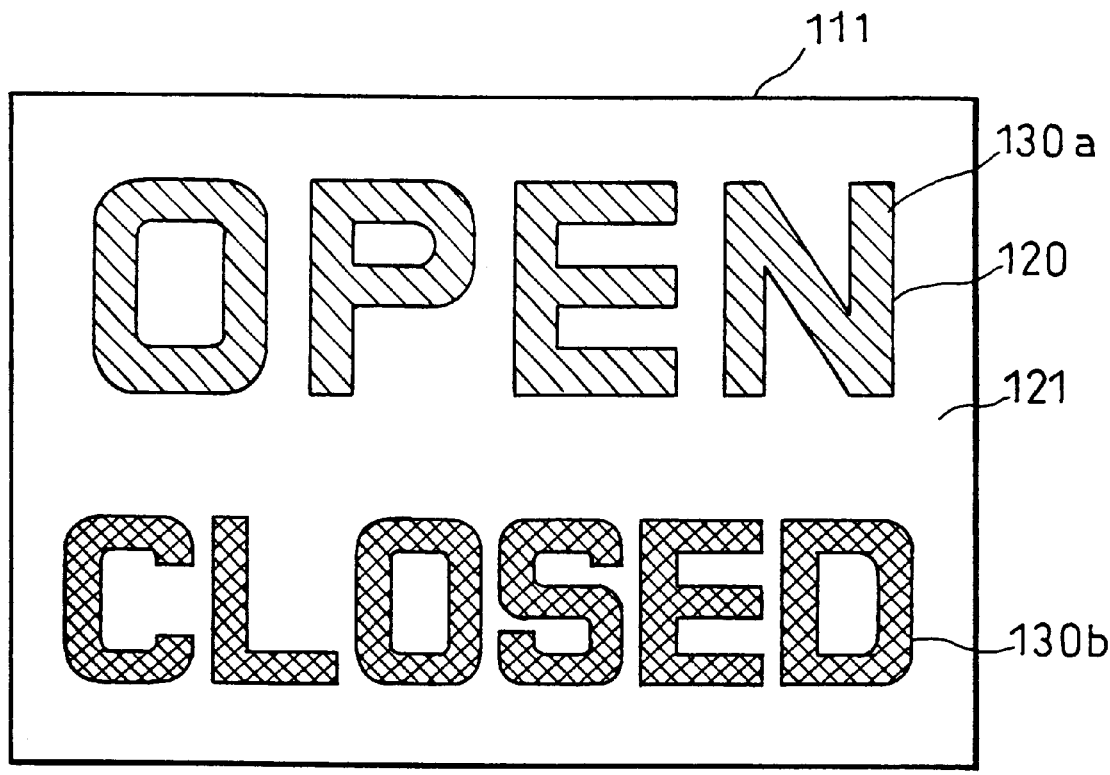
FIG. 49 is a front view of a patterned display board wherein color filters are installed.
Figure 50:
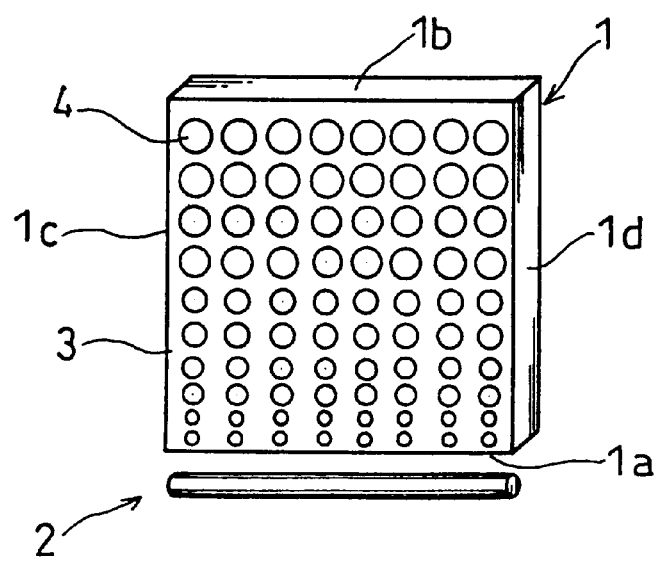
FIG. 50 is a perspective view of a plane-shaped lighting device wherein a conventional light-takeoff body is installed.
Figure 51A:
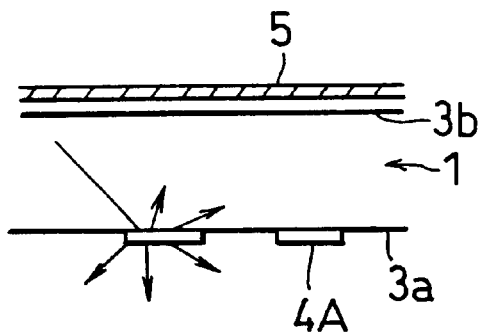
FIGS. 51(a) and 51(b) show conventional light-takeoff bodies.
Figure 51B:
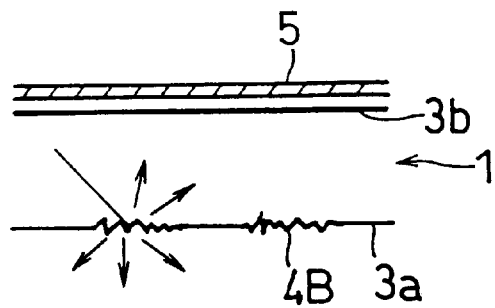
Figure 52:
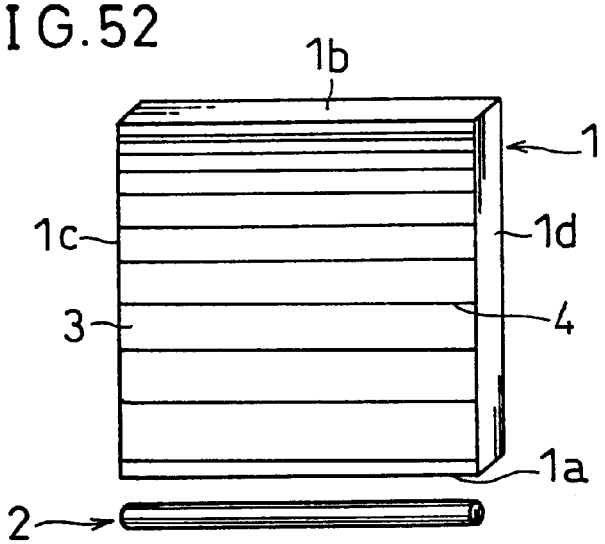
FIG. 52 is a perspective view of a plane-shaped lighting device wherein another conventional light-takeoff body is installed.
Figure 53:
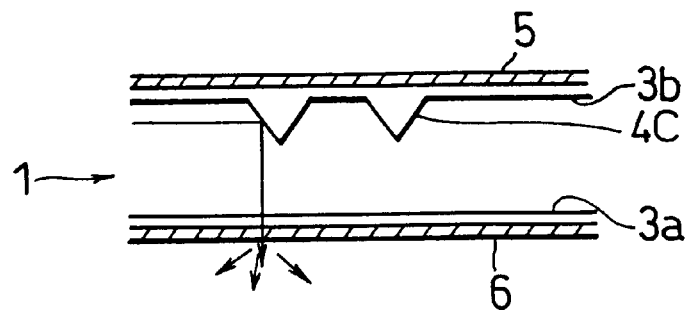
FIG. 53 is a perspective view of a plane-shaped lighting device wherein another conventional light-takeoff body having a grooved pattern is installed.
Figure 54A:
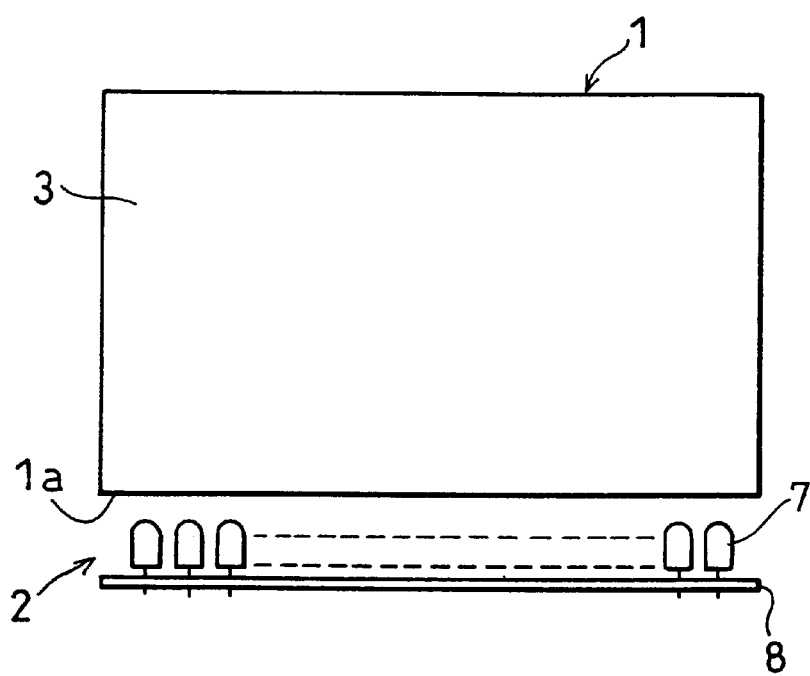
FIGS. 54(a) and 54(b) show a plane-shaped lighting device using conventional LED lamps.
Figure 54B:
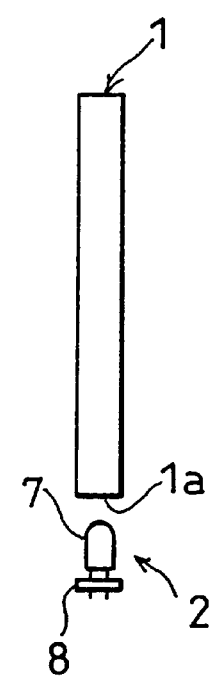
Figure 55A:
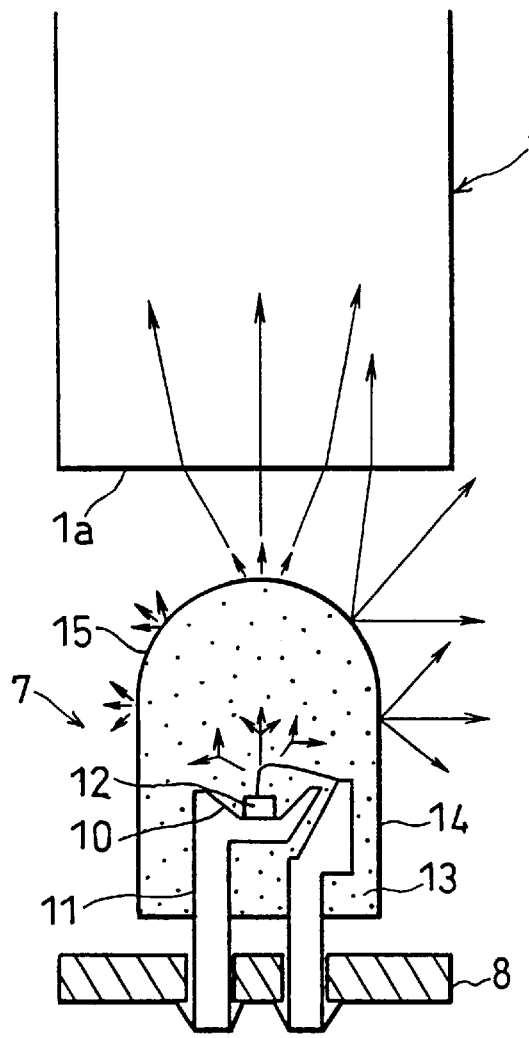
FIG. 55(a) is a drawing that shows a conventional lens-type LED lamp of a scattering type and FIG. 55(b) is a drawing that shows a conventional lens-type LED lamp of a transparent type.
Figure 55B:
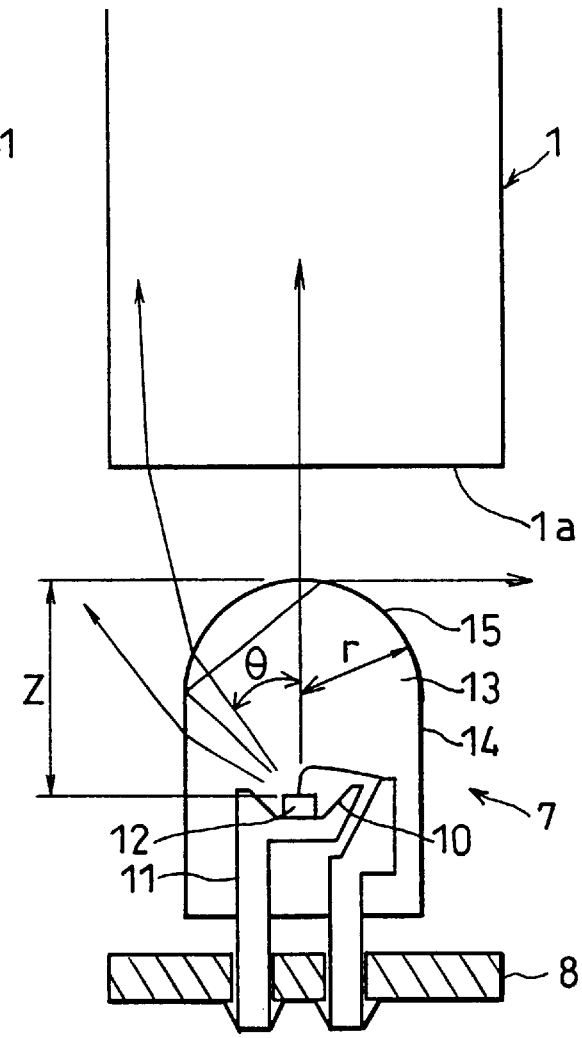
Figure 56:
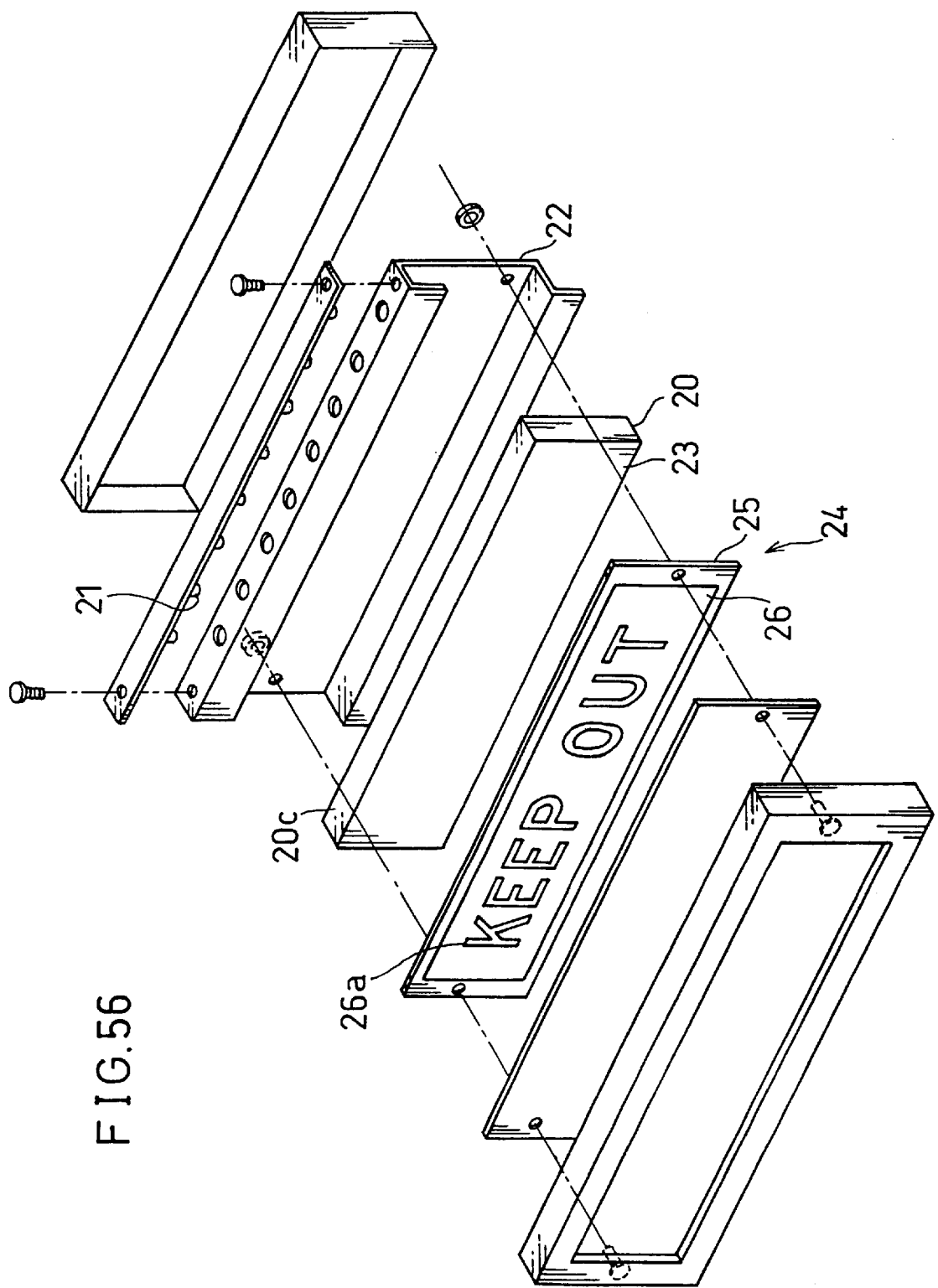
FIG. 56 is an exploded perspective view of a conventional display device.
Figure 57:
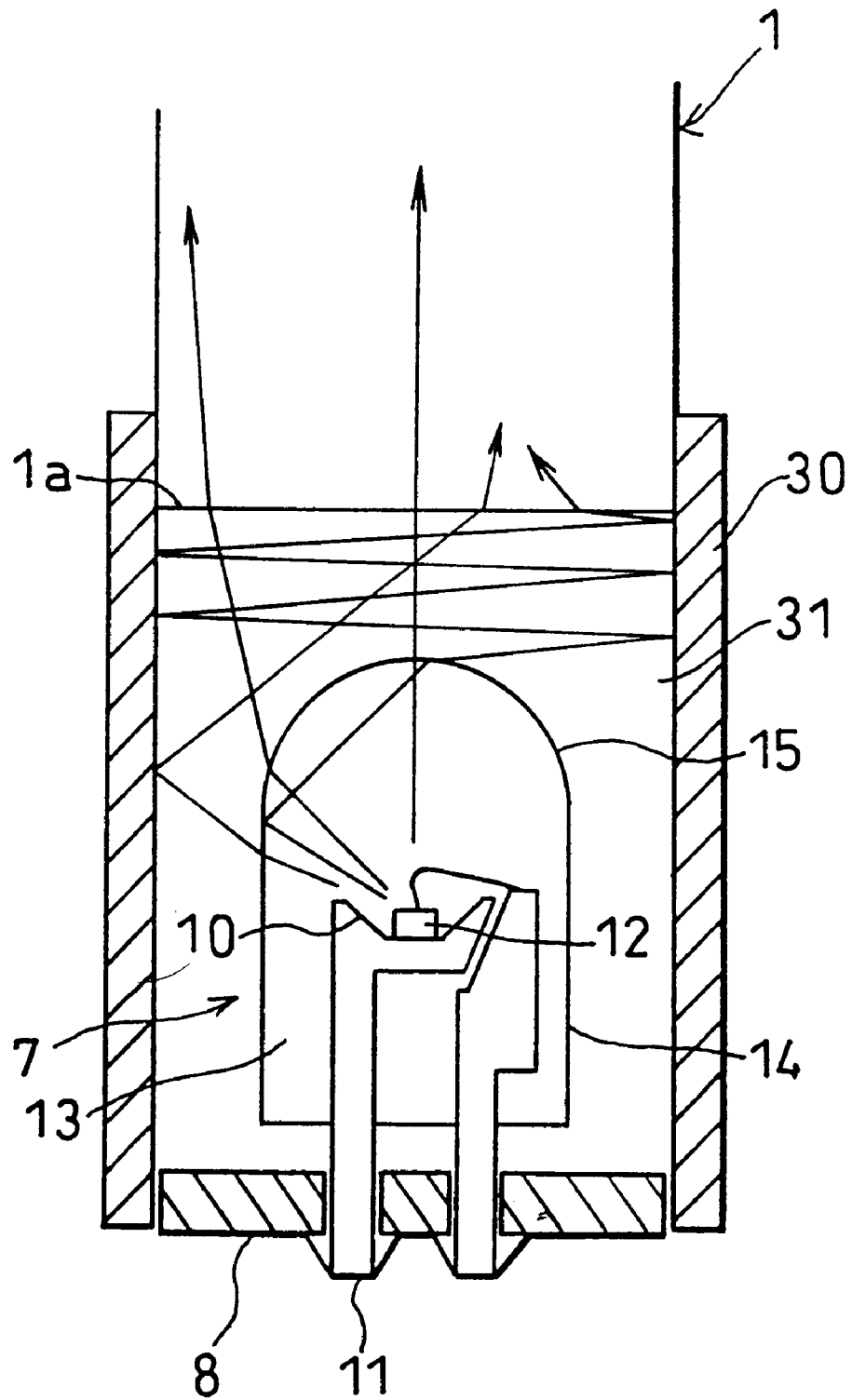
FIG. 57 is a drawing that shows a conventional plane-shaped lighting device having a housing.
Figure 58:
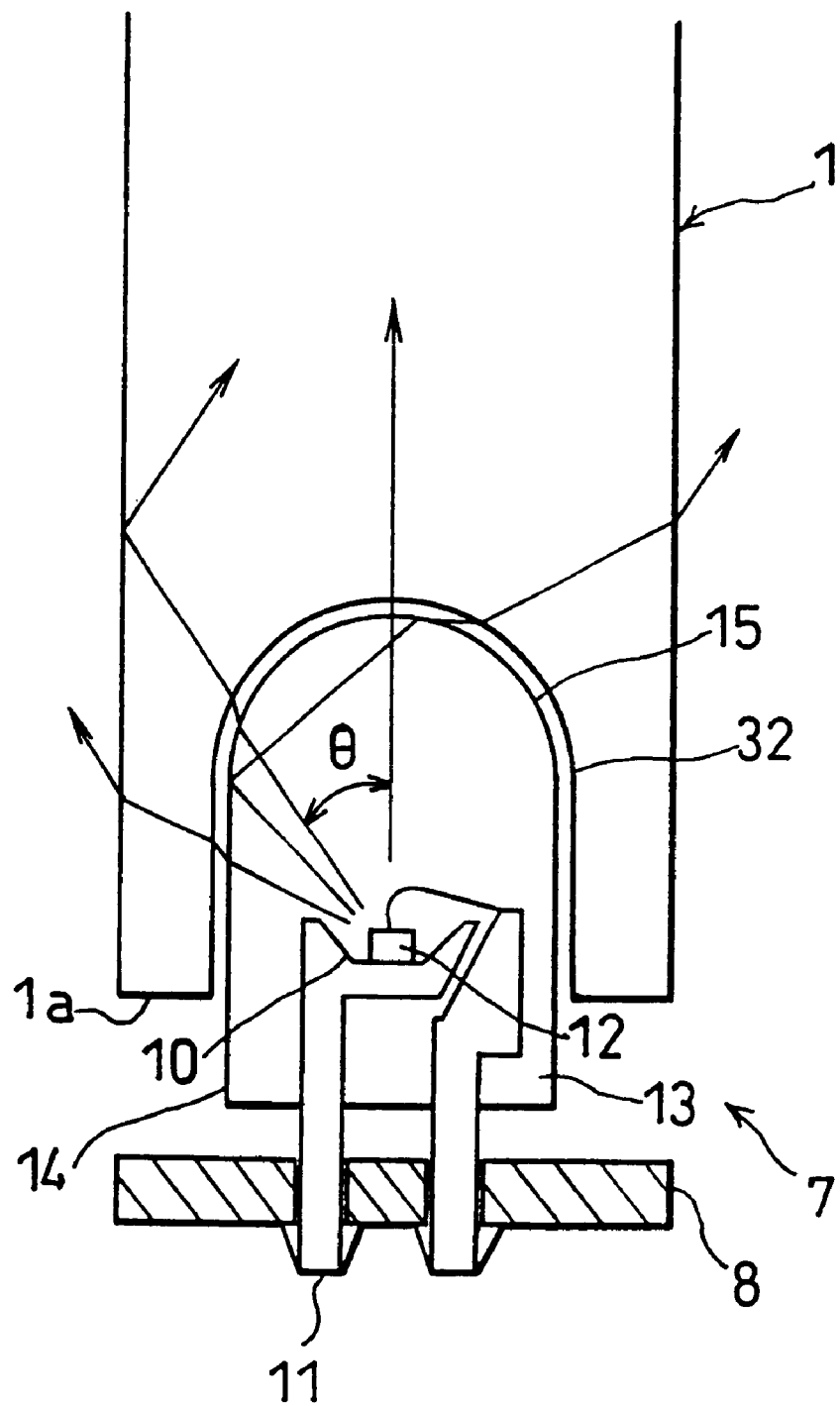
FIG. 58 is a drawing that shows a conventional plane-shaped lighting device wherein each LED lamp is inserted into a hole that is provided in a light-directing plate.
Figure 59:
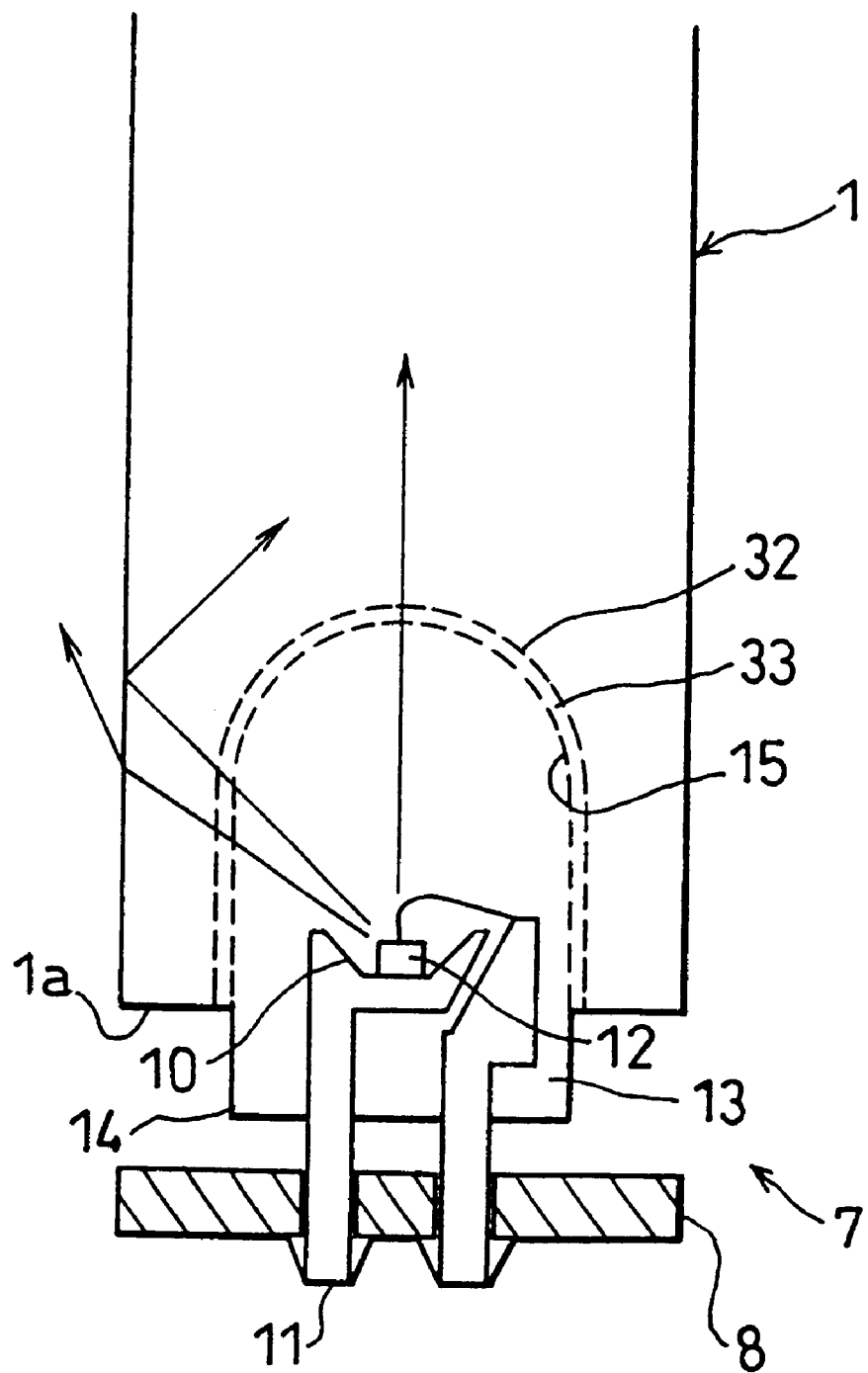
FIG. 59 is a drawing that shows a conventional plane-shaped lighting device wherein each LED lamp is embedded into a hole that is provided in a light-directing plate.
Figure 60:
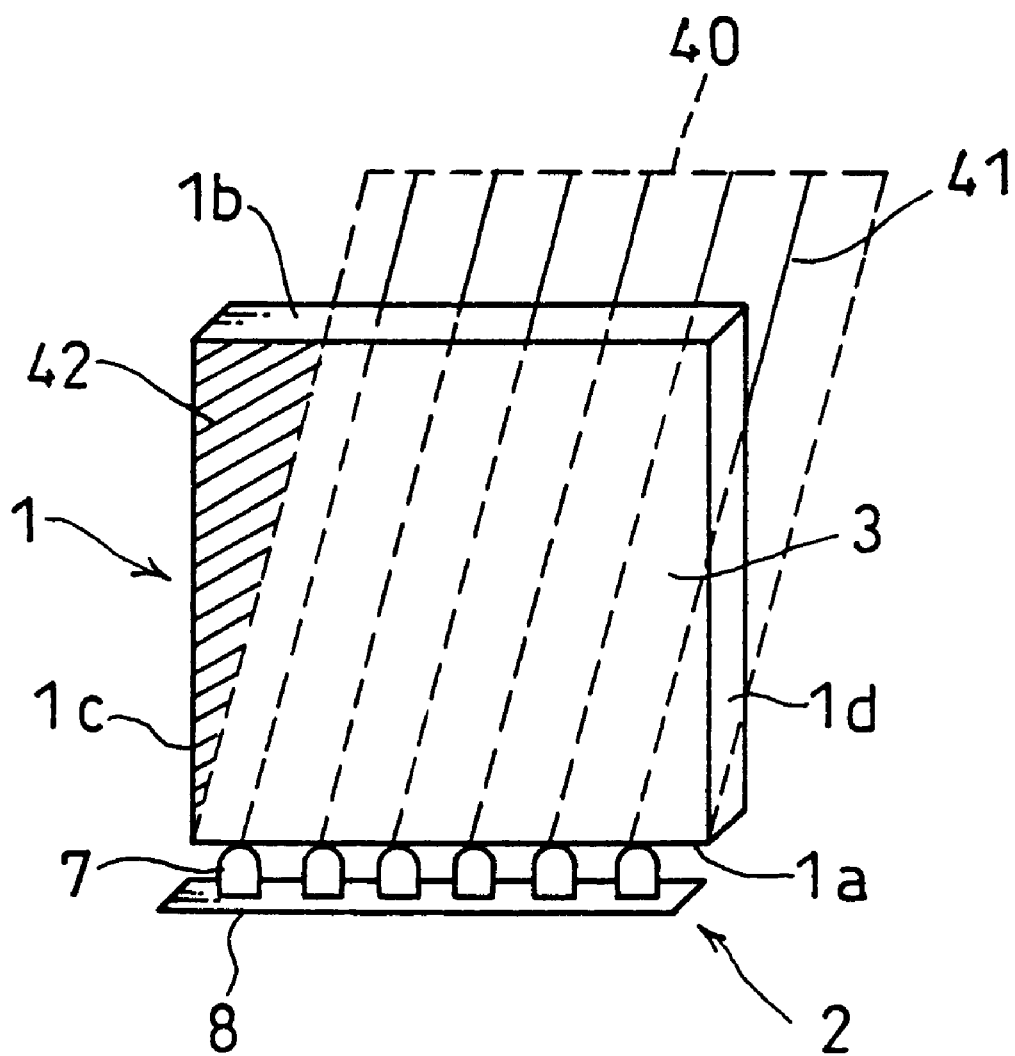
FIG. 60 is a drawing that shows how a virtual image is viewed in a conventional plane-shaped lighting device.

Moreover, in another embodiment as illustrated in FIG. 48, it is proposed that color filters of two types having different transmitting bands, such as a color filter 130a for transmitting a light ray of yellow-green color having characteristics indicated by a solid line α and a color filter 130b for transmitting a light ray of red color having characteristics indicated by a solid line β, are affixed to different light-transmitting sections 120 of the patterned display board 111, and that LED lamps of two types, that is, LED lamps 53a of yellow-green color (light-emission wavelength: 565 nm, indicated by a broken line a in the drawing) and LED lamps 53b of red color (light-emission wavelength: 660 nm, indicated by a broken line b in the drawing), are used as a light source so that turning-on and off controls are carried out in a separate manner for each color group. Additionally, the alignment in which the LED lamps 53a and 53b are installed on the substrate 54 is optionally determined. Here, as illustrated in FIG. 49, character-line portions, that is, "OPEN" on the upper side and "CLOSED" on the lower side, correspond to light-transmitting sections 120 which have been formed by cutting the light-shielding sheet 123 out, and the color filter 130a for transmitting yellow-green color is affixed to the character-line portion on the upper side and the color filter 130b for transmitting red color is affixed to the character-line portion on the lower side. Except for this arrangement, the other arrangements are the same as those described in the fourth embodiment.

In this arrangement, when a display is produced by turning the LED lamps 53a and 53b on, light rays, which have been emitted by the LED lamps 53a and 53b, reach the color filters 130a and 130b of the light-transmitting sections 120 of the patterned display board 111 through the light-directing plate 50. At this time, the character-line portion on the upper side, whereon the color filter 130a for transmitting yellow-green color is placed, allows only the light ray emitted from the LED lamp 53a of yellow-green color of the light lays of the two colors to pass therethrough, and the character-line portion on the lower side, whereon the color filter 130b for transmitting red color is placed, allows only the light ray emitted from the LED lamp 53b of red color to pass therethrough, and the resulting light ray is released ahead of the display device. Therefore, when only the LED lamp 53a of yellow-green color is turned on, only the display "OPEN" on the upper side is recognized as a light-emission display from ahead, and when only the LED lamp 53b of red color is turned on, only the display "CLOSE" on the lower side is recognized as a light-emission display from ahead. As described above, when light-emission displays are produced by turning on and off the LED lamps 53a and 53b, it is possible to change the color of light emission from the patterned display board 111 by merely switching the colors upon turned-on state of the LED lamps 53a and 53b electrically. Thus, with this arrangement wherein the contents of displays are prepared in a distinct manner depending on respective colors, the contents of displays of different kinds can be electrically switched without the necessity of any physical change in construction, such as an exchange of the patterned display board 111.

Moreover, in a modified example of the above-mentioned embodiment, it is proposed that color filters having different transmitting bands of more than two colors and LED lamps having colors of light emission that correspond to the transmitting bands of the color filters are installed in such a manner that no overlapping is made in their combined transmitting wavelength ranges; thus, it becomes possible to select as many kinds of displays and as many display colors as the number thereof.

Since color filters for selectively transmitting light rays based on their respective colors are provided on the corresponding light-transmitting sections of the patterned display board, only the light lay that matches the wavelength transmitting band (color) of a specific color filter is allowed to pass through the color filter and externally released when a display is produced by turning the internal light source on. Consequently, in this arrangement wherein the light-transmitting sections having color filters having respectively different wavelength transmitting bands (colors) are placed on different positions on one patterned display board and the light source having the color that matches a desired transmitting color is selectively turned on, only the light-transmitting section whereon the color filter having transmitting characteristics that match the color of the turned-on light source is placed is allowed to release light, thereby making it possible to easily display several kinds of patterns.

Moreover, since the light-takeoff bodies on the light-directing plate hardly have any light absorption, the light-takeoff efficiency from the light-directing plate is improved. Furthermore, since both the reflectivity of the reflective surface of the reflection plate and the reflectivity of the light-shielding sections on the light-directing plate side of the patterned display board are set to be as high as 60% with respect to light-emission colors of the light source, most of the light rays that have been released from the light-directing plate and have impinged on the respective surfaces are again reflected toward the light-directing plate; thus, it is possible to improve the efficiency of light utilization. In addition, in the case when a display is confirmed under external light, there is only a small loss of light occurring while light rays, which have been directed into the light-directing plate from outside, are reflected by the reflection plate through the light-directing plate and again allowed to return to the light-transmitting sections; therefore, high contrast is achieved in comparison with the light-shielding section having a low reflectivity of not more than 20%, and consequently it becomes possible to maintain better visibility.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A plane-shaped lighting device comprising:
   a light-directing plate made of a plate-shaped light-transmitting member; and
   a light source that is placed close to or in contact with one side face of the light-directing plate,
   wherein: light, which has been emitted from the light source and made to be incident on a light-incident surface on the one side face of the light-directing plate, is taken out from a plane section of the light-directing plate; and a plurality of light-takeoff bodies, each having a recessed shape or a protruding shape, are provided on the plane section of the light-directing plate in a direction parallel to the one side face and in at least two directions that intersect said direction, the light-takeoff bodies being arranged so that the density thereof increases as the distance from the light source increases, and so that each light-takeoff body has a smooth surface.

2. The plane-shaped lighting device as defined in claim 1, wherein each light-takeoff body is designed to have either of the following shapes: a continuous-line shape, a discontinuous-line shape, and a shape made by combining these line shapes.

3. The plane-shaped lighting device as defined in claim 1, wherein each light-takeoff body consists of short lines that intersect one another at one point.

4. The plane-shaped lighting device as defined in claim 1, wherein the light source is provided with LED lamps each of which has an LED chip for emitting light and a semispherical lens that directs light from the LED chip to the inside of the light-directing plate, the LED lamp being designed so that the distance from a top of the semispherical lens to the LED chip is set to be not more than 1.8 times the radius of curvature of the semispherical lens.

5. The plane-shaped lighting device as defined in claim 1, wherein the light source is provided with LED lamps each of which has a reflection wall for directing light from an LED chip into the light-directing plate and a flat light-releasing surface.

6. A plane-shaped lighting device comprising:
   a light-directing plate made of a plate-shaped light-transmitting member;
   a light source that is placed close to or in contact with one side face of the light-directing plate,
   so that light, which has been emitted from the light source and made to be incident on a light-incident surface on the one side face of the light-directing plate, is taken out from a plane section of the light-directing plate;
   a plurality of light-takeoff bodies, each of which has a recessed shape or a protruding shape with a smooth surface, are provided on the plane section of the light-directing plate in a direction parallel to the one side face and the light-takeoff bodies, each of which has a curved line shape, are arranged so that the density thereof increases as the distance from the light source increases; and
   wherein the LED lamps each of which has an LED chip for emitting light and a semispherical lens that directs light from the LED chip to the inside of the light-directing plate, each LED lamp being designed so that the distance from a top of the semispherical lens to the LED chip is set to be not more than 1.8 times the radius of curvature of the semispherical lens.

7. A plane-shaped lighting device comprising:
   a light-directing plate made of a plate-shaped light-transmitting member;
   a light source that is placed close to or in contact with one side face of the light-directing plate,
   so that light, which has been emitted from the light source and made to be incident on a light-incident surface on the one side face of the light-directing plate, is taken out from a plane section of the light-directing plate;
   a plurality of light-takeoff bodies, each of which has a recessed shape or a protruding shape with a smooth surface, are provided on the plane section of the light-directing plate in a direction parallel to the one side face and the light-takeoff bodies, each of which has a curved line shape, are arranged so that the density thereof increases as the distance from the light source increases; and
   wherein the light source is provided with LED lamps each of which has a reflection wall for directing light from an LED chip into the light-directing plate and a flat light-releasing surface.

8. A plane-shaped lighting device comprising:
   a light-directing plate made of a plate-shaped light-transmitting member;
   a light source that is placed close to or in contact with one side face of the light-directing plate,
   so that light, which has been emitted from the light source and made to be incident on a light-incident surface on the one side face of the light-directing plate, is taken out from a plane section of the light-directing plate;
   a plurality of light-takeoff bodies, each of which has a recessed shape or a protruding shape with a smooth surface, are provided on the plane section of the light-directing plate, and the light-takeoff bodies, each of which is designed to have a spherical shape, are arranged so that the density thereof increases as the distance from the light source increases; and
   wherein the light source is provided with LED lamps each of which has an LED chip for emitting light and a semispherical lens that directs light from the LED chip to the inside of the light-directing plate, the LED lamp being designed so that the distance from the top of the semispherical lens to the LED chip is set to be not more than 1.8 times the radius of curvature of the semispherical lens.

9. A plane-shaped lighting device comprising:
a light-directing plate made of a plate-shaped light-transmitting member;
a light source that is placed close to or in contact with one side face of the light-directing plate,
so that light, which has been emitted from the light source and made to be incident on a light-incident surface on the one side face of the light-directing plate, is taken out from a plane section of the light-directing plate;
a plurality of light-takeoff bodies, each of which has a recessed shape or a protruding shape with a smooth surface, are provided on the plane section of the light-directing plate, and the light-takeoff bodies, each of which is designed to have a spherical shape, are arranged so that the density thereof increases as the distance from the light source increases;
wherein the light source is provided with LED lamps each of which has a reflection wall for directing light from an LED chip into the light-directing plate and a flat light-releasing surface.

* * * * *

UNITED STATES PATENT AND TRADEMARK OFFICE
CERTIFICATE OF CORRECTION

PATENT NO.   : 6,415,531 B1  
DATED        : July 9, 2002  
INVENTOR(S)  : Terukazu Ohtsuki et al.

It is certified that error appears in the above-identified patent and that said Letters Patent is hereby corrected as shown below:

Column 1,  
Line 20, please delete "5,986,665" and insert -- 5,786,665 -- in its place.

Signed and Sealed this

Seventh Day of January, 2003

JAMES E. ROGAN  
*Director of the United States Patent and Trademark Office*